United States Patent
Hata et al.

(10) Patent No.: US 8,098,704 B2
(45) Date of Patent: *Jan. 17, 2012

(54) SEMICONDUCTOR LASER APPARATUS, METHOD OF MANUFACTURING SEMICONDUCTOR LASER APPARATUS, AND OPTICAL PICKUP APPARATUS

(75) Inventors: Masayuki Hata, Kadoma (JP); Yasuyuki Bessho, Uji (JP); Yasuhiko Nomura, Moriguchi (JP); Masayuki Shono, Hirakata (JP); Kenji Nagatomi, Kaizu (JP); Yoichi Tsuchiya, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 39 days.

This patent is subject to a terminal disclaimer.

(21) Appl. No.: 12/348,573

(22) Filed: Jan. 5, 2009

(65) Prior Publication Data

US 2009/0116529 A1 May 7, 2009

Related U.S. Application Data

(62) Division of application No. 11/390,460, filed on Mar. 28, 2006, now Pat. No. 7,486,712.

(30) Foreign Application Priority Data

Mar. 28, 2005 (JP) .................................. 2005-093232

(51) Int. Cl.
*H01S 5/00* (2006.01)
(52) U.S. Cl. .............. 372/50.121; 372/50.1; 372/50.122
(58) Field of Classification Search ............. 372/50.121, 372/50.1, 50.122
See application file for complete search history.

(56) References Cited

U.S. PATENT DOCUMENTS

| 6,136,623 A | 10/2000 | Hofstetter et al. |
| 6,956,322 B2 | 10/2005 | Ikeda |
| 7,079,563 B2 | 7/2006 | Miyachi et al. |
| 7,486,712 B2 * | 2/2009 | Hata et al. ................ 372/50.121 |

(Continued)

FOREIGN PATENT DOCUMENTS

JP 04-105568 U 9/1992

(Continued)

OTHER PUBLICATIONS

Japanese Office Action, with English translation, issued in Japanese Patent Application No. 2005-093232, mailed Jun. 29, 2010.

(Continued)

*Primary Examiner* — Kinam Park
(74) *Attorney, Agent, or Firm* — McDermott Will & Emery LLP

(57) ABSTRACT

A monolithic red/infrared semiconductor laser device is joined to a blue-violet semiconductor laser device. The distance between a blue-violet emission point in the blue-violet semiconductor laser device and an infrared emission point in an infrared semiconductor laser device is significantly shorter than the distance between a red emission point in a red semiconductor laser device and the infrared emission point. A blue-violet laser beam, a red laser beam, and an infrared laser beam respectively emitted from the blue-violet emission point, the red emission point, and the infrared emission point are introduced into a photodetector after being incident on an optical disk by an optical system comprising a polarizing beam splitter, a collimator lens, a beam expander, a $\lambda/4$ plate, an objective lens, a cylindrical lens, and an optical axis correction element.

4 Claims, 34 Drawing Sheets

U.S. PATENT DOCUMENTS

| | | | |
|---|---|---|---|
| 2001/0050531 A1 | 12/2001 | Ikeda | |
| 2004/0094699 A1 | 5/2004 | Goto et al. | |
| 2004/0109481 A1 | 6/2004 | Ikeda | |
| 2004/0136428 A1* | 7/2004 | Miyachi et al. | 372/50 |
| 2005/0270912 A1 | 12/2005 | Sato et al. | |
| 2006/0140078 A1* | 6/2006 | Nagatomi et al. | 369/44.37 |

FOREIGN PATENT DOCUMENTS

| | | |
|---|---|---|
| JP | 2001-230502 | 8/2001 |
| JP | 2002-164606 | 6/2002 |
| JP | 2002-171022 | 6/2002 |
| JP | 2002-318306 | 10/2002 |
| JP | 2005-327403 | 11/2005 |
| JP | 2006-209939 | 8/2006 |

OTHER PUBLICATIONS

"Worlds First CD/DVD/Blue-ray Disc Compatible Three-Wavelength Laser" CX-PAL vol. 62 pp. 8-11.

Hashizu et al., "Three-wavelength Semiconductor Laser for Optical Disc System", 25th Annual Meeting of the Laser Society of Japan Digest of Technical Papers pp. 232-233.

* cited by examiner (a)

(b)

SEMICONDUCTOR LASER APPARATUS, METHOD OF MANUFACTURING SEMICONDUCTOR LASER APPARATUS, AND OPTICAL PICKUP APPARATUS

RELATED APPLICATIONS

This application is a Divisional of U.S. application Ser. No. 11/390,460, filed Mar. 28, 2006 now U.S. Pat. No. 7,486,712, claiming priority of Japanese Application No. 2005-093232, filed Mar. 28, 2005, the entire contents of each of which are hereby incorporated by reference.

BACKGROUND OF THE INVENTION

1. Field of the Invention

The present invention relates to a semiconductor laser apparatus capable of emitting a plurality of light beams respectively having different wavelengths, a method of manufacturing the semiconductor laser apparatus, and an optical pickup apparatus.

2. Description of the Background Art

Conventionally, semiconductor laser devices that emit infrared light beams having wavelengths of approximately 780 nm (infrared semiconductor laser devices) have been used as light sources for compact disk (CD) drives. Further, semiconductor laser devices that emit red light beams having wavelengths of approximately 650 nm as light sources (red semiconductor laser devices) have been used for conventional digital versatile disk (DVD) drives.

On the other hand, DVDs capable of recording and reproduction using blue-violet light beams having wavelengths of approximately 405 nm have been developed in recent years. In order to record and reproduce such DVDs, DVD drives using semiconductor laser devices that emit blue-violet light beams having wavelengths of approximately 405 nm (blue-violet semiconductor laser devices) have been also simultaneously developed. In these DVD drives, compatibilities with conventional CDs and DVDs are required.

In this case, compatibility with conventional CDs, DVDs, and new DVDs are realized by methods of providing a plurality of optical pickup apparatuses that respectively emit infrared light beams, red light beams, and blue-violet light beams to DVD drives or methods of providing infrared semiconductor laser devices, red semiconductor laser devices, and blue-violet semiconductor laser devices within one optical pickup apparatus. Since the number of components is increased in these methods, however, it is difficult to miniaturize the DVD drives, simplify the configurations, and reduce the costs.

In order to thus prevent the number of components from being increased, semiconductor laser devices in which infrared semiconductor laser devices and red semiconductor laser devices are integrated into one chips have been put to practical use.

Both the infrared semiconductor laser devices and the red semiconductor laser devices can be integrated into one chips because they are formed on GaAs substrates. On the other hand, the blue-violet semiconductor laser devices are not formed on GaAs substrates, so that it is significantly difficult to integrate both the blue-violet semiconductor laser devices, together with the infrared semiconductor laser devices and red semiconductor laser devices, into one chips.

Therefore, a light emitting apparatus having a configuration in which an infrared semiconductor laser device and a red semiconductor laser device are formed on the same chip to manufacture a monolithic red/infrared semiconductor laser device, a blue-violet semiconductor laser device is formed into separate chips, and the chips of the blue-violet semiconductor laser device and the chips of the monolithic red/infrared semiconductor laser device are stacked has been proposed (see JP 2001-230502 A, for example).

In a case where the light emitting apparatus is mounted within an optical pickup apparatus, spaces respectively occupied by the blue-violet semiconductor laser device, the infrared semiconductor laser device, and the red semiconductor laser device in the optical pickup apparatus are reduced.

In the above-mentioned light emitting apparatus, respective emission points of the semiconductor laser devices are spaced apart from one another. Consequently, it is preferable that the optical pickup apparatus containing the plurality of semiconductor laser devices is provided with an optical system and a photodetector corresponding to each of the semiconductor laser devices. In this case, it is possible to accurately introduce light beams emitted from the plurality of semiconductor laser devices into the optical recording medium as well as to accurately introduce light beams reflected from the optical recording medium into the photodetector. When the optical pickup apparatus is provided with the optical system and the photodetector corresponding to each of the semiconductor laser devices, however, the size of the optical pickup apparatus is increased.

In JP 2001-230502 A, an example in which a light emitting device comprising a blue-violet semiconductor laser device, an infrared semiconductor laser device, and a red semiconductor laser device is mounted within an optical disk recording/reproducing device provided with an optical system and a photodetector that are common among the three semiconductor laser devices is illustrated.

However, optical paths of laser beams respectively emitted from the blue-violet semiconductor laser device, the red semiconductor laser device, and the infrared semiconductor laser device do not coincide with one another. In order to carry out accurate signal reproduction, tracking control, focus control, and tilt control, therefore, an optical disk recording/reproducing apparatus must be actually provided with three photodetectors corresponding to three laser beams. Consequently, it is difficult to miniaturize the optical disk recording/reproducing apparatus.

SUMMARY OF THE INVENTION

An object of the present invention is to provide a semiconductor laser apparatus capable of miniaturizing an optical pickup apparatus, and a method of manufacturing the same.

Another object of the present invention is to provide an optical pickup apparatus that can be miniaturized.

(1)

A semiconductor laser apparatus according to an aspect of the present invention comprises a first semiconductor laser device, a second semiconductor laser device, and a third semiconductor laser device, the first semiconductor laser device comprising a first semiconductor layer having a first emission point emitting a light beam having a first wavelength in a direction substantially parallel to a first direction on a first substrate, the second semiconductor laser device comprising a second semiconductor layer having a second emission point emitting a light beam having a second wavelength different from a natural number times the first wavelength in the direction substantially parallel to the first direction, the third semiconductor laser device comprising a third semiconductor layer having a third emission point emitting a light beam having a third wavelength substantially equal to a natural number times the first wavelength in the direction substantially parallel to the first direction, the second semiconductor laser device and the third semiconductor laser device being stacked on the first semiconductor laser device such that the second semiconductor layer and the third semiconductor layer are opposed to the first semiconductor layer, and the distance between the first emission point and the third emission point being shorter than the distance between the first emission point and the second emission point on a first plane perpendicular to the first direction.

In the semiconductor laser apparatus, the light beam having the first wavelength is emitted in the direction substantially parallel to the first direction from the first emission point in the first semiconductor laser device, the light beam having the second wavelength different from the natural number times the first wavelength is emitted in the direction substantially parallel to the first direction from the second emission point in the second semiconductor laser device, and the light beam having the third wavelength substantially equal to the natural number times the first wavelength is emitted in the direction substantially parallel to the first direction from the third emission point in the third semiconductor laser device.

Here, the second semiconductor laser device and the third semiconductor laser device are stacked on the first semiconductor laser device such that the second semiconductor layer and the third semiconductor layer are opposed to the first semiconductor layer, and the distance between the first emission point and the third emission point is shorter than the distance between the first emission point and the second emission point on the first plane perpendicular to the first direction. Thus, in the direction perpendicular to the one surface of the first substrate, the first emission point and the third emission point are in close proximity to each other.

Since the third wavelength is substantially equal to the natural number times the first wavelength, a diffraction efficiency in a case where the light beam having the first wavelength is incident on a diffraction grating and a diffraction efficiency in a case where the light beam having the third wavelength is incident on the diffraction grating can substantially be equalized. Then, because the second wavelength differs from the natural number times the first wavelength, a diffraction efficiency in a case where the light beam having the first wavelength is incident on a diffraction grating and a diffraction efficiency in a case where the light beam having the second wavelength is incident on a diffraction grating differ from each other. Therefore, when a first-order diffracted light beam of the second semiconductor laser beam is enhanced, zeroth-order diffracted light beams of the first semiconductor laser beam and the third semiconductor laser beam can simultaneously be enhanced by adjustment of height of the diffraction grating.

Thus, the zeroth-order diffracted light beams respectively having the first and third wavelength and the first-order diffracted light beams having the second wavelength can be introduced into a photodetector by being incident on the diffraction grating.

Consequently, the light beams respectively having the first, second, and third wavelengths can be received by the one photodetector.

As a result, an arrangement space of the photodetector in the optical pickup apparatus can be reduced, which allows the optical pickup apparatus to be miniaturized.

(2)

The first and third emission points may be arranged along a direction substantially perpendicular to one surface of the first substrate. Thus, the distance between the first emission point and the third emission point is reduced to a minimum.

(3)

The first semiconductor layer may comprise a first cavity extending in the direction substantially parallel to the first direction, the second semiconductor layer may comprise a second cavity extending in the direction substantially parallel to the first direction, the third semiconductor layer may comprise a third cavity extending in the direction substantially parallel to the first direction, and at least one of the length of the second cavity and the length of the third cavity may be larger than the length of the first cavity.

In this case, at least one of the length of the second cavity and the length of the third cavity is larger than the length of the first cavity, so that there occurs a portion where the first semiconductor layer is not joined to the vicinity of a facet of at least one of the second cavity and the third cavity. Thus, distortion on the facet of at least one of the second and third cavities is reduced. Consequently, degradation of at least one of the second and third semiconductor laser devices is restrained, resulting in improved reliability.

(4)

The first semiconductor laser device may further comprise a first electrode formed on the first semiconductor layer, the second semiconductor laser device may further comprise a second electrode formed on the second semiconductor layer, the third semiconductor laser device may further comprise a third electrode formed on the third semiconductor layer, and the first electrode, the second electrode, and the third electrode may be insulated from one another.

Thus, arbitrary voltages can be respectively applied to the first, second, and third electrodes. Consequently, a system for driving the first, second, and third semiconductor laser devices can be arbitrarily selected.

(5)

The second semiconductor laser device may further comprise a second substrate, the second semiconductor layer being formed on the second substrate, the third semiconductor laser device may further comprise a third substrate, the third semiconductor layer being formed on the third substrate, and at least one of the second substrate and the third substrate may be composed of a material different from the first substrate.

In this case, the semiconductor laser apparatus comprising the substrates composed of the different materials is integrally formed.

(6)

The second and third substrates may be a common substrate, and the second semiconductor layer may be formed in a first region of the common substrate, and the third semiconductor layer may be formed in a second region of the common substrate.

In this case, the second semiconductor laser device and the third semiconductor laser device are integrated with the common substrate, so that the second and third emission points are easy to position with respect to the first emission point.

(7)

A thickness from the common substrate to a surface of the second semiconductor layer may be larger than a thickness from the common substrate to a surface of the third semiconductor layer in a direction substantially perpendicular to one surface of the first substrate.

In this case, the first substrate and the second substrate are stacked substantially parallel to each other. Thus, the second and third semiconductor laser devices can be stably provided on the first semiconductor laser device, and the second and third semiconductor laser devices can be reliably joined to the first semiconductor laser device.

(8)

The surface of the second semiconductor layer may project toward the first substrate farther than the surface of the third semiconductor layer in the direction substantially perpendicular to one surface of the first substrate.

In this case, the first substrate and the second substrate are stacked substantially parallel to each other. Thus, the second and third semiconductor laser devices can be stably provided on the first semiconductor laser device, and the second and third semiconductor laser devices can be reliably joined to the first semiconductor laser device.

(9)

The first semiconductor layer may comprise a first projection extending in the direction substantially parallel to the first direction, the third semiconductor layer may comprise a third projection extending in the direction substantially parallel to the first direction, and the width of the third projection may be larger than the width of the first projection in a second direction perpendicular to the first direction and parallel to one surface of the first substrate. In this case, the width of the third projection is large, so that the third projection can be stably arranged on the first projection. Further, the third projection is prevented from applying a local stress to the first projection. Thus, the first semiconductor layer is prevented from being degraded.

(10)

The second semiconductor layer may comprise a second projection extending in the direction substantially parallel to the first direction, and the width of the third projection may be larger than the width of the second projection in the second direction. In this case, the width of the third projection is large, so that the third projection can be stably arranged on the first projection. Further, the third projection is prevented from applying a local stress to the first projection. Thus, the first semiconductor layer is prevented from being degraded. At this time, the second projection does not come into contact with the first projection, so that the second projection does not apply a local stress to the first projection.

(11)

The semiconductor laser apparatus may further comprise a package accommodating the first semiconductor laser device, the second semiconductor laser device, and the third semiconductor laser device as well as having a light extraction window, and the first semiconductor laser device may be arranged such that a light beam having a first wavelength emitted from the first emission point in the first semiconductor laser device passes through a substantially central portion of the extraction window.

In this case, even if the package is rotated around the central axis of the package, the change in the axis of the laser beam emitted from the first semiconductor laser device can be reduced. Even when the intensity of the light beam having the first wavelength is weaker than the respective intensities of the light beams having the second and third wavelengths, therefore, the respective angles of an optical system comprising lens etc. and the package can be easily adjusted with respect to the central axis of the package while increasing the light extraction efficiency of the first semiconductor laser device. As a result, the optical system is easy to design.

(12)

The light beam having the first wavelength may be a blue-violet light beam, the light beam having the second wavelength may be a red light beam, and the light beam having the third wavelength may be an infrared light beam. In this case, the light beams respectively having a plurality of colors (wavelength) can be emitted from the one semiconductor laser apparatus.

(13)

The first semiconductor layer may be composed of a nitride based semiconductor. In this case, the first semiconductor laser device can emit the blue-violet light beam.

(14)

The second semiconductor layer may be composed of a gallium indium phosphide based semiconductor. In this case, the second semiconductor laser device can emit the red light beam.

(15)

The third semiconductor layer may be composed of a gallium arsenide based semiconductor. In this case, the third semiconductor laser device can emit the infrared light beam.

(16)

An optical pickup apparatus according to another aspect of the present invention is an optical pickup apparatus that irradiates a light beam onto an optical recording medium and detects the light beam returned from the optical recording medium, comprising a semiconductor laser apparatus, the semiconductor laser apparatus comprising a first semiconductor laser device, a second semiconductor laser device, and a third semiconductor laser device, the first semiconductor laser device comprising a first semiconductor layer having a first emission point emitting a light beam having a first wavelength in a direction substantially parallel to a first direction on a first substrate, the second semiconductor laser device comprising a second semiconductor layer having a second emission point emitting a light beam having a second wavelength different from a natural number times the first wavelength in the direction substantially parallel to the first direction, the third semiconductor laser device comprising a third semiconductor layer having a third emission point emitting a light beam having a third wavelength substantially equal to a natural number times the first wavelength in the direction substantially parallel to the first direction, the second semiconductor laser device and the third semiconductor laser device being stacked on the first semiconductor laser device such that the second semiconductor layer and the third semiconductor layer are opposed to the first semiconductor layer, and the distance between the first emission point and the third emission point being shorter than the distance between the first emission point and the second emission point on a first plane perpendicular to the first direction.

In the optical pickup apparatus, the light beam having the first, second, or third wavelength is selectively emitted from the semiconductor laser apparatus. Here, the semiconductor laser apparatus allows the light beams respectively having the first, second, and third wavelengths to be introduced into one photodetector. Consequently, a plurality of photodetectors need not be provided in the optical pickup apparatus. As a result, an arrangement space of the photodetector in the optical pickup apparatus can be reduced, which allows the optical pickup apparatus to be miniaturized.

(17)

The optical pickup apparatus may further comprise a photodetector, and an optical system that introduces the light beam having the first, second, or third wavelength emitted from the semiconductor laser apparatus to the optical recording medium and introduces the light beam having the first, second, or third wavelength returned from the optical recording medium to the photodetector.

In this case, the light beams respectively having the first, second, and third wavelengths returned from the optical recording medium are introduced into the one photodetector. Thus, an arrangement space of the photodetector in the optical pickup apparatus can be reduced, which allows the optical pickup apparatus to be miniaturized.

(18)

The optical system comprises a diffraction grating that transmits the light beams respectively having the first, second, and third wavelengths such that the light beams having the first, second, and third wavelengths are introduced into the photodetector.

In this case, the light beam having the first wavelength emitted from the semiconductor laser apparatus is introduced into the optical recording medium by the optical system, and is returned from the optical recording medium and introduced into the photodetector. The light beam having the second wavelength emitted from the semiconductor laser apparatus is introduced into the optical recording medium by the optical system, and is returned from the optical recording medium and introduced into the photodetector. Further, the light beam having the third wavelength emitted from the semiconductor laser apparatus is introduced into the optical recording medium by the optical system, and is returned from the optical recording medium and introduced into the photodetector.

Here, in the semiconductor laser apparatus, the second semiconductor laser device and the third semiconductor laser device are stacked on the first semiconductor laser device such that the second semiconductor layer and the third semiconductor layer are opposed to the first semiconductor layer, and the distance between the first emission point and the third emission point is shorter than the distance between the first emission point and the second emission point on the first plane perpendicular to the first direction. In the direction perpendicular to the one surface of the first substrate, therefore, the first emission point and the third emission point are in close proximity to each other.

Since the third wavelength is substantially equal to the natural number times the first wavelength, a diffraction efficiency in a case where the light beam having the first wavelength is incident on a diffraction grating and a diffraction efficiency in a case where the light beam having the third wavelength is incident on the diffraction grating can substantially be equalized. Then, because the second wavelength differs from the natural number times the first wavelength, a diffraction efficiency in a case where the light beam having the first wavelength is incident on a diffraction grating and a diffraction efficiency in a case where the light beam having the second wavelength is incident on a diffraction grating differ from each other. Therefore, when a first-order diffracted light beam of the second semiconductor laser beam is enhanced, zeroth-order diffracted light beams of the first semiconductor laser beam and the third semiconductor laser beam can simultaneously be enhanced by adjustment of height of the diffraction grating.

Thus, the zeroth-order diffracted light beams respectively having the first and third wavelength and the first-order diffracted light beams having the second wavelength can be introduced into a photodetector by being incident on the diffraction grating.

Consequently, the light beams respectively having the first, second, and third wavelengths can be received by the one photodetector.

As a result, an arrangement space of the photodetector in the optical pickup apparatus can be reduced, which allows the optical pickup apparatus to be miniaturized.

(19)

A method of manufacturing a semiconductor laser apparatus according to still another aspect of the present invention comprises the steps of forming a first semiconductor layer having a first emission point emitting a light beam having a first wavelength in a direction substantially parallel to a first direction on a first substrate, forming a second semiconductor layer having a second emission point emitting a light beam having a second wavelength different from a natural number times the first wavelength in the direction substantially parallel to the first direction on a second substrate and a third semiconductor layer having a third emission point emitting a light beam having a third wavelength substantially equal to a natural number times the first wavelength in the direction substantially parallel to the first direction; and affixing one surface of the second semiconductor layer to one surface of the first semiconductor layer such that the distance between the first emission point and the third emission point is shorter than the distance between the first emission point and the second emission point on a first plane perpendicular to the first direction.

In the semiconductor laser apparatus manufactured by the manufacturing method, the light beam having the first wavelength is emitted in the direction substantially parallel to the first direction from the first emission point in the first semiconductor laser device, the light beam having the second wavelength different from the natural number times the first wavelength is emitted in the direction substantially parallel to the first direction from the second emission point in the second semiconductor laser device, and the light beam having the third wavelength substantially equal to the natural number times the first wavelength is emitted in the direction substantially parallel to the first direction from the third emission point in the third semiconductor laser device.

Here, on the first plane perpendicular to the first direction, the one surface of the second semiconductor layer on the second substrate is affixed to the one surface of the first semiconductor layer on the first substrate such that the distance between the first emission point and the third emission point is shorter than the distance between the first emission point and the second emission point. In the direction perpendicular to the one surface of the first substrate, therefore, the first emission point and the third emission point are in close proximity to each other.

Since the third wavelength is substantially equal to the natural number times the first wavelength, a diffraction efficiency in a case where the light beam having the first wavelength is incident on a diffraction grating and a diffraction efficiency in a case where the light beam having the third wavelength is incident on the diffraction grating can substantially be equalized. Then, because the second wavelength differs from the natural number times the first wavelength, a diffraction efficiency in a case where the light beam having the first wavelength is incident on a diffraction grating and a diffraction efficiency in a case where the light beam having the second wavelength is incident on a diffraction grating differ from each other. Therefore, when a first-order diffracted light beam of the second semiconductor laser beam is enhanced, zeroth-order diffracted light beams of the first semiconductor laser beam and the third semiconductor laser beam can simultaneously be enhanced by adjustment of height of the diffraction grating.

Thus, the zeroth-order diffracted light beams respectively having the first and third wavelength and the first-order diffracted light beams having the second wavelength can be introduced into a photodetector by being incident on the diffraction grating.

Consequently, the light beams respectively having the first, second, and third wavelengths can be received by the one photodetector.

As a result, an arrangement space of the photodetector in the optical pickup apparatus can be reduced, which allows the optical pickup apparatus to be miniaturized.

The second semiconductor laser device and the third semiconductor laser device are integrated by the second substrate, so that the second and third emission points are easy to position with respect to the first emission point.

(20)

The thickness of the second semiconductor layer may be larger than the thickness of the third semiconductor layer in a direction substantially perpendicular to one surface of the first substrate.

In this case, the first substrate and the second substrate are stacked substantially parallel to each other. Thus, the second and third semiconductor laser devices can be stably provided on the first semiconductor laser device, and the second and third semiconductor laser devices can be reliably joined to the first semiconductor laser device.

(21)

The surface of the second semiconductor layer may project toward the first substrate farther than a surface of the third semiconductor layer in the direction substantially perpendicular to one surface of the first substrate.

In this case, the first substrate and the second substrate are stacked substantially parallel to each other. Thus, the second and third semiconductor laser devices can be stably provided on the first semiconductor laser device, and the second and third semiconductor laser devices can be reliably joined to the first semiconductor laser device.

Other features, elements, characteristics, and advantages of the present invention will become more apparent from the following description of preferred embodiments of the present invention with reference to the attached drawings.

DESCRIPTION OF THE PREFERRED EMBODIMENTS

A semiconductor laser apparatus according to an embodiment of the present invention and an optical pickup apparatus comprising the same will be described.

(1) First Embodiment

A semiconductor laser apparatus according to a first embodiment of the present invention comprises a semiconductor laser device emitting a laser beam having a wavelength of approximately 405 nm (hereinafter referred to as a blue-violet semiconductor laser device), a semiconductor laser device emitting a laser beam having a wavelength of approximately 650 nm (hereinafter referred to as a red semiconductor laser device), and a semiconductor laser device emitting a laser beam having a wavelength of approximately 780 nm (hereinafter referred to as an infrared semiconductor laser device).

(a) Configuration of Semiconductor Laser Apparatus

Figure 1:
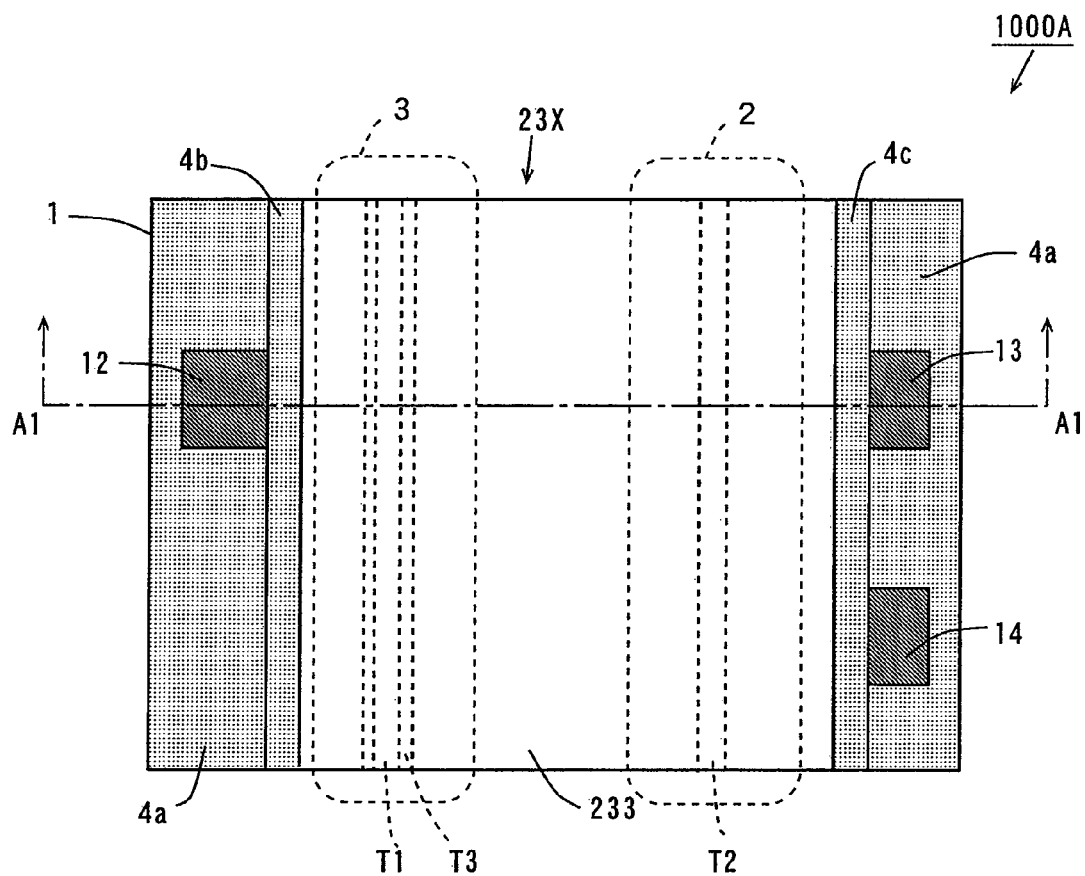
FIG. 1 is a top view showing an example of a semiconductor laser apparatus according to a first embodiment.
Figure 2:
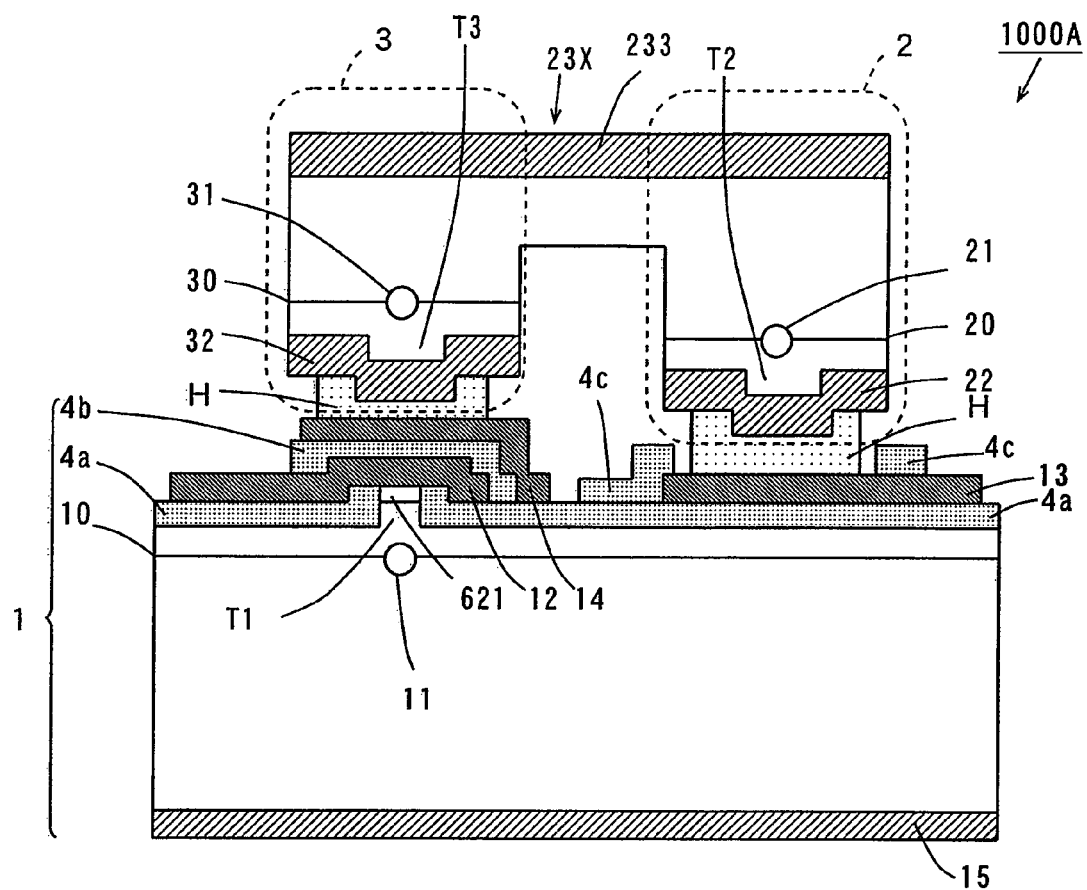
FIG. 2 is a cross-sectional view taken along a line A1-A1 shown in FIG. 1.
Figure 3:
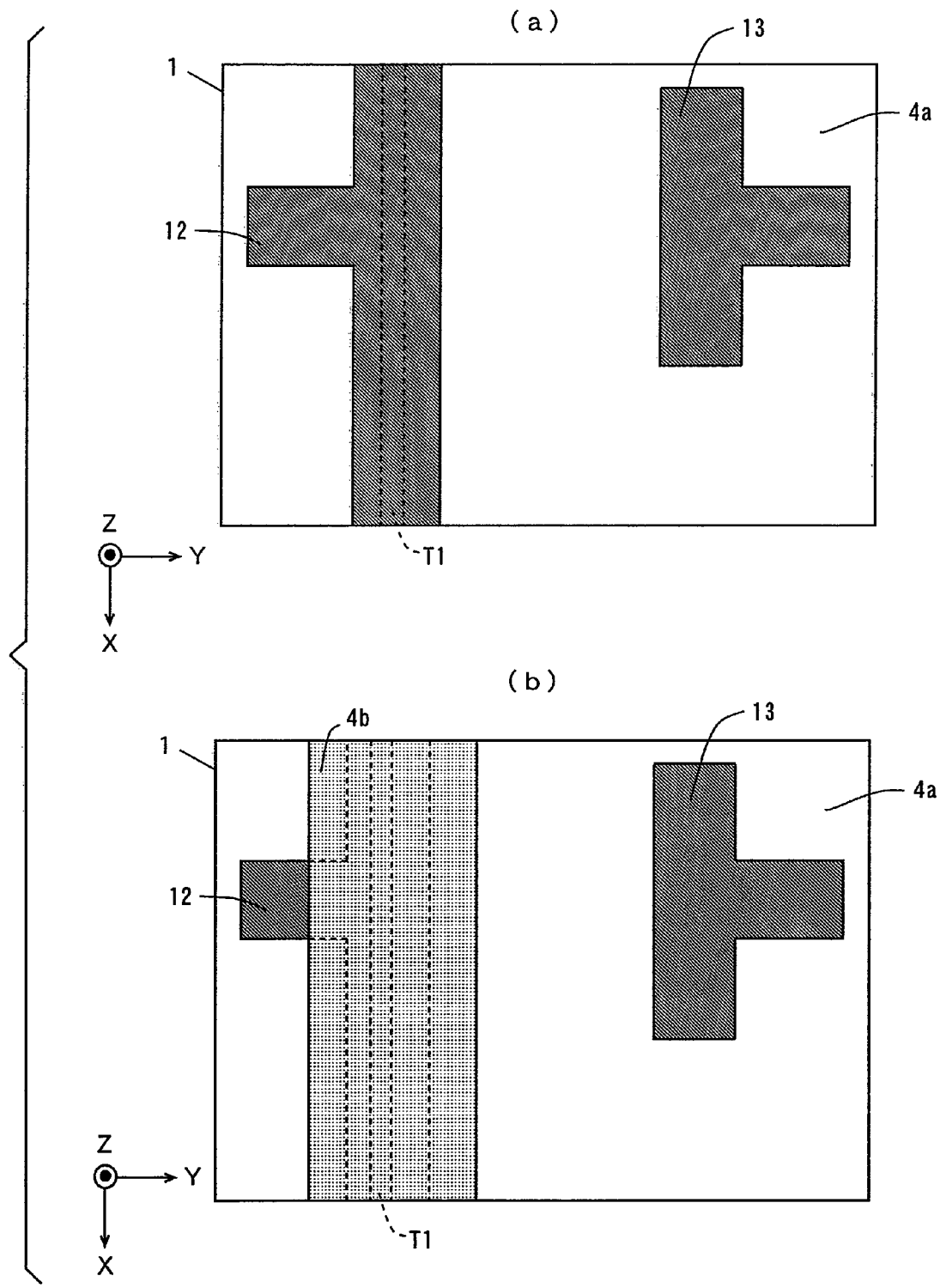
FIG. 3 is a schematic view of a junction plane of a blue-violet semiconductor laser device, a red semiconductor laser device, and an infrared semiconductor laser device in a semiconductor laser apparatus.
Figure 4:
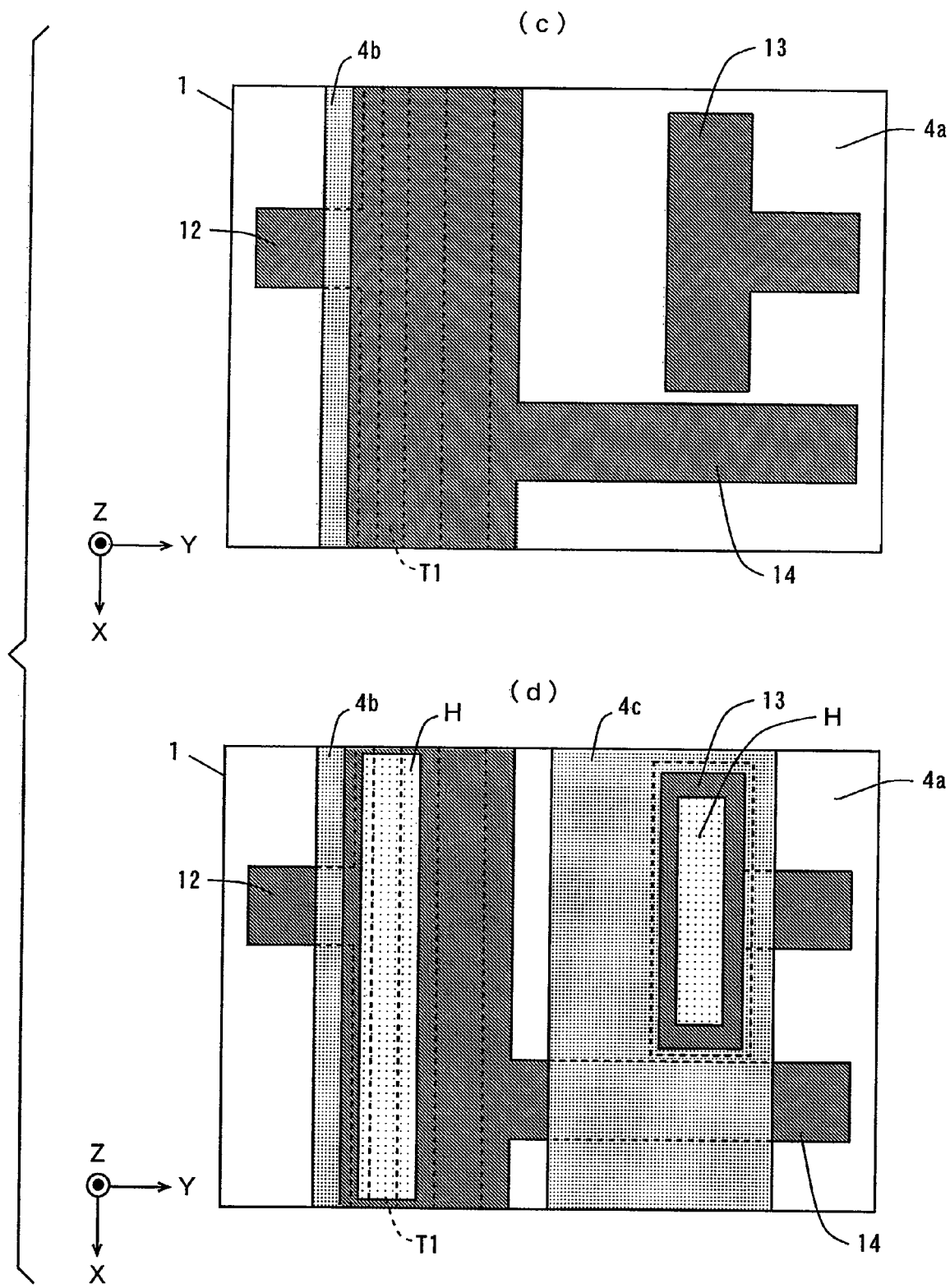
FIG. 4 is a schematic view of a junction plane of a blue-violet semiconductor laser device, a red semiconductor laser device, and an infrared semiconductor laser device in a semiconductor laser apparatus.

FIGS. 1 and 2 are schematic views for explaining the configuration of a semiconductor laser apparatus according to a first embodiment. FIG. 1 is a top view showing an example of the semiconductor laser apparatus according to the first embodiment, and FIG. 2 is a cross-sectional view taken along a line A1-A1 shown in FIG. 1. FIGS. 3 and 4 are schematic views of a junction plane of the blue-violet semiconductor laser device, the red semiconductor laser device, and the infrared semiconductor laser device in the semiconductor laser apparatus shown in FIGS. 1 and 2.

In FIGS. 1, 2, 3, and 4, three directions that are perpendicular to one another, as indicated by arrows X, Y, and Z, are respectively taken as an X-direction, a Y-direction, and a Z-direction. The X-direction and the Y-direction are directions parallel to respective p-n junction interfaces 10, 20, and 30 of the blue-violet semiconductor laser device 1, the red semiconductor laser device 2, and the infrared semiconductor laser device 3, described later. The Z-direction is a direction perpendicular to the respective p-n junction interfaces 10, 20, and 30 of the blue-violet semiconductor laser device 1, the red semiconductor laser device 2, and the infrared semiconductor laser device 3.

As shown in FIGS. 1 and 2, a striped projection T1 extending in the X-direction is formed on an upper surface of the blue-violet semiconductor laser device 1. The projection T1 is positioned in an area offset from the center of the blue-violet semiconductor laser device 1 in the Y-direction. An insulating film 4a is formed so as to cover the upper surface of the blue-violet semiconductor laser device 1 on a side surface of the projection T1 and on both sides of the projection T1. A p-type ohmic electrode 621 is formed on an upper surface of the projection T1.

A p-side pad electrode 12 is formed so as to cover an upper surface of the p-type ohmic electrode 621 and the insulating film 4a in the vicinity of the projection T1. An n-electrode 15 is formed on a lower surface of the blue-violet semiconductor laser device 1. A p-n junction interface 10 serving as a junction interface of a p-type semiconductor and an n-type semiconductor is formed in the blue-violet semiconductor laser device 1.

In the present embodiment, the red semiconductor laser device 2 and the infrared semiconductor laser device 3 are integrally formed. The red semiconductor laser device 2 and the infrared semiconductor laser device 3 that are integrally formed are referred to as a monolithic red/infrared semiconductor laser device 23X.

In the monolithic red/infrared semiconductor laser device 23X, the red semiconductor laser device 2 and the infrared semiconductor laser device 3 are formed on a common substrate. The details will be described later.

A common n-electrode 233 is formed on respective upper surfaces of the red semiconductor laser device 2 and the infrared semiconductor laser device 3. A striped projection T2 extending in the X-direction is formed on a lower surface of the red semiconductor laser device 2. A p-side pad electrode 22 is formed on the lower surface of the red semiconductor laser device 2. The p-n junction interface 20 serving as a junction interface of a p-type semiconductor and an n-type semiconductor is formed in the red semiconductor laser device 2.

A striped projection T3 extending in the X-direction is formed on the side of a lower surface of the infrared semiconductor laser device 3. A p-side pad electrode 32 is formed on the lower surface of the infrared semiconductor laser device 3. The p-n junction interface 30 serving as a junction interface of a p-type semiconductor and an n-type semiconductor is formed in the infrared semiconductor laser device 3.

In the present embodiment, the length in the Z-direction of the red semiconductor laser device 2 is 1 µm larger than the length in the Z-direction of the infrared semiconductor laser device 3. A surface of a semiconductor layer on the side of the lower surface of the projection T2 in the red semiconductor laser device 2 projects toward the blue-violet semiconductor laser device 1 in the Z-direction 1 µm farther than a surface of a semiconductor layer on the side of the lower surface of the projection T3 in the infrared semiconductor laser device 3. The semiconductor layer will be described later. P-type ohmic electrodes are also respectively formed on the projections T2 and T3 (not shown in FIG. 2).

The monolithic red/infrared semiconductor laser device 23X is joined to the blue-violet semiconductor laser device 1 such that the projection T3 and the projection T1 are opposed to each other on a substantially straight line in the Z-direction.

A junction of the blue-violet semiconductor laser device 1 and the monolithic red/infrared semiconductor laser device 23X will be then described.

As shown in FIG. 3 (a), the p-side pad electrode 12 and the p-side pad electrode 13, described above, are formed on the insulating film 4a in the blue-violet semiconductor laser device 1.

The p-side pad electrode 12 extends in the X-direction along the projection T1 in the blue-violet semiconductor laser device 1, and its part extends in the Y-direction.

The p-side pad electrode 13 extends in the X-direction at a position spaced apart from the p-side pad electrode 12, and its part extends in a direction opposite to the p-side pad electrode 12.

The p-side pad electrodes 12 and 13 are formed so as to be spaced apart from each other on the insulating film 4a. Thus, the p-side pad electrodes 12 and 13 are electrically isolated from each other.

As shown in FIG. 3 (b), an insulating film 4b having a predetermined width is formed on the insulating film 4a and the p-side pad electrode 12. The insulating film 4b is formed such that one end of the p-side pad electrode 12 extending in the Y-direction is exposed. A wire for driving the blue-violet semiconductor laser device 1 is bonded to the exposed one end of the p-side pad electrode 12. A region having a width of approximately 100 μm and having a length of approximately 100 μm at the one end of the p-side pad electrode 12 extending in the Y-direction is exposed.

As shown in FIG. 4 (*c*), a p-side pad electrode 14 is formed on the insulating film 4*a* and the insulating film 4*b*. The p-side pad electrode 14 extends in the X-direction on the insulating film 4*a* and the insulating film 4*b*, and its part extends in the Y-direction, similarly to the p-side pad electrode 13, at a position spaced apart from the p-side pad electrode 13. Consequently, the p-side pad electrodes 12, 13, and 14 are electrically isolated from one another.

As shown in FIG. 4 (*d*), an insulating film 4*c* is formed in a predetermined pattern on the insulating film 4*a* and the p-side pad electrodes 13 and 14. The insulating film 4*c* is formed such that respective one ends of the p-side pad electrodes 13 and 14 extending in the Y-direction are exposed. Wires for driving the red semiconductor laser device 2 and the infrared semiconductor laser device 3 are respectively bonded to the exposed one ends of the p-side pad electrodes 13 and 14.

Regions each having a width of approximately 100 μm and having a length of approximately 100 μm at the respective one ends of the p-side pad electrodes 13 and 14 extending in the Y-direction are exposed.

Furthermore, the insulating film 4*c* is formed such that a substantially central portion of the p-side pad electrode 13 is exposed. A solder film H composed of Au—Sn is formed in the exposed portion of the p-side pad electrode 13. A solder film H composed of Au—Sn is also formed in a predetermined region on the p-side pad electrode 14.

The monolithic red/infrared semiconductor laser device 23X is joined to the blue-violet semiconductor laser device 1 shown in FIG. 2 such that the p-side pad electrode 22 in the red semiconductor laser device 2 is joined to the p-side pad electrode 13 with the solder film H sandwiched therebetween and the p-side pad electrode 32 in the infrared semiconductor laser device 3 is joined to the p-side pad electrode 14 with the solder film H sandwiched therebetween.

Thus, the p-side pad electrode 22 in the red semiconductor laser device 2 is electrically connected to the p-side pad electrode 13, and the p-side pad electrode 32 in the infrared semiconductor laser device 3 is electrically connected to the p-side pad electrode 14.

Since the monolithic red/infrared semiconductor laser device 23X is joined to the patterned insulating film 4*c* in the foregoing, the p-side pad electrode 32 in the infrared semiconductor laser device 3 is prevented from coming into contact with the p-side pad electrode 14.

A voltage is applied between the p-side pad electrode 12 and the n-electrode 15 in the blue-violet semiconductor laser device 1 so that a laser beam having a wavelength of approximately 405 nm is emitted in the X-direction from a region (hereinafter referred to as a blue-violet emission point) 11 below the projection T1 on the p-n junction interface 10.

A voltage is applied between the p-side pad electrode 22 in the red semiconductor laser device 2 (the p-side pad electrode 13 on the blue-violet semiconductor laser device 1) and the common n-electrode 233 so that a laser beam having a wavelength of approximately 650 nm is emitted in the X-direction from a predetermined region (hereinafter referred to as a red emission point) 21 on the p-n junction interface 20.

A voltage is applied between the p-side pad electrode 32 in the infrared semiconductor laser device 3 (the p-side pad electrode 14 on the blue-violet semiconductor laser device 1) and the common n-electrode 233 so that a laser beam having a wavelength of approximately 780 nm is emitted in the X-direction from a predetermined region (hereinafter referred to as an infrared emission point) 31 on the p-n junction interface 30.

In the present embodiment, the monolithic red/infrared semiconductor laser device 23X is arranged such that the projection T1 in the blue-violet semiconductor laser device 1 and the projection T3 in the infrared semiconductor laser device 3 are opposed to each other. Thus, the distance between the blue-violet emission point 11 and the infrared emission point 31 is shorter than both the distance between the blue-violet emission point 11 and the red emission point 31 and the distance between the red emission point 21 and the infrared emission point 31.

In the present embodiment, the distance between the red emission point 21 and the infrared emission point 31 in the Y-direction is adjusted to approximately 100 μm, for example.

The width of the blue-violet semiconductor laser device 1 in the Y-direction is approximately 400 μm, for example. The width of the monolithic red/infrared semiconductor laser device 23X in the Y-direction is approximately 200 μm, for example.

It is preferable that the distance between the blue-violet emission point 11 and the infrared emission point 31 is not more than 20 μm.

The cross-sectional view of FIG. 2 is enlarged in the Z-direction. Actually, the distance between the emission points in the Z-direction is significantly shorter than the distance between the emission points in the Y-direction. In the actual semiconductor laser apparatus 1000A, therefore, the blue-violet emission point 11 and the red emission point 21 are positioned on a substantially straight line along an axis parallel to the Y-direction.

(b) Effect of Semiconductor Laser Apparatus

As shown in FIG. 1, in the semiconductor laser apparatus 1000A according to the present embodiment, respective one ends of the p-side pad electrodes 12, 13, and 14 extending in the Y-direction are exposed, projecting from a side surface of the monolithic red/infrared semiconductor laser device 23X in the Y-direction through an area between the blue-violet semiconductor laser device 1 and the monolithic red/infrared semiconductor laser device 23X on the insulating film 4*a* in the blue-violet semiconductor laser device 1. Thus, the respective exposed portions of the p-side pad electrodes 13 and 14 extending in the Y-direction are arranged on a substantially straight line in the X-direction, so that the width in the Y-direction of the blue-violet semiconductor laser device 1 can be reduced.

The exposed portions of the p-side pad electrodes 13 and 14 extending in the Y-direction are arranged on the substantially straight line in the X-direction, so that an arrangement space of the red semiconductor laser device 2 and the infrared semiconductor laser device 3 on the blue-violet semiconductor laser device 1 in the Y-direction can be increased. Consequently, the respective widths of the red semiconductor laser device 2 and the infrared semiconductor laser device 3 in the Y-direction can be increased.

The p-side pad electrodes 12 and 13 can be simultaneously formed, so that the manufacturing processes can be simplified.

As described above, the length in the Z-direction of the red semiconductor laser device 2 is larger than the length in the Z-direction of the infrared semiconductor laser device 3. The surface of the semiconductor layer on the side of the lower surface of the projection T2 in the red semiconductor laser device 2 projects toward the blue-violet semiconductor laser device 1 in the Z-direction farther than the surface of the semiconductor layer on the side of the lower surface of the projection T3 in the infrared semiconductor laser device 3. When the monolithic red/infrared semiconductor laser device 23X is joined to the blue-violet semiconductor laser device 1, therefore, a large stress can be prevented from being created on the junction plane of the infrared semiconductor laser device 3 and the blue-violet semiconductor laser device 1. As a result, respective damages to the projections T1 and T3 can be reduced. Further, the monolithic red/infrared semiconductor laser device 23X can be stacked substantially parallel to the blue-violet semiconductor laser device 1. Thus, the monolithic red/infrared semiconductor laser device 23X can be reliably joined to the blue-violet semiconductor laser device 1.

The monolithic red/infrared semiconductor element 23X can be stacked substantially parallel to the blue-violet semiconductor laser device 1 by making the length in the Z-direction of the red semiconductor laser device 2 larger than the length in the Z-direction of the infrared semiconductor laser device 3. Thus, the monolithic red/infrared semiconductor laser device 23X can be joined to the blue-violet semiconductor laser device 1 in a stable state.

Figure 5:
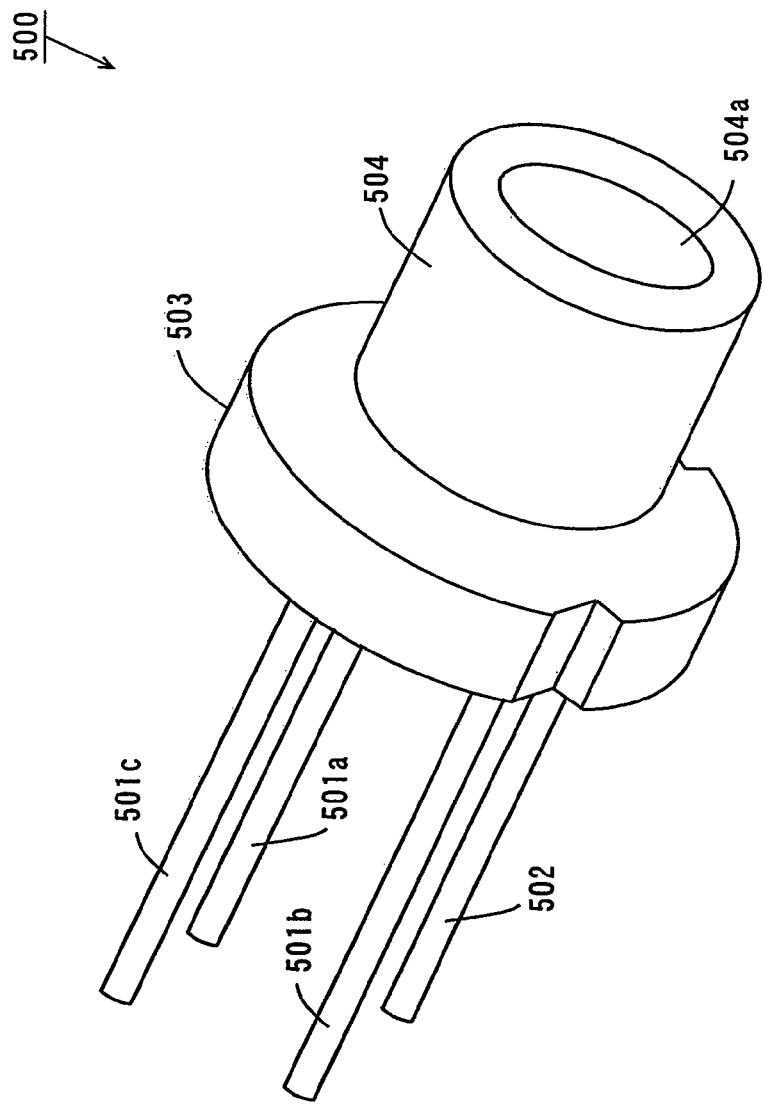
FIG. 5 is a perspective view showing the appearance of a substantially round-shaped can package for laser devices on which the semiconductor laser apparatus shown in FIG. 1 is mounted.

(c) State where Semiconductor Laser Apparatus is Mounted on Package for Laser Devices The semiconductor laser apparatus 1000A shown in FIGS. 1 and 2 is mounted within a package for laser devices. FIG. 5 is a perspective view showing the appearance of a substantially round-shaped can package for laser devices 500 on which the semiconductor laser apparatus 1000A shown in FIG. 1 is mounted.

In FIG. 5, the substantially round-shaped can package for laser devices 500 comprises a package main body 503 having electrically conductive properties, power feed pins 501a, 501b, 501c, and 502, and a cover 504.

The package main body 503 is provided with the semiconductor laser apparatus 1000A shown in FIGS. 1 and 2, and is sealed with the cover 504. The cover 504 is provided with an extraction window 504a. The extraction window 504a is composed of a material transmitting a laser beam. The power feed pin 502 is mechanically and electrically connected to the package main body 503. The power feed pin 502 is used as a ground terminal.

Respective one ends of the power feed pins 501a, 501b, 501c, and 502 extending outward from the package main body 503 are connected to driving circuits (not shown).

Wiring using wires of the semiconductor laser apparatus 1000A mounted within the substantially round-shaped can package for laser devices 500 will be described. Description is made, taking the side on which a laser beam from a semiconductor laser device is emitted as a front.

Figure 6:
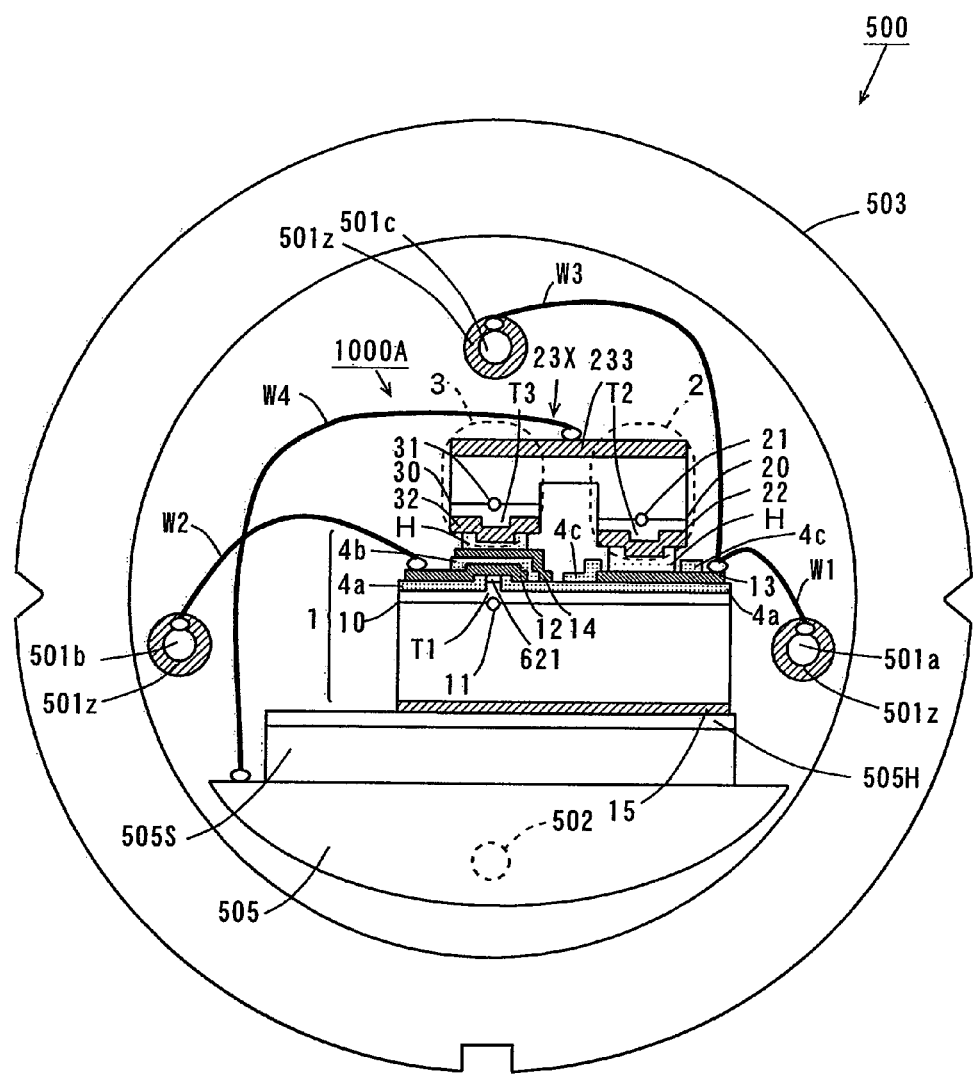
FIG. 6 is a schematic front view showing a state where a cover in the substantially round-shaped can package for laser devices shown in FIG. 5 is removed.
Figure 7:
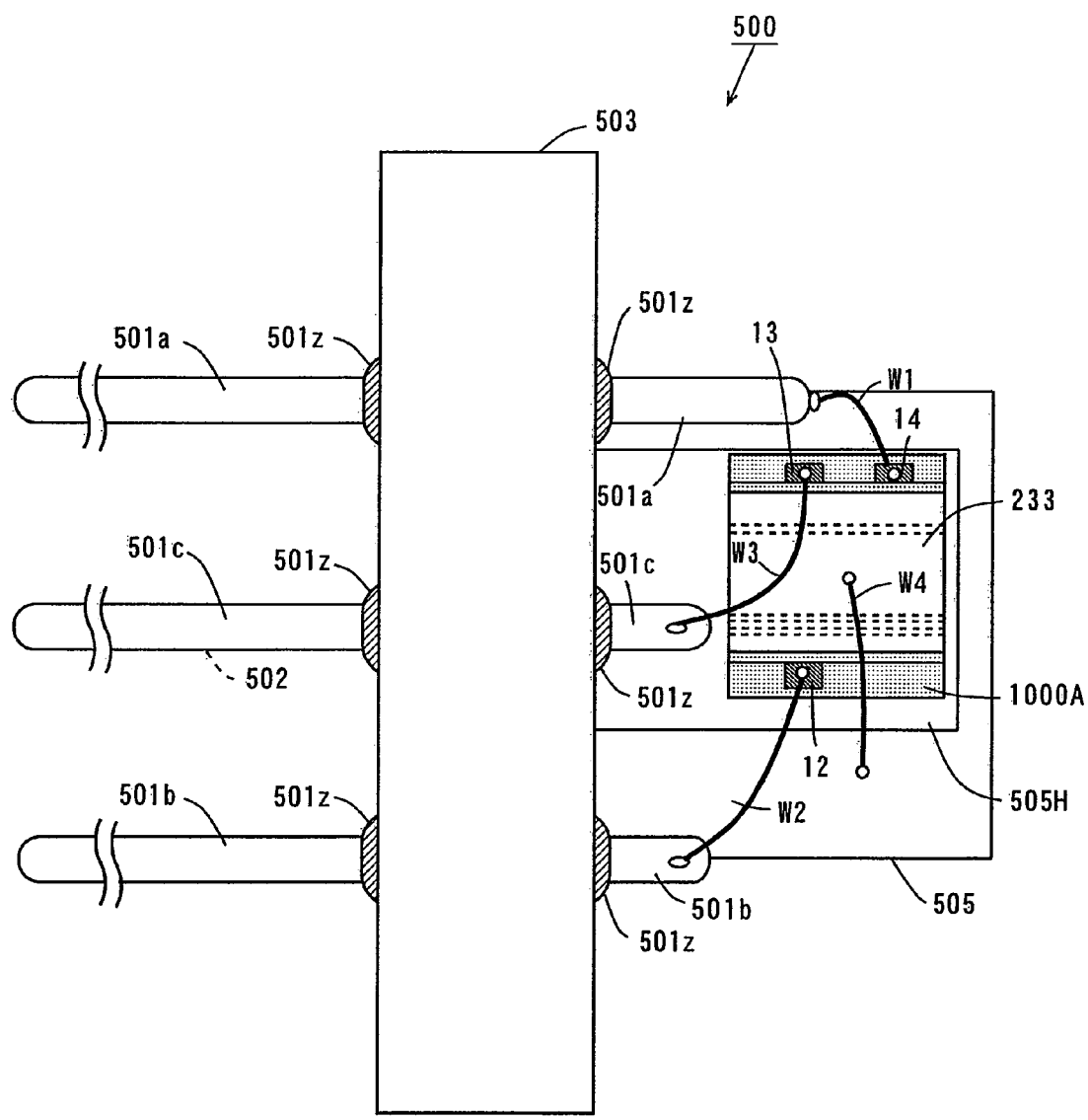
FIG. 7 is a schematic top view showing a state where a cover in the substantially round-shaped can package for laser devices shown in FIG. 5 is removed.

FIG. 6 is a schematic front view showing a state where the cover 504 in the substantially round-shaped can package for laser devices 500 shown in FIG. 5 is removed, and FIG. 7 is a schematic top view showing a state where the cover 504 in the substantially round-shaped can package for laser devices 500 shown in FIG. 5 is removed. In FIG. 6, the semiconductor laser apparatus 1000A provided in the substantially round-shaped can package for laser devices 500 is indicated by a cross section taken along a line A1-A1 shown in FIG. 1. In FIGS. 6 and 7, an X-direction, a Y-direction, and a Z-direction are also defined, as in FIG. 1.

As shown in FIG. 6, a submount 505S having electrically conductive properties is provided on a supporting member 505 having electrically conductive properties that is integrated with the package main body 503. The supporting member 505 and the submount 505S are composed of a material superior in electrically conductive properties and thermally conductive properties.

The semiconductor laser apparatus 1000A is joined to the submount 505S with an adhesion layer (solder) 505H sandwiched therebetween. The semiconductor laser apparatus 1000A adheres to the submount 505S (the adhesion layer 505H) such that the blue-violet emission point 11 in the blue-violet semiconductor laser device 1 is positioned in a substantially central portion of the substantially round-shaped can package for laser devices 500 on a Y-Z plane, i.e., at the center of the extraction window 504a in the cover 504 (see FIG. 5).

As shown in FIGS. 6 and 7, the power feed pins 501a, 501b, and 501c are electrically insulated from the package main body 503, respectively, by insulating rings 501z.

The power feed pin 501a is connected to one end of the p-side pad electrode 14 in the semiconductor laser apparatus 1000A through a wire W1. The power feed pin 501b is connected to one end of the p-side pad electrode 12 in the semiconductor laser apparatus 1000A through a wire W2. The power feed pin 501c is connected to one end of the p-side pad electrode 13 in the semiconductor laser apparatus 1000A through a wire W3.

On the other hand, the exposed upper surface of the supporting member 505 and the common n-electrode 233 in the semiconductor laser apparatus 1000A are electrically connected to each other through a wire W4.

Here, the supporting member 505 is electrically connected through the submount 505S and the adhesion layer 505H. Thus, the power feed pin 502 is electrically connected to the n-electrode 15 in the blue-violet semiconductor laser device 1 and the n-electrode 233 that is common between the red semiconductor laser device 2 and the infrared semiconductor laser device 3. That is, common cathode wire connection of the blue-violet semiconductor laser device 1, the red semiconductor laser device 2, and the infrared semiconductor laser device 3 is implemented.

The blue-violet semiconductor laser device 1 can be driven by applying a voltage between the power feed pin 501b and the power feed pin 502. The infrared semiconductor laser device 3 can be driven by applying a voltage between the power feed pin 501a and the power feed pin 502. The red semiconductor laser device 2 can be driven by applying a voltage between the power feed pin 501c and the power feed pin 502. Thus, the blue-violet semiconductor laser device 1, the red semiconductor laser device 2, and the infrared semiconductor laser device 3 can be independently driven.

In the semiconductor laser apparatus 1000A according to the present embodiment, the p-side pad electrodes 12, 13, and 14 are electrically isolated from one another, as described above. Thus, arbitrary voltages can be respectively applied to the p-side pad electrodes 12, 13, and 14 in the blue-violet semiconductor laser device 1, the red semiconductor laser device 2, and the infrared semiconductor laser device 3. Consequently, a system for driving the blue-violet semiconductor laser device 1, the red semiconductor laser device 2, and the infrared semiconductor laser device 3 can be arbitrary selected.

(d) Effect in State where Semiconductor Laser Apparatus is Mounted on Package for Laser Devices As described in the foregoing, the distance between the blue-violet emission point 11 and the infrared emission point 21 is shorter than both the distance between the blue-violet emission point 11 and the red emission point 31 and the distance between the red emission point 21 and the infrared emission point 31. That is, the laser beam from the blue-violet semiconductor laser device 1 and the laser beam from the infrared semiconductor laser device 3 are respectively emitted from positions in close proximity to each other.

The wavelength (approximately 780 nm) of the laser beam from the infrared semiconductor laser device 3 is substantially equal to a natural number times (approximately two times) the wavelength (approximately 405 nm) of the laser beam from the blue-violet semiconductor laser device 1. In this case, a diffraction efficiency in a case where the laser beam from the blue-violet semiconductor laser device 1 is incident on the diffraction grating and a diffraction efficiency in a case where the laser beam from the infrared semiconductor laser device 3 is incident on the diffraction grating can substantially be equalized. Then, because the wavelength (approximately 650 nm) of the laser beam from the red semiconductor laser device 2 differs from a natural number times the wavelength of the laser beam from the blue-violet semiconductor laser device 1, a diffraction efficiency in a case where the laser beam from the blue-violet semiconductor laser device 1 is incident on the diffraction grating and a diffraction efficiency in a case where the laser beam from the red semiconductor laser device 2 is incident on the diffraction grating differ from each other. Therefore, when a first-order diffraction light beam of the red semiconductor laser beam is enhanced, zeroth-order diffracted light beams of the blue-violet semiconductor laser beam and the infrared semiconductor laser beam can simultaneously be enhanced by adjustment of height of the diffraction grating.

Then, in a case where the laser beam from the blue-violet semiconductor laser device 1, the laser beam from the infrared semiconductor laser device 3, and the laser beam from the red semiconductor element 2 are incident on the diffraction grating, therefore, the zeroth-order diffracted laser beam from the blue-violet semiconductor laser device 1 and the zeroth-order diffracted laser beam from the infrared semiconductor laser device 3 are diffracted at the same angle by the diffraction grating. As described above, the distance between the blue-violet semiconductor laser device 1 and the infrared semiconductor element 3 is very short, so that the respective optical axes of the laser beams from the blue-violet semiconductor laser device 1 and the infrared semiconductor element 3 that have been diffracted by the diffraction grating almost coincide with each other.

On the other hand, the first-order diffracted laser beam from the red semiconductor laser device 2 and the zeroth-order diffracted laser beam from the blue-violet semiconductor laser device 1 are diffracted at different angles from each other by the diffraction grating, and the first-order diffracted laser beam from the red semiconductor laser device 2 and the zeroth-order diffracted laser beam from the infrared semiconductor laser device 3 are diffracted at different angles from each other by the diffraction grating. Consequently, the position of a focusing spot of the laser beam from the red semiconductor laser device 2 can be matched with the position of focusing spots of the laser beams from the blue-violet semiconductor laser device 1 and the infrared semiconductor laser device 3 on a photodetector utilizing such a difference in diffraction efficiency.

As a result, the respective laser beams from the blue-violet semiconductor laser device 1, the red semiconductor laser device 2, and the infrared semiconductor laser device 3 can be received by one photodetector. The details will be described later.

The intensity of the laser beam from the blue-violet semiconductor laser device 1 is weaker than the respective intensities of the laser beams from the red semiconductor laser device 2 and the infrared semiconductor laser device 3. In this example, the blue-violet emission point 11 in the blue-violet semiconductor laser device 1 is positioned at the center of the extraction window 504a in the cover 504. Thus, the laser beam from the blue-violet semiconductor laser device 1 is emitted from the center of the substantially round-shaped can package for laser devices 500.

Even if the substantially round-shaped can package for laser devices 500 is rotated around the central axis of the substantially round-shaped can package for laser devices 500, therefore, the change in the position of the axis of the laser beam emitted from the blue-violet semiconductor laser device 1 can be reduced. Consequently, the angle of an optical system such as a lens and the angle of the substantially round-shaped can package for laser devices 500 can be easily adjusted with respect to the central axis of the substantially round-shaped can package for laser devices 500 while increasing the light extraction efficiency of the blue-violet semiconductor laser device 1. As a result, the optical system is easy to design.

As shown in FIGS. 6 and 7, the exposed portion of the p-side pad electrode 13 in the red semiconductor laser device 2 is provided so as to be positioned farther apart from a laser beam emission facet than the exposed portion of the p-side pad electrode 14 in the infrared semiconductor laser device 3. Therefore, the p-side pad electrode 13 can be easily connected to the power feed pin 501c opposed to a surface, on which the semiconductor laser apparatus is mounted, of the supporting member 505, and the length of the wire W3 can be shortened.

In this example, as shown in FIG. 7, the power feed pin 501a projects toward the laser beam emission facet farther than the power feed pin 501c. In this case, it is possible to easily connect the exposed portion of the p-side pad electrode 14 provided at a position closer to the laser beam emission facet than the exposed portion of the p-side pad electrode 13 to the power feed pin 501a. Further, the length of the wire W1 can be shortened.

Although in this example, the exposed portion of the p-side pad electrode 14 in the infrared semiconductor laser device 3 is arranged on the side of the laser beam emission facet of the semiconductor laser apparatus 1000A in the X-direction, the exposed portion of the p-side pad electrode 13 in the red semiconductor laser device 2 may be arranged on the side of the laser beam emission facet of the semiconductor laser apparatus 1000A in the X-direction. In this case, the p-side pad electrode 14 in the infrared semiconductor laser device 3 and the power feed pin 501c are connected to each other through a wire. Further, the p-side pad electrode 13 in the red semiconductor laser device 2 and the power feed pin 501a are connected to each other through a wire.

(e) Method of Manufacturing Semiconductor Laser Apparatus

A method of manufacturing the semiconductor laser apparatus 1000A according to the present embodiment will be described. FIGS. 8 to 11 are schematic sectional views showing an example of a method of manufacturing the semiconductor laser apparatus 1000A according to the first embodiment. In FIGS. 8 to 11, an X-direction, a Y-direction, and a Z-direction shown in FIG. 1 are also defined.

Respective cross sections shown in FIGS. 8 to 11 correspond to a cross section taken along the line A1-A1 shown in FIG. 1. An n-GaN substrate 1s and an n-GaAs substrate 50, described later, are respectively an n-GaN wafer and an n-GaAs wafer. A plurality of blue-violet semiconductor laser devices 1 and monolithic red/infrared semiconductor laser devices 23X are respectively formed in the n-GaN wafer and the n-GaAs wafer. Consequently, respective parts of the n-GaN wafer and the n-GaAs wafer are illustrated in FIGS. 8 to 11.

Figure 8:
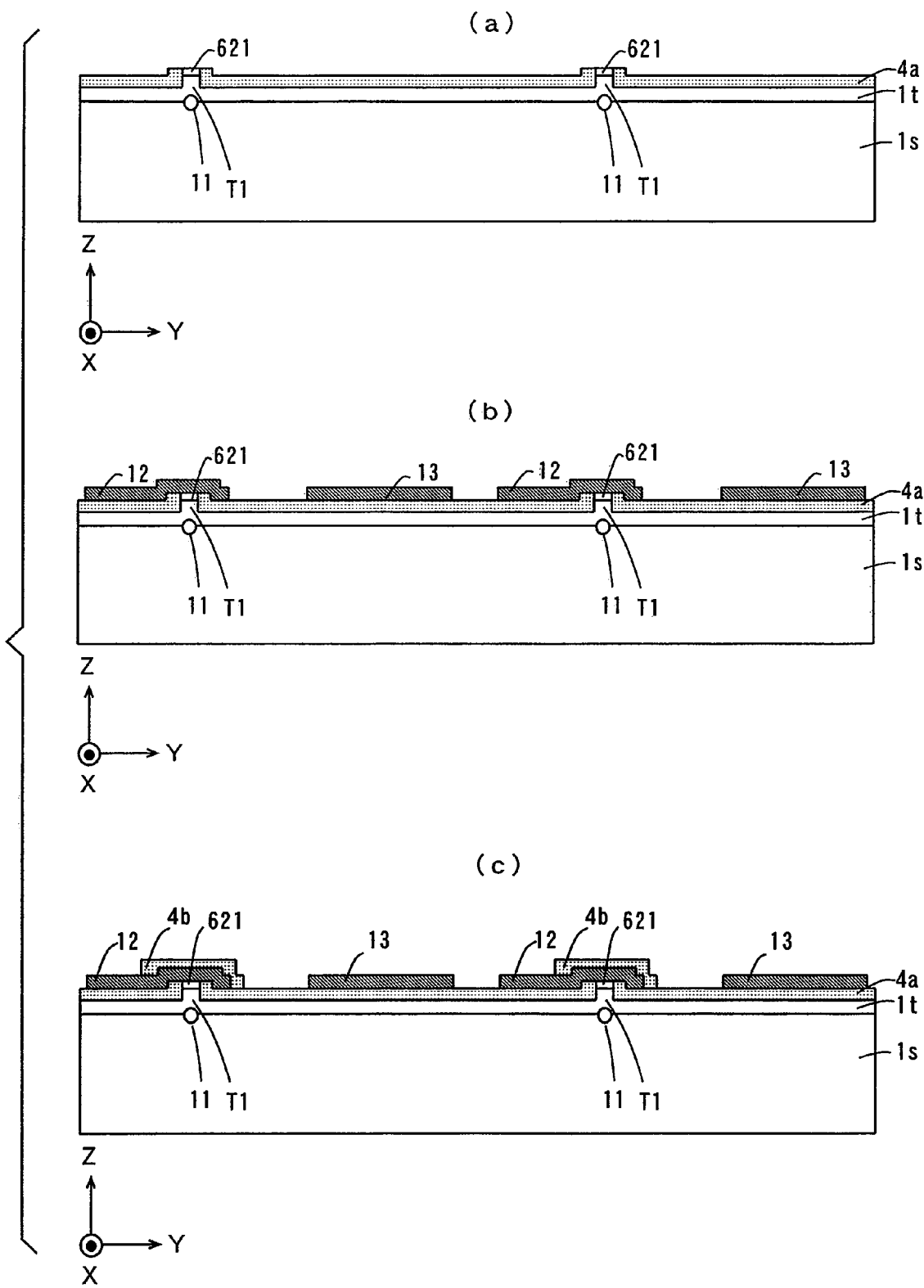
FIG. 8 is a schematic sectional view showing the steps of an example of a method of manufacturing the semiconductor laser apparatus according to the first embodiment.

As shown in FIG. 8 (*a*), in order to manufacture the blue-violet semiconductor laser device 1, a semiconductor layer 1*t* having a multilayer structure is formed on one surface of the n-GaN substrate 1*s* serving as a first growth substrate, to form a projection T1, extending in the X-direction is formed in the semiconductor layer 1*t*. Thereafter, an insulating film 4*a* composed of SiO$_2$ is formed on an upper surface of the semiconductor layer 1*t* having the projection T1 formed therein. Further, the insulating film 4*a* on an upper surface of the projection T1 is removed, to form a p-type ohmic electrode 621 on the exposed projection T1.

As shown in FIG. 8 (*b*), p-side pad electrodes 12 and 13 are then formed by patterning on an upper surface of the p-type ohmic electrode 621 and on the insulating film 4*a* on both sides of the projection T1 (see FIG. 3 (*a*)).

As shown in FIG. 8 (*c*), an insulating film 4*b* is then formed in a predetermined region on the insulating film 4*a* and on the p-side pad electrode 12 (see FIG. 3 (*b*)).

Figure 9:
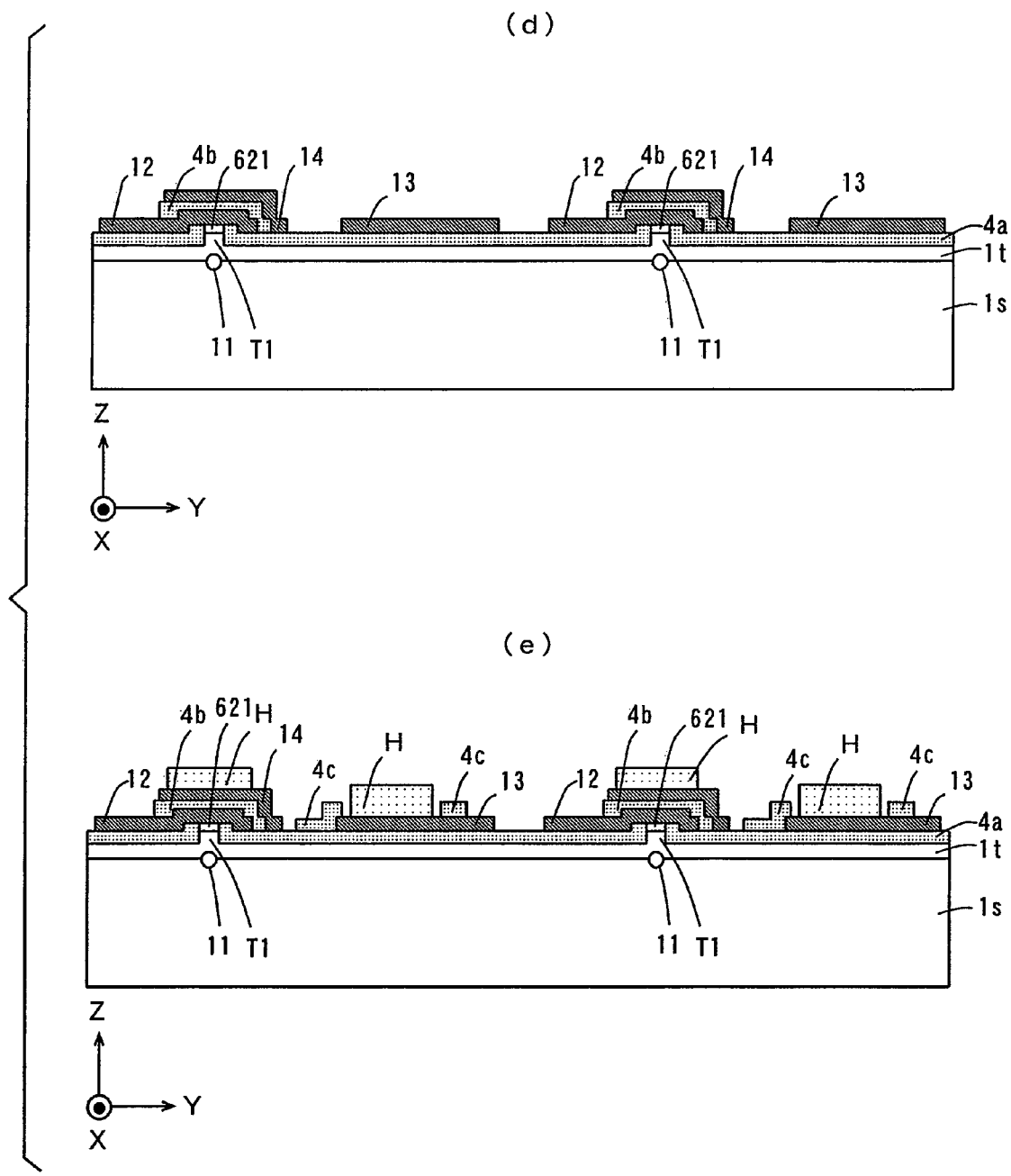
FIG. 9 is a schematic sectional view showing the steps of an example of a method of manufacturing the semiconductor laser apparatus according to the first embodiment.

As shown in FIG. 9 (*d*), a p-side pad electrode 14 is formed by patterning in a predetermined region on the insulating film 4*a* and the insulating film 4*b* (see FIG. 4 (*c*)).

As shown in FIG. 9 (*e*), an insulating film 4*c* is then formed by patterning in a predetermined region on each of the insulating film 4*a* and the p-side pad electrodes 13 and 14 (see FIG. 4 (*d*)). Therefore, a solder film H composed of Au—Sn is formed on each of an upper surface of the exposed p-side pad electrode 13 and in a predetermined region of the exposed p-side pad electrode 14. An n-electrode 15 in the blue-violet semiconductor laser device 1 is formed in the subsequent steps.

Figure 10:
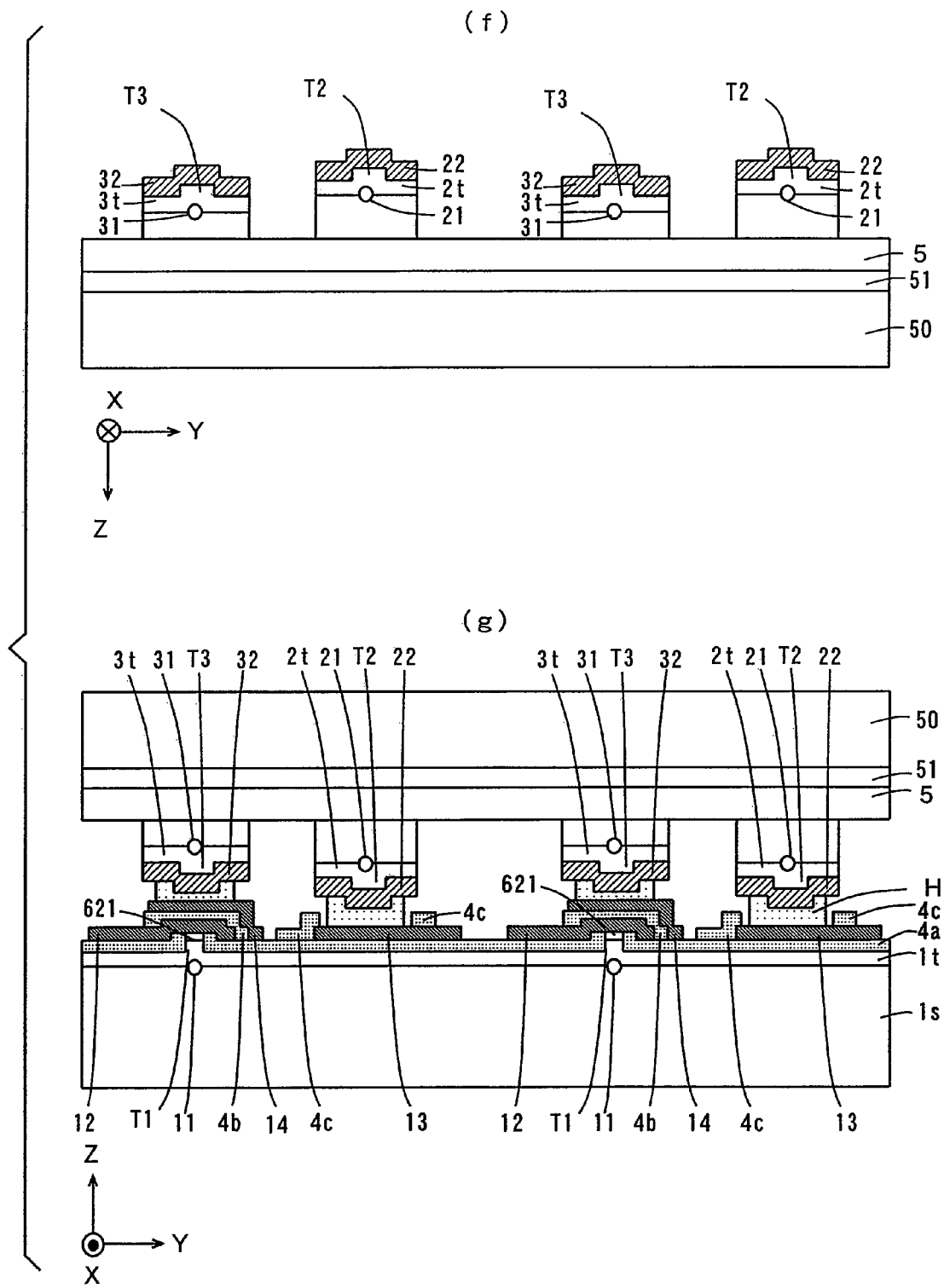
FIG. 10 is a schematic sectional view showing the steps of an example of a method of manufacturing the semiconductor laser apparatus according to the first embodiment.

On the other hand, as shown in FIG. 10 (*f*), in order to manufacture the monolithic/infrared semiconductor laser device 23X, an etching stop layer 51 composed of AlGaAs is formed on one surface of an n-GaAs substrate 50 serving as a second growth substrate, to form an n-GaAs contact layer 5 on the etching stop layer 51.

A semiconductor layer 2*t* having an AlGaInP based multilayer structure and a semiconductor layer 3*t* having an AlGaAs based multilayer structure are formed so as to be spaced apart from each other on the n-GaAs contact layer 5. Further, a p-side pad electrode 22 and a p-side pad electrode 32 are respectively formed on the semiconductor layer 2*t* and the semiconductor layer 3*t*. P-type ohmic electrodes are respectively formed between the semiconductor layer 2*t* and the p-side pad electrode 22 and between the semiconductor layer 3*t* and the p-side pad electrode 32, which are omitted in the figure. The common n-electrode 233 in the monolithic red/infrared semiconductor laser device 23X is formed in the subsequent steps.

As shown in FIG. 10 (*g*), the p-side pad electrode 13 formed on the insulating film 4*a* and the p-side pad electrode 22 formed on the semiconductor layer 2*t* are joined to each other with the solder film H sandwiched therebetween, and the p-side pad electrode 14 formed on the insulating film 4*a* and the insulating film 4*b* and the p-side pad electrode 32 formed on the semiconductor layer 3*t* are joined to each other with the solder film H sandwiched therebetween, thereby forming a stacked substrate.

At this time, both the n-GaN substrate 1*s* and the n-GaAs substrate 50 respectively have thicknesses of approximately 300 to 500 µm. Thus, the n-GaN substrate 1*s* and the n-GaAs substrate 50 are easy to handle, so that the p-side pad electrodes 22 and 32 are respectively easy to join to the p-side pad electrodes 13 and 14.

The n-GaN substrate 1*s* in the blue-violet semiconductor laser device 1 is transparent. The n-GaN substrate 1*s* has such a transmission factor and a thickness that the monolithic red/infrared semiconductor laser device 23X can be visually observed through the n-GaN substrate 1*s*.

Thus, positions where the p-side pad electrodes 22 and 32 are respectively joined to the p-side pad electrodes 13 and 14 can be visually confirmed through the n-GaN substrate 1*s*. Thus, the monolithic/infrared semiconductor laser device 23×(the red semiconductor laser device 2 and the infrared semiconductor laser device 3) on the blue-violet semiconductor laser device 1 is easy to position.

In the present embodiment, a substrate in the blue-violet semiconductor laser device 1 is not limited to the n-GaN substrate 1*s*. For example, another substrate having translucent properties and electrically conductive properties may be used. As the other substrate having translucent properties, an n-ZnO substrate can be used, for example. In this case, the monolithic red/infrared semiconductor laser device 23X is easy to position on the blue-violet semiconductor laser device 1, as described above.

Here, the n-GaAs substrate 50 is processed to a predetermined thickness by etching, grinding, or the like, and is then etched up to the etching stop layer 51.

For example, the n-GaAs substrate 50 is first ground until it has a predetermined thickness, and is then removed by dry etching such as reactive ion etching (RIE).

The etching stop layer 51 is further removed. For example, the etching stop layer 51 is removed by wet etching using an etchant composed of a hydrofluoric acid or a hydrochloric acid.

Figure 11:
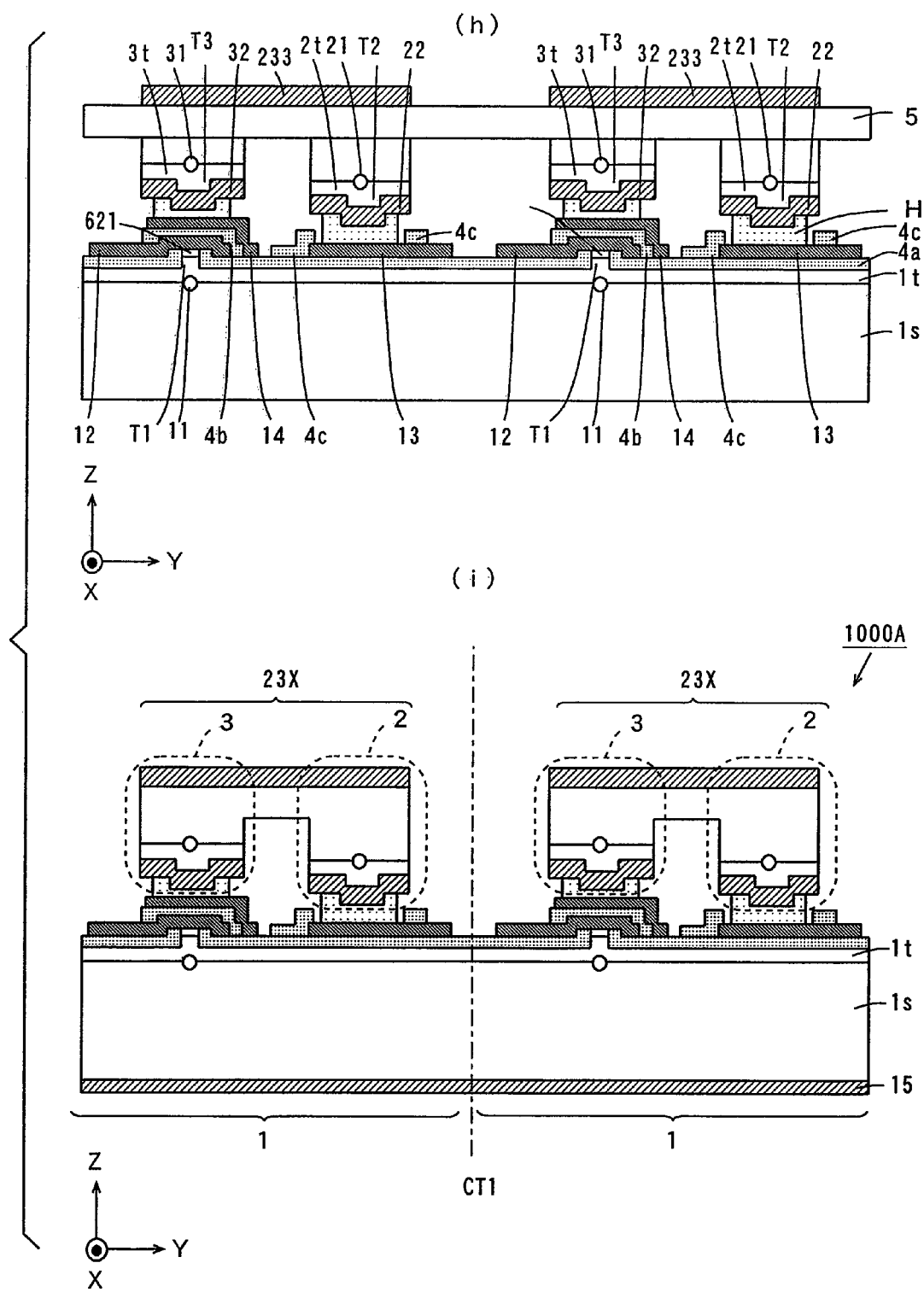
FIG. 11 is a schematic sectional view showing the steps of an example of a method of manufacturing the semiconductor laser apparatus according to the first embodiment.

Thereafter, as shown in FIG. 11 (*h*), the etching stop layer 51 is removed, and the common n-electrode 233 is then formed by patterning in respective regions on the n-GaAs contact layer 5 above the semiconductor layers 2*t* and 3*t* and a predetermined region therebetween.

As shown in FIG. 11 (*i*), the n-GaAs contact layer 5 in a portion where the common n-electrode 233 is not formed is removed by dry etching. Thus, the monolithic red/infrared semiconductor laser device 23X (the red semiconductor laser device 2 and the infrared semiconductor laser device 3) is manufactured. The details of the configuration of the red semiconductor laser device 2 and the infrared semiconductor laser device 3 will be described later.

Furthermore, the n-GaN substrate 1*s* is thinned by grinding, and the n-electrode 15 is then formed on a lower surface of the n-GaN substrate 1*s*. Thus, the blue-violet semiconductor laser device 1 is manufactured. The details of the configuration of the blue-violet semiconductor laser device 1 will be described later.

Finally, a stacked substrate composed of the blue-violet semiconductor laser device 1 and the monolithic red/infrared semiconductor laser device 23X that are formed as described above is cleaved along a plurality of lines parallel to the Y-direction, to form cavity facets. Here, the cleavage along the Y-direction is performed such that the respective cavity lengths (in the X-direction) of the blue-violet semiconductor laser device 1 and the monolithic red/infrared semiconductor laser device 23X will be approximately 700 µm, for example.

A protective film is formed on each of the cavity facets and is then cut along a plurality of lines parallel to the X-direction, to divide the semiconductor laser apparatus 1000A into a plurality of chips. The cutting of the stacked substrate along the X-direction is performed along a one-dot and dash line CT1 shown in FIG. 11 (*g*), for example.

Chips of the blue-violet semiconductor laser device 1 and chips of the monolithic red/infrared semiconductor laser device 23X may be previously individually formed, and may be affixed to one another to manufacture the semiconductor laser apparatus 1000A.

(f) Configuration of Blue-Violet Semiconductor Laser Device

The details of the configuration of the blue-violet semiconductor laser device 1, together with a method of manufacturing the same, will be described on the basis of FIG. 12.

Figure 12:
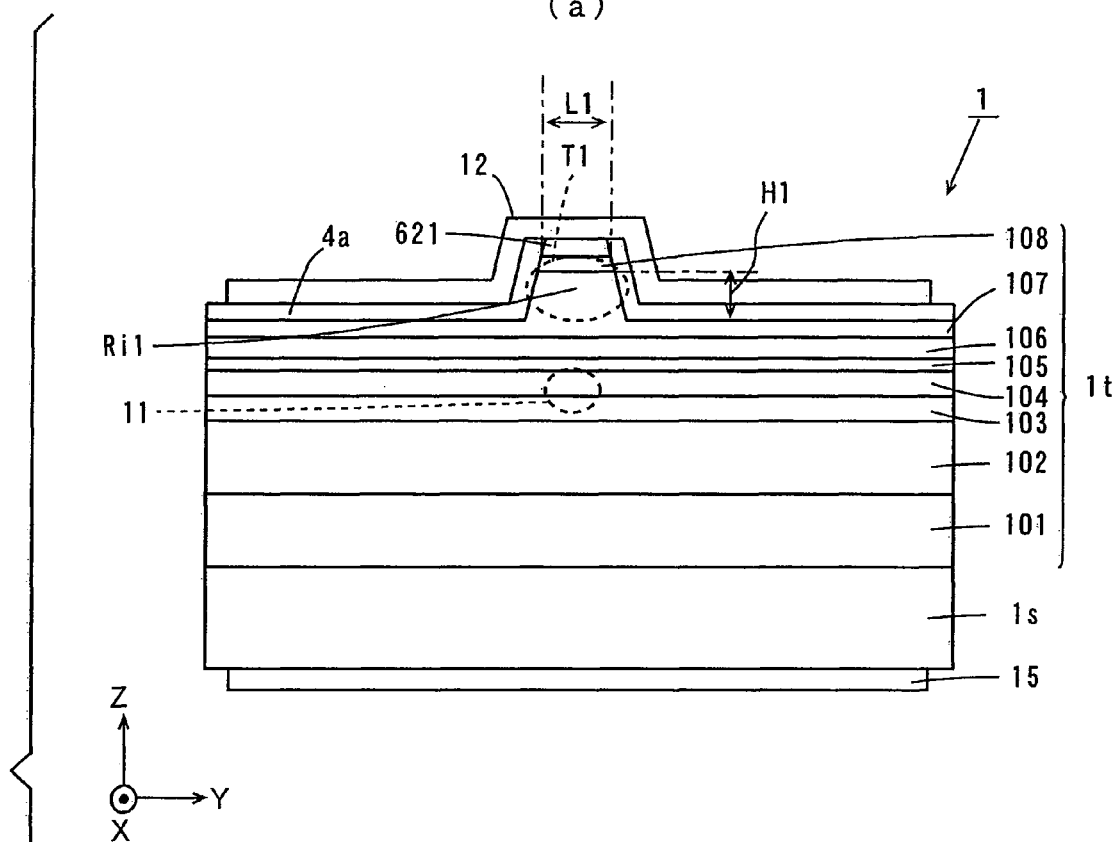
FIG. 12 is a schematic sectional view for explaining the details of the configuration of a blue-violet semiconductor laser device.
Figure 12:
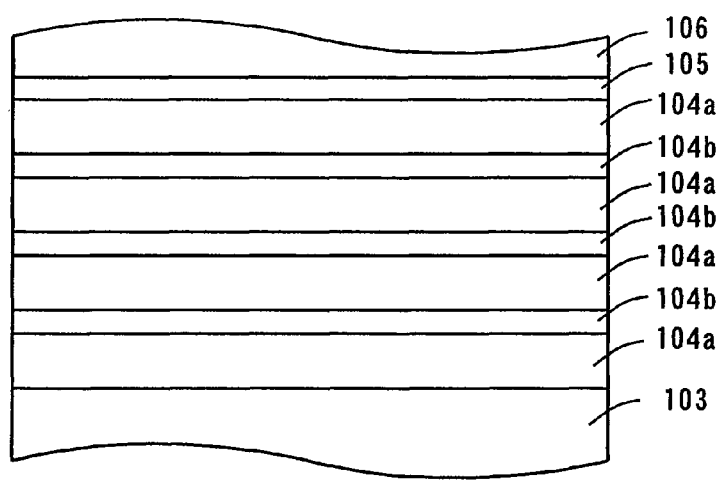

FIG. 12 is a schematic sectional view for explaining the details of the configuration of the blue-violet semiconductor laser device 1. In the following description, an X-direction, a Y-direction, and a Z-direction are also defined, as in FIG. 1.

When the blue-violet semiconductor laser device 1 is manufactured, the semiconductor layer 1t having a multilayer structure is formed on the n-GaN substrate 1s, as described above.

As shown in FIG. 12 (a), an n-GaN layer 101, an n-AlGaN cladding layer 102, an n-GaN optical guide layer 103, a multiple quantum well (MQW) active layer 104, an undoped AlGaN cap layer 105, an undoped GaN optical guide layer 106, a p-AlGaN cladding layer 107, and an undoped GaInN contact layer 108 are formed in this order as the semiconductor layer 1t having a multilayer structure on the n-GaN substrate 1s. The layers are formed by metal organic chemical vapor deposition (MOCVD), for example.

As shown in FIG. 12 (b), the MQW active layer 104 has a structure in which four undoped GaInN barrier layers 104a and three undoped GaInN well layer 104b are alternately stacked.

Here, the Al composition of the n-AlGaN cladding layer 102 is 0.15, and the Ga composition thereof is 0.85. Si is doped into the n-GaN layer 101, the n-AlGaN cladding layer 102, and the n-GaN optical guide layer 103.

The Ga composition of the undoped GaInN barrier layer 104a is 0.95, and the In composition thereof is 0.05. The Ga composition of the undoped GaInN well layer 104b is 0.90, and the In composition thereof is 0.10. The Al composition of the p-AlGaN cap layer 105 is 0.30, and the Ga composition thereof is 0.70.

Furthermore, the Al composition of the p-AlGaN cladding layer 107 is 0.15, and the Ga composition thereof is 0.85. Mg is doped into the p-AlGaN cladding layer 107. The Ga composition of the undoped GaInN contact layer 108 is 0.95, and the In composition thereof is 0.05.

A striped ridge Ri1 extending in the X-direction is formed in the p-AlGaN cladding layer 107 in the semiconductor layer 1t.

The undoped GaInN contact layer 108 is formed on an upper surface of the ridge Ri in the p-AlGaN cladding layer 107. Thus, a projection T1 comprising the ridge Ri1 in the p-AlGaN cladding layer 107 and the undoped GaInN contact layer 108 is formed. The width L1 at the top of the projection T1 is approximately 1.5 μm, and the height H1 of the ridge Ri1 is approximately 0.3 μm.

An insulating film 4a composed of $SiO_2$ is formed on respective upper surfaces of the p-AlGaN cladding layer 107 and the undoped GaInN contact layer 108. The insulating film 4a formed on the undoped GaInN contact layer 108 is removed by etching. A p-type ohmic electrode 621 composed of Pd/Pt/Au is formed on the undoped GaInN contact layer 108 exposed to the exterior. Further, a p-side pad electrode 12 is formed by sputtering, vacuum evaporation, or electron beam evaporation so as to cover respective upper surfaces of the p-type ohmic electrode 621 and the insulating film 4a. Here, the description of the p-side pad electrodes 13 and 14 shown in FIG. 1 is not repeated.

The semiconductor layer 1t having a multilayer structure is thus formed on one surface of the n-GaN substrate 1s. Further, an n-electrode 15 composed of Ti/Pt/Au is formed on the other surface of the n-GaN substrate 1s.

In the blue-violet semiconductor laser device 1, a blue-violet emission point 11 is formed at a position of the MQW active layer 104 below the ridge Ri1. In this example, the MQW active layer 104 corresponds to the p-n junction interface 10 shown in FIG. 1.

(g) Configuration of Red Semiconductor Laser Device

The details of the configuration of the red semiconductor laser device 2, together with a method of manufacturing the same, will be described on the basis of FIG. 13.

Figure 13:
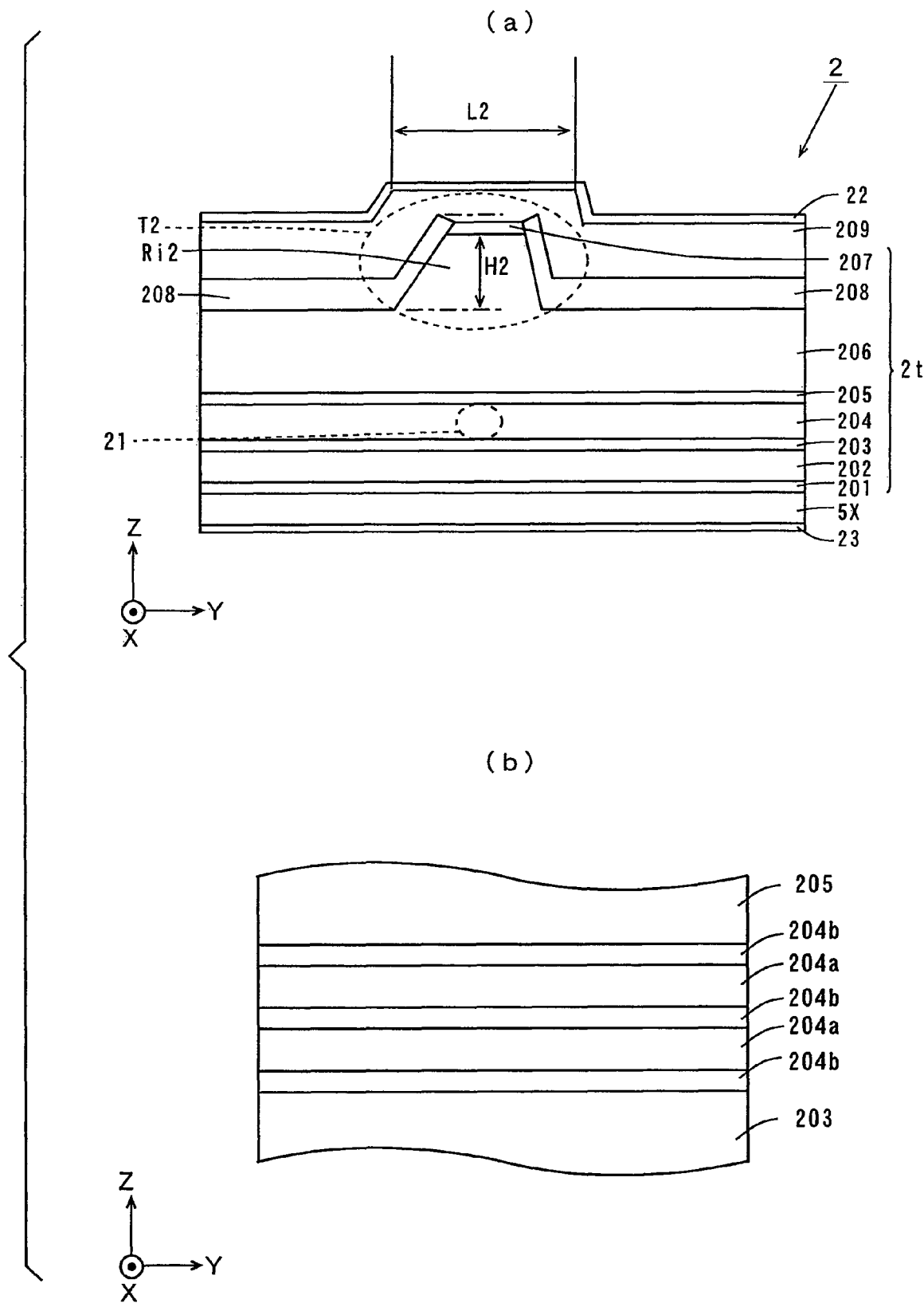
FIG. 13 is a schematic sectional view for explaining the details of the configuration of a red semiconductor laser device in a monolithic red/infrared semiconductor laser device.

FIG. 13 is a schematic sectional view for explaining the details of the configuration of the red semiconductor laser device 2 in the monolithic red/infrared semiconductor laser device 23X. In the following description, an X-direction, a Y-direction, and a Z-direction are also defined, as in FIG. 1. Although in the present embodiment, the red semiconductor laser device 2 is manufactured by forming the semiconductor layer 2t on an n-GaAs contact layer 5, the semiconductor layer 2t is formed on an n-GaAs substrate 5X in place of the n-GaAs contact layer 5. Si is doped into the n-GaAs substrate 5X.

As shown in FIG. 13 (a), an n-GaN layer 201, an n-AlGInP cladding layer 202, an undoped AlGaInP optical guide layer 203, an MQW active layer 204, an undoped AlGaInP optical guide layer 205, a p-AlGaInP cladding layer 206, and a p-contact layer 207 are formed in this order on the n-GaAs substrate 5X. The layers are formed by MOCVD, for example.

As shown in FIG. 13 (b), the MQW active layer 204 has a structure in which two undoped AlGaInP barrier layers 204a and three undoped InGaP well layers 204b are alternately stacked.

Here, the Al composition of the n-AlGaInP cladding layer 202 is 0.35, the Ga composition thereof is 0.15, and the In composition thereof is 0.50. Si is doped into the n-GaAs layer 201 and the n-AlGaInP cladding layer 202.

The Al composition of the undoped AlGaInP optical guide layer 203 is 0.25, the Ga composition thereof is 0.25, and the In composition thereof is 0.50.

The Al composition of the undoped AlGaInP barrier layer 204a is 0.25, the Ga composition thereof is 0.25, and the In composition thereof is 0.50. The In composition of the undoped InGaP well layer 204b is 0.50, and the Ga composition thereof is 0.50. The Al composition of the undoped AlGaInP optical guide layer 205 is 0.25, the Ga composition thereof is 0.25, and the In composition thereof is 0.50.

Furthermore, the Al composition of the p-AlGaInP cladding layer 206 is 0.35, the Ga composition thereof is 0.15, and the In composition thereof is 0.50. The In composition of the p-InGaP etching stop layer 207 is 0.50, and the Ga composition thereof is 0.50.

The p-contact layer 207 has a multilayer structure of a p-GaInP layer and a p-GaAs layer. The Ga composition of the p-GaInP is 0.5, and the In composition thereof is 0.5.

When the composition of the AlGaInP based material is expressed by a general formula $Al_aGa_bIn_cP$, a indicates the Al composition, b indicates the Ga composition, and c indicates the In composition.

Zn is doped into p-GaInP and p-GaAs in the p-AlGaInP cladding layer 206 and the p-contact layer 207.

In the foregoing, a striped ridge Ri2 extending in the X-direction is formed in the p-AlGaN cladding layer 206. The p-contact layer 207 is formed on an upper surface of the ridge Ri2 in the p-AlGaInP cladding layer 206.

A current blocking layer 208 is formed so as to cover an upper surface of the p-AlGaInP cladding layer 206, a side surface of the ridge Ri2, and a side surface of the p-contact layer 207. The current blocking layer 208 is composed of AlGaAs having Si doped therein.

A contact layer 209 is formed on the p-contact layer 207 and the current blocking layer 208. Thus, a projection T2 comprising the ridge Ri2 in the p-AlGaInP cladding layer 206, the p-contact layer 207, the current blocking layer 208, and the contact layer 209 is formed. The contact layer 209 is composed of GaAs having Zn doped therein. The width L2 at the top of the projection T2 is approximately 10 μm, and the height H2 of the ridge Ri2 is approximately 1 μm.

A p-side pad electrode 22 is formed by sputtering, vacuum evaporation, or electron beam evaporation on the contact layer 209.

The semiconductor layer 2t having a multilayer structure is thus formed on one surface of the n-GaAs substrate 5X. Further, an n-electrode 23 (a common n-electrode 233) composed of AuGe/Ni/Au is formed on the other surface of the n-GaAs substrate 5X.

In the red semiconductor laser device 2, a red emission point 21 is formed at a position of the MQW active layer 204 below the ridge Ri2. In this example, the MQW active layer 204 corresponds to the p-n junction interface 20 shown in FIG. 1.

(h) Configuration of Infrared Semiconductor Laser Device

The details of the configuration of the infrared semiconductor laser device 3, together with a method of manufacturing the same, will be described on the basis of FIG. 14.

Figure 14:
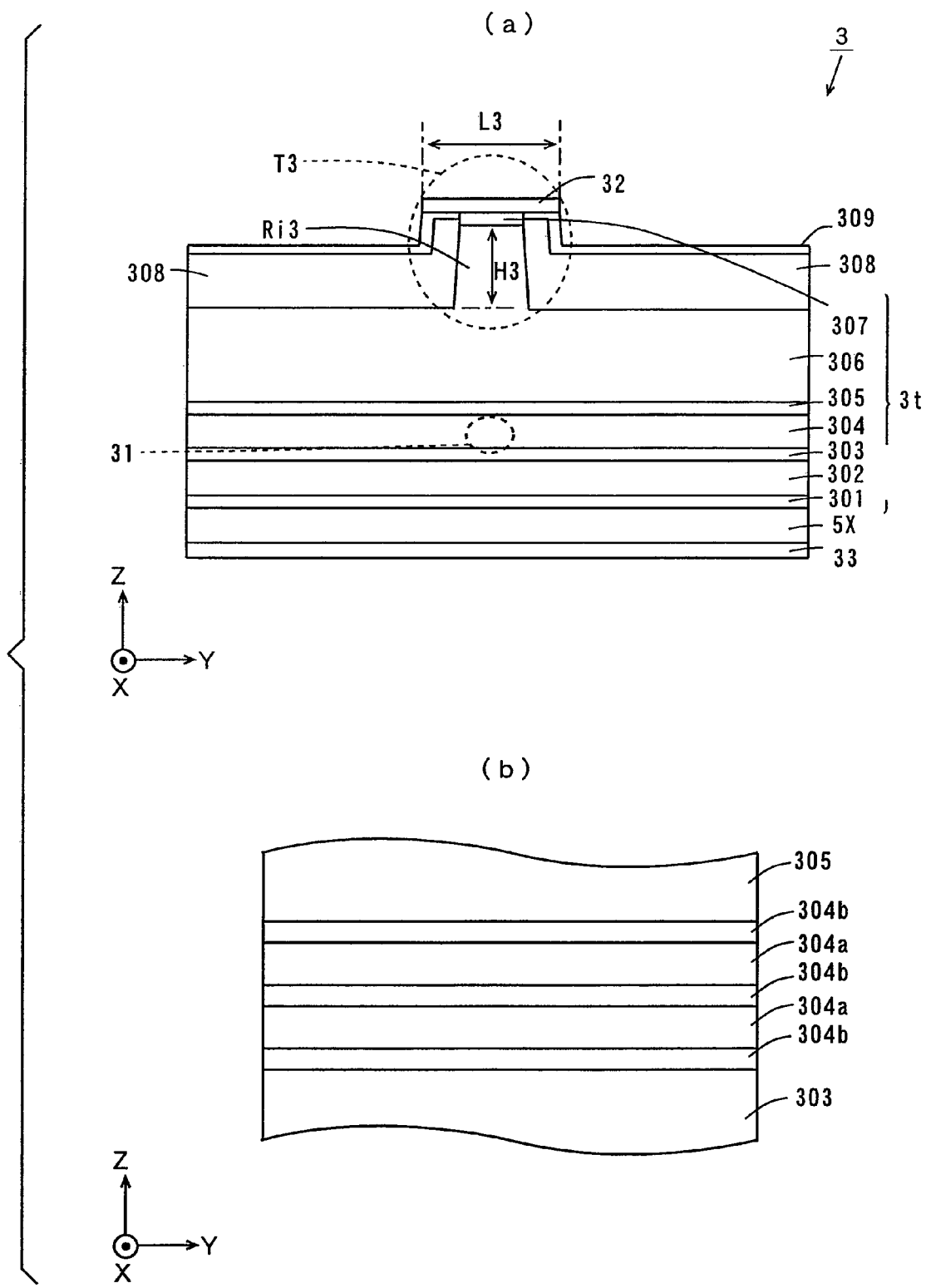
FIG. 14 is a schematic sectional view for explaining the details of the configuration of an infrared semiconductor laser device in a monolithic red/infrared semiconductor laser device.

FIG. 14 is a schematic sectional view for explaining the details of the configuration of the infrared semiconductor laser device 3 in the monolithic red/infrared semiconductor laser device 23X. In the following description, an X-direction, a Y-direction, and a Z-direction are also defined, as in FIG. 1. Although in the present embodiment, the infrared semiconductor laser device 3 is manufactured by forming the semiconductor layer 3t on the n-GaAs contact layer 5, the semiconductor layer 3t is formed on an n-GaAs substrate 5X in place of the n-GaAs contact layer 5. Si is doped into the n-GaAs substrate 5X.

As shown in FIG. 14(a), an n-GaN layer 301, an n-AlGaAs cladding layer 302, an undoped AlGaAs optical guide layer 303, an MQW active layer 304, an undoped AlGaAs optical guide layer 305, a p-AlGaAs cladding layer 306, and a p-contact layer 307 are formed in this order as the semiconductor layer 3t having a multilayer structure on the n-GaAs substrate 5X. The layers are formed by MOCVD, for example.

As shown in FIG. 14(b), the MQW active layer 304 has a structure in which two undoped AlGaAs barrier layers 304a and three undoped AlGaAs well layers 304b are alternately stacked.

Here, the Al composition of the n-AlGaAs cladding layer 302 is 0.45, and the Ga composition thereof is 0.55, for example. Si is doped into the n-GaAs layer 301 and the n-AlGaAs cladding layer 302.

The Al composition of the undoped AlGaAs optical guide layer 303 is 0.35, and the Ga composition thereof is 0.65. The Al composition of the undoped AlGaAs barrier layer 304a is 0.35, and the Ga composition thereof is 0.65. The Al composition of the undoped AlGaAs well layer 304b is 0.10, and the Ga composition thereof is 0.90. The Al composition of the undoped AlGaAs optical guide layer 305 is 0.35, and the Ga composition thereof is 0.65.

Furthermore, the Al composition of the p-AlGaN cladding layer 306 is 0.45, and the Ga composition thereof is 0.55.

Zn is doped into the p-AlGaAs cladding layer 306 and the p-contact layer 307.

In the foregoing, a striped ridge Ri3 extending in the X-direction is formed in the p-AlGaAs cladding layer 306. The p-contact layer 307 is formed on an upper surface of the ridge Ri3 in the p-AlGaAs cladding layer 306.

A current blocking layer 308 is formed so as to cover an upper surface of the p-AlGaAs cladding layer 306, a side surface of the ridge Ri3, and a side surface of the p-contact layer 307. The current blocking layer 308 is composed of AlGaAs having Si doped therein.

A cap layer 309 is formed so as to cover the top of the current blocking layer 308 and the exposed side surface of the p-contact layer 307. Thus, a projection T3 comprising the ridge Ri3 in the p-AlGaAs cladding layer 306, the p-contact layer 307, the current blocking layer 308, and the cap layer 309 is formed. The cap layer 309 is composed of undoped GaAs. The width L3 of the projection T3 is approximately 15 μm, and the height H3 of the ridge Ri3 is approximately 1 μm.

A p-side pad electrode 32 is formed by sputtering, vacuum evaporation, or electron beam evaporation on the p-contact layer 307 and in a predetermined region on the cap layer 309.

The semiconductor layer 3t having a multilayer structure is thus formed on one surface of the n-GaAs substrate 5X. Further, an n-electrode 33 (a common n-electrode 233) composed of AuGe/Ni/Au is formed on the other surface of the n-GaAs substrate 5X.

In the infrared semiconductor laser device 3, an infrared emission point 31 is formed at a position of the MQW active layer 304 below the ridge Ri3. In this example, the MQW active layer 304 corresponds to the p-n junction interface 30 shown in FIG. 1.

Here, in the present embodiment, the width in the Y-direction at the top of the projection T3 is larger than the width in the Y-direction at the top of the projection T1 (see FIG. 12), as described above. In this case, the projection T3 can be stably arranged on the projection T1 in joining the blue-violet semiconductor laser device 1 and the infrared semiconductor laser device 3. The projection T3 is prevented from applying a local stress to the projection T1. Thus, the blue-violet semiconductor laser device 1 is prevented from being degraded.

In the present embodiment, the width in the Y-direction at the top of the projection T3 is larger than the width in the Y-direction at the top of the projection T2, as described above. In this case, the projection T3 can be more stably arranged on the projection T1. The projection T3 is reliably prevented from applying a local stress to the projection T1. Consequently, the blue-violet semiconductor laser device 1 is reliably prevented from being degraded.

(i) Configuration of Optical Pickup Apparatus Containing Semiconductor Laser Apparatus A plurality of examples of an optical pickup apparatus containing the semiconductor laser apparatus according to the present embodiment will be described.

(i-1a) First Example of Optical Pickup Apparatus

Figure 15:
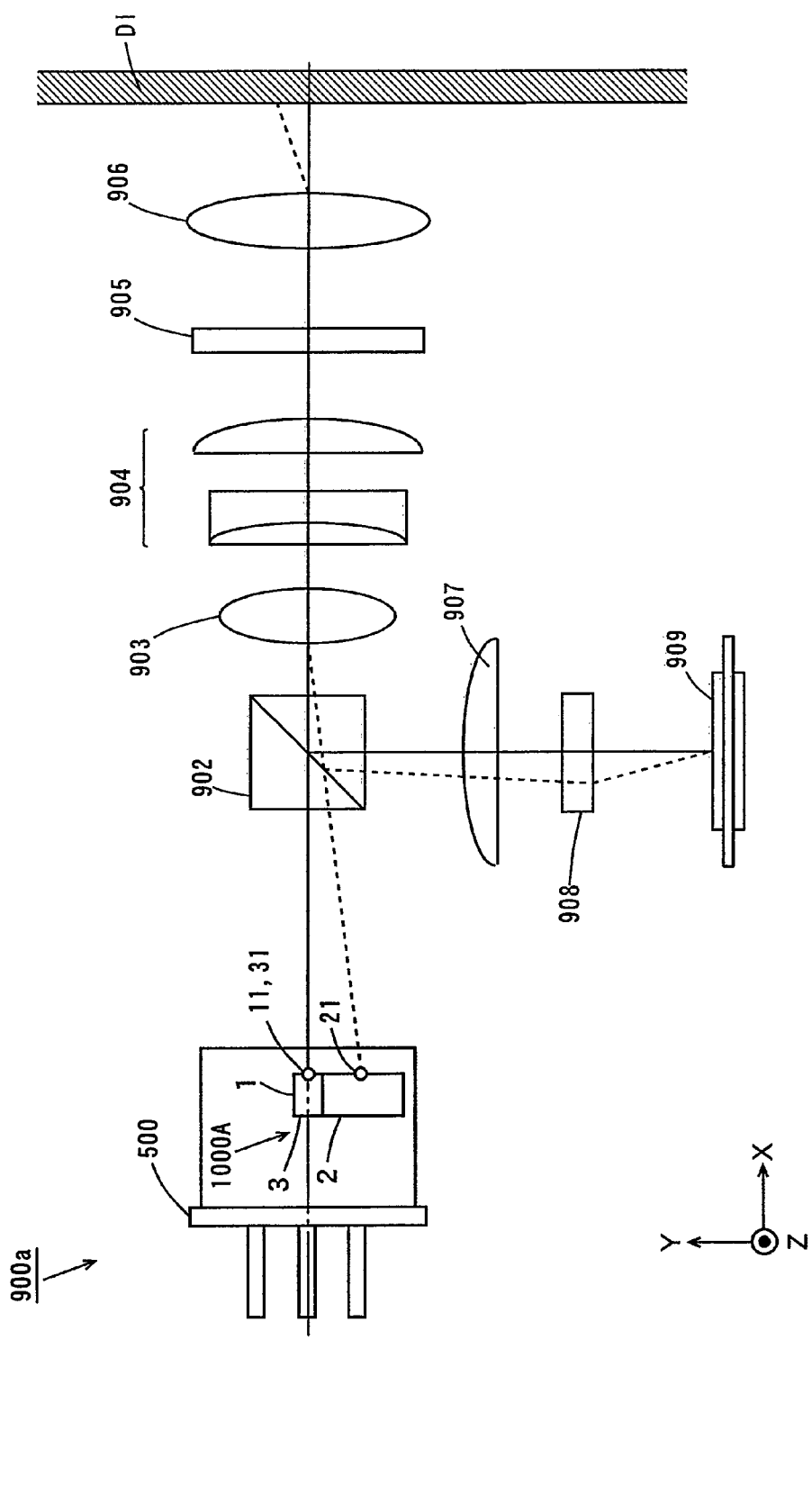
FIG. 15 is a diagram showing the configuration of an optical pickup apparatus.

FIG. 15 is a diagram showing the configuration of an optical pickup apparatus 900a according to the present embodiment. In the following description, a laser beam having a wavelength of approximately 405 nm emitted from the blue-violet emission point 11 in the semiconductor laser apparatus 1000A is referred to as a blue-violet laser beam, a laser beam having a wavelength of approximately 650 nm emitted from the red emission point 21 is referred to as a red laser beam, and a laser beam having a wavelength of approximately 780 nm emitted from the infrared emission point 31 is referred to as an infrared laser beam. In FIG. 15, the blue-violet laser beam and the infrared laser beam are respectively indicated by solid lines, and the red laser beam is indicated by a dash line.

As shown in FIG. 15, the optical pickup apparatus 900a comprises a substantially round-shaped can package for laser devices 500 having the semiconductor laser apparatus 1000A mounted thereon, a polarizing beam splitter (hereinafter abbreviated as PBS) 902, a collimator lens 903, a beam expander 904, a λ/4 plate 905, an objective lens 906, a cylindrical lens 907, an optical axis correction element 908, and a photodetector 909.

In FIG. 15, three directions that are perpendicular to one another, as indicated by arrows X, Y, and Z, are respectively taken as an X-direction, a Y-direction, and a Z-direction.

The X-direction is a direction perpendicular to an optical recording medium (hereinafter referred to as an optical disk) DI serving as a reproduction object. The Y-direction and the Z-direction are directions parallel to one surface of the optical disk DI and perpendicular to each other.

The substantially round-shaped can package for laser devices 500 having the semiconductor laser apparatus 1000A mounted thereon is arranged such that the blue-violet emission point 11, the red emission point 21, and the infrared emission point 31 in the semiconductor laser apparatus 1000A are aligned on a substantially straight line along the Y-direction. As described above, the distance between the blue-violet emission point 11 and the infrared emission point 31 is significantly shorter than the distance between the blue-violet emission point 11 and the red emission point 21 and the distance between the infrared emission point 31 and the red emission point 21. Polarization planes of the laser beams respectively emitted from the blue-violet emission point 11, the red emission point 21, and the infrared emission point 31 are parallel to one another.

As described above, the blue-violet emission point 11 in the semiconductor laser apparatus 1000A is positioned in a substantially central portion on a Y-Z plane of the substantially round-shaped can package for laser devices 500.

In this example, the PBS 902, the collimator lens 903, the beam expander 904, the λ/4 plate 905, and the objective lens 906 that constitute an optical system are arranged in this order along the optical axis of a blue-violet laser beam emitted in the X-direction from the blue-violet emission point 11 (the center of the substantially round-shaped can package for laser devices 500). That is, the optical axis of the optical system from the PBS 902 to the objective lens 906 is aligned with the optical axis of the blue-violet laser beam.

The PBS 902 totally transmits each of the laser beams emitted from the semiconductor laser apparatus 1000A and totally reflects the laser beam returned from the optical disk DI.

The collimator lens 903 converts the blue-violet laser beam, the red laser beam, or the infrared laser beam from the semiconductor laser apparatus 1000A that has been transmitted through the PBS 902 into a parallel laser beam.

The beam expander 904 comprises a concave lens, a convex lens, and an actuator (not shown).

The actuator changes the distance between the concave lens and the convex lens depending on a servo signal from a servo circuit (not shown). This causes a wave front shape of each of the laser beams emitted from the semiconductor laser apparatus 1000A to be corrected.

The λ/4 plate 905 converts a linearly-polarized laser beam that has been converted into the parallel laser beam by the collimator lens 903 into a circularly-polarized laser beam. The λ/4 plate 905 converts the circularly-polarized laser beam returned from the optical disk DI into a linearly-polarized laser beam. The direction of polarization of the linearly-polarized laser beam in this case is perpendicular to the direction of polarization of the linearly-polarized laser beam emitted from the semiconductor laser apparatus 1000A. Thus, the laser beam returned from the optical disk DI is almost totally reflected by the PBS 902.

The objective lens 906 converges the laser beam that has been transmitted through the λ/4 plate 905 on a surface (a recording layer) of the optical disk DI.

The objective lens 906 is movable in a focusing direction, a tracking direction, and a tilt direction by an actuator (not shown) of the objective lens depending on a servo signal from a servo circuit (a tracking servo signal, a focusing servo signal, and a tilt servo signal).

The cylindrical lens 907, the optical axis correction element 908, and the photodetector 909 are arranged along the optical axis of the laser beam totally reflected by the PBS 902.

The cylindrical lens 907 applies an astigmatism to an incident laser beam. The optical axis correction element 908 is formed by a diffraction grating. Height of the diffraction grating is determined such that first-diffracted light beams of a blue-violet semiconductor laser beam and an infrared semiconductor laser beam and a zeroth-order diffracted light beam of a red semiconductor laser beam are weakened and such that zeroth-order diffracted light beams of a blue-violet semiconductor laser beam and an infrared semiconductor laser beam and a first-order diffracted light beam of a red semiconductor laser beam are enhanced. If a binary diffraction grating is used as the diffraction grating, height of the diffraction grating is set to about $4\nu\lambda$, where $\nu$ and $\lambda$ are a refractive index of the diffraction grating and the wavelength of a blue-violet laser beam, respectively.

The optical axis correction element 908 introduces a blue-violet laser beam (a zeroth-order diffracted light beam) and an infrared laser beam (a zeroth-order diffracted light beam) that have been transmitted through the cylindrical lens 907 into the photodetector 909.

Furthermore, the optical axis correction element 908 diffracts a red laser beam that has been transmitted through the cylindrical lens 907, and introduces the diffracted red laser beam (a first-order diffracted light beam) into the photodetector 909.

In this case, the optical axis correction element 908 is positioned such that the position of a focusing spot formed on a light detecting surface of the photodetector 909 by the blue-violet laser beam and the infrared laser beam and the position of a focusing spot formed on the light detecting surface of the photodetector 909 by the red laser beam coincide with each other.

The photodetector 909 outputs a reproduction signal on the basis of the intensity distribution of the received laser beam. Here, the photodetector 909 has a detection region in a predetermined pattern such that a focusing error signal, a tracking error signal, and a tilt error signal, together with the reproduction signal, are obtained. An actuator of the beam expander 904 and an actuator of the objective lens are subjected to feedback control by the focusing error signal, the tracking error signal, and the tilt error signal.

(i-1b) Effect of Optical Pickup Apparatus in First Example

As shown in FIG. 15, in the optical pickup apparatus 900a, the blue-violet laser beam, the infrared laser beam, or the red laser beam is incident on the optical axis correction element 908 formed by the diffraction grating.

Generally, in the diffraction grating, respective diffraction efficiencies for a light beam having a certain wavelength and a light beam having a wavelength that is n times (n is a natural number) the wavelength can be equalized. That is, a diffraction efficiency in a case where the light beam having a certain wavelength is incident on the diffraction grating and a diffraction grating in a case where the light beam having a wavelength can be equalized. Then, because the wavelength (approximately 650 nm) of the red laser beam is not n times (n is a natural number) the wavelength (approximately 405 nm) of the blue-violet laser beam and the wavelength (approximately 780 nm) of the infrared laser beam, the optical axis correction element 908 allows a diffraction efficiency different from those for the blue-violet laser beam and the infrared laser beam to be given for the red laser beam.

The distance between the blue-violet emission point 11 and the infrared emission point 31 in the Z-direction is very short. Consequently, in this example, it can be recognized that the optical axis of the blue-violet laser beam and the optical axis of the infrared laser beam are substantially identical.

Here, the height of the diffraction grating is determined such that the first-order diffracted light beams of the blue-violet semiconductor laser beam and the infrared semiconductor laser beam are weakened and such that the zeroth-order diffracted light beams of the blue-violet semiconductor laser beam and the infrared semiconductor laser beam are enhanced. The optical axis correction element 908 is arranged such that the position of the focusing spot of the red laser beam coincides with the position of the focusing spot of the blue-violet laser beam and the infrared laser beam. Thus, the blue-violet laser beam, the infrared laser beam, and the red laser beam can be received by the common photodetector 909.

In the optical pickup apparatus 900a according to the present embodiment, therefore, the photodetector 909 that is common among the blue-violet laser beam, the infrared laser beam, and the red laser beam is used. This eliminates the necessity of providing three photodetectors respectively corresponding to the blue-violet laser beam, the infrared laser beam, and the red laser beam, thereby realizing miniaturization of the optical pickup apparatus 900a.

In the semiconductor laser apparatus 1000A, the distance between the blue-violet emission point 11 and the infrared emission point 31 is very short, and the infrared emission point 31 and the red emission point 21 are positioned on a straight line parallel to the Y-direction, so that the blue-violet emission point 11, the infrared emission point 31, and the red emission point 21 are arranged on a substantially straight line along the Y-direction. In a case where the semiconductor laser apparatus 1000A is used for the optical pickup apparatus 900a, therefore, the optical pickup apparatus 900a is easy to design.

(i-2a) Second Example of Optical Pickup Apparatus

Figure 16:
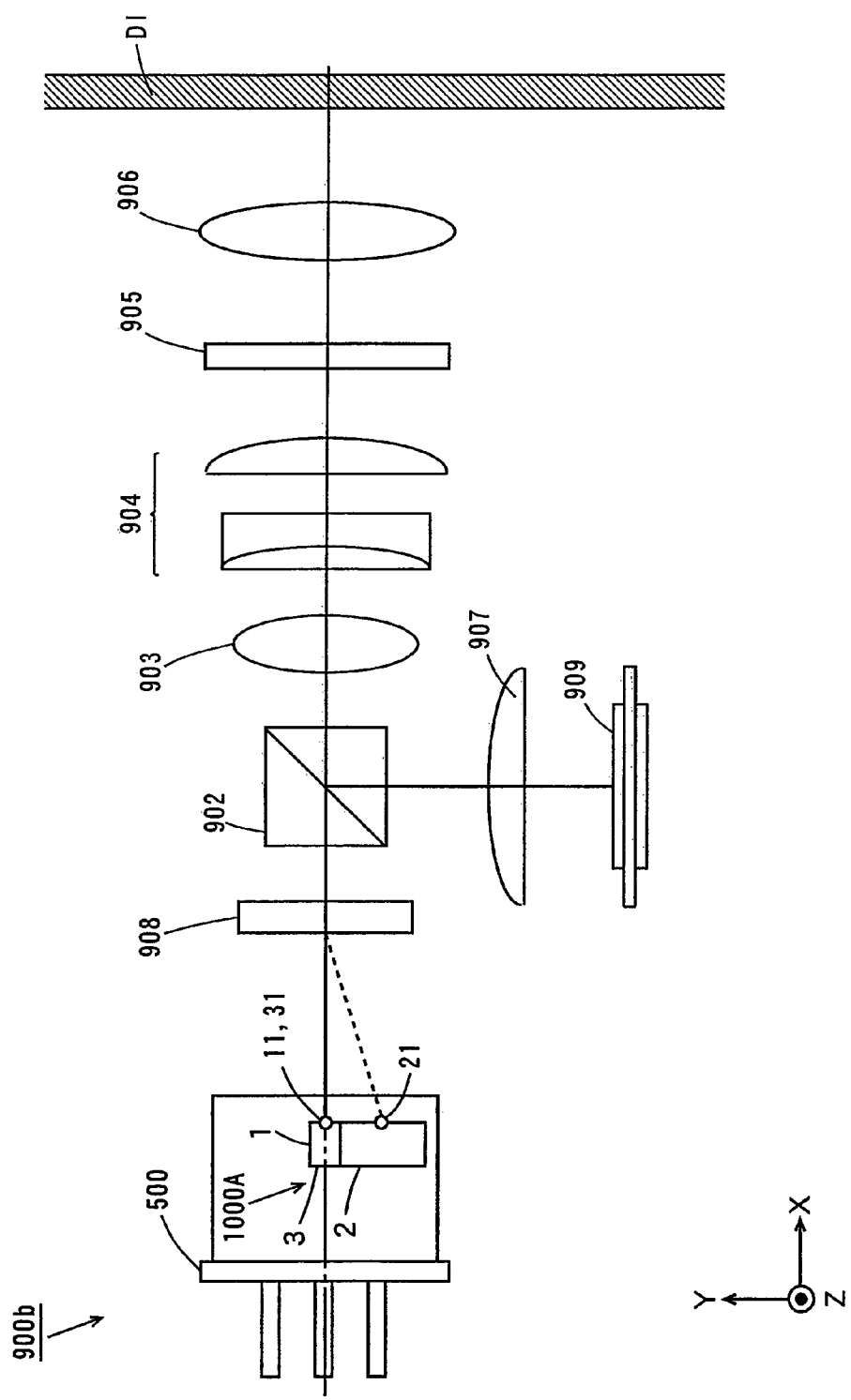
FIG. 16 is a diagram showing another example of the configuration of an optical pickup apparatus.

FIG. 16 is a diagram showing another example of the configuration of an optical pickup apparatus according to the present embodiment.

As shown in FIG. 16, the configuration of an optical pickup apparatus 900b in a second example is the same as the configuration of the optical pickup apparatus 900a in the first example except for the following points.

That is, an optical axis correction element 908 is arranged along the optical axis of a blue-violet laser beam emitted in the X-direction from a blue-violet emission point 11 between a substantially round-shaped can package for laser devices 500 and a PBS 902 instead of being provided between a cylindrical lens 907 and a photodetector 909.

(i-2b) Effect of Optical Pickup Apparatus in Second Example

In the above-mentioned configuration, the optical axis of a red laser beam emitted from a red emission point 21 is aligned with the respective optical axes of the blue-violet laser beam emitted from the blue-violet emission point 11 and an infrared laser beam emitted from an infrared emission point 31 by the optical axis correction element 908.

After the red laser beam is emitted from the red emission point 21, therefore, the optical axis of the red laser beam is corrected by the optical axis correction element 908 in the first stage of an optical system constructed as described above, so that the optical axis of the red laser beam is prevented from being shifted in a halfway stage of the optical system.

On the other hand, in the optical pickup apparatus 900b, the intensity of the red laser beam is attenuated by the optical axis correction element 908, as compared with that in the optical pickup apparatus 900a. However, the shift of the optical axis of the red laser beam from an objective lens 906 can be restrained. Thus, degradation of the optical characteristics of the red laser beam on the optical disk DI can be restrained.

(i-3) Third Example of Optical Pickup Apparatus and Effect Produced Thereby

Figure 17:
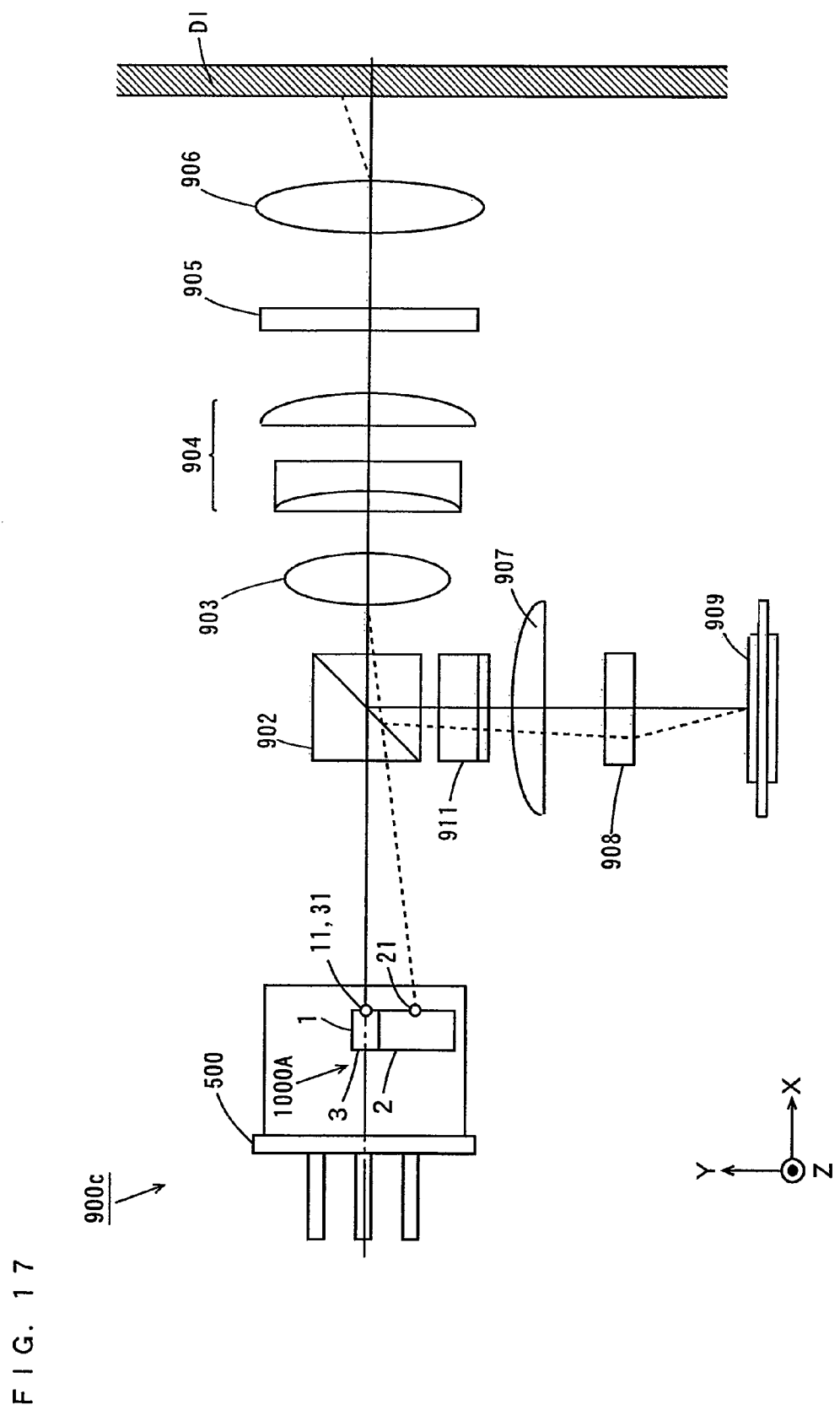
FIG. 17 is a diagram showing still another example of the configuration of an optical pickup apparatus.

FIG. 17 is a diagram showing still another example of the configuration of an optical pickup apparatus according to the present embodiment.

As shown in FIG. 17, the configuration of an optical pickup apparatus 900c in a third example is the same as the configuration of the optical pickup apparatus 900a in the first example except for the following points.

That is, a parallel plate 911 is further provided between a PBS 902 and a cylindrical lens 907.

The provision of the parallel plate 911 eliminates the necessity of considering the optical axis of a blue-violet laser beam and the optical axis of an infrared laser beam to be identical to each other and allows the optical axis of the infrared laser beam to be aligned with the optical axis of the blue-violet laser beam, as described in the optical pickup apparatus 900a.

This allows both the respective optical axes of the red laser beam and the infrared laser beam to be aligned with the optical axis of the blue-violet laser beam in this example.

In this example, the use of the parallel plate 911 without using an optical device such as a diffraction grating allows the complexity of an optical system to be avoided and allows the cost to be reduced.

Furthermore, in this example, the infrared laser beam aligned by correction is incident on a photodetector 909, so that the signal characteristics of the infrared laser beam are improved.

Here, the correction function of the optical axis by the parallel plate 911 will be described.

Figure 18:
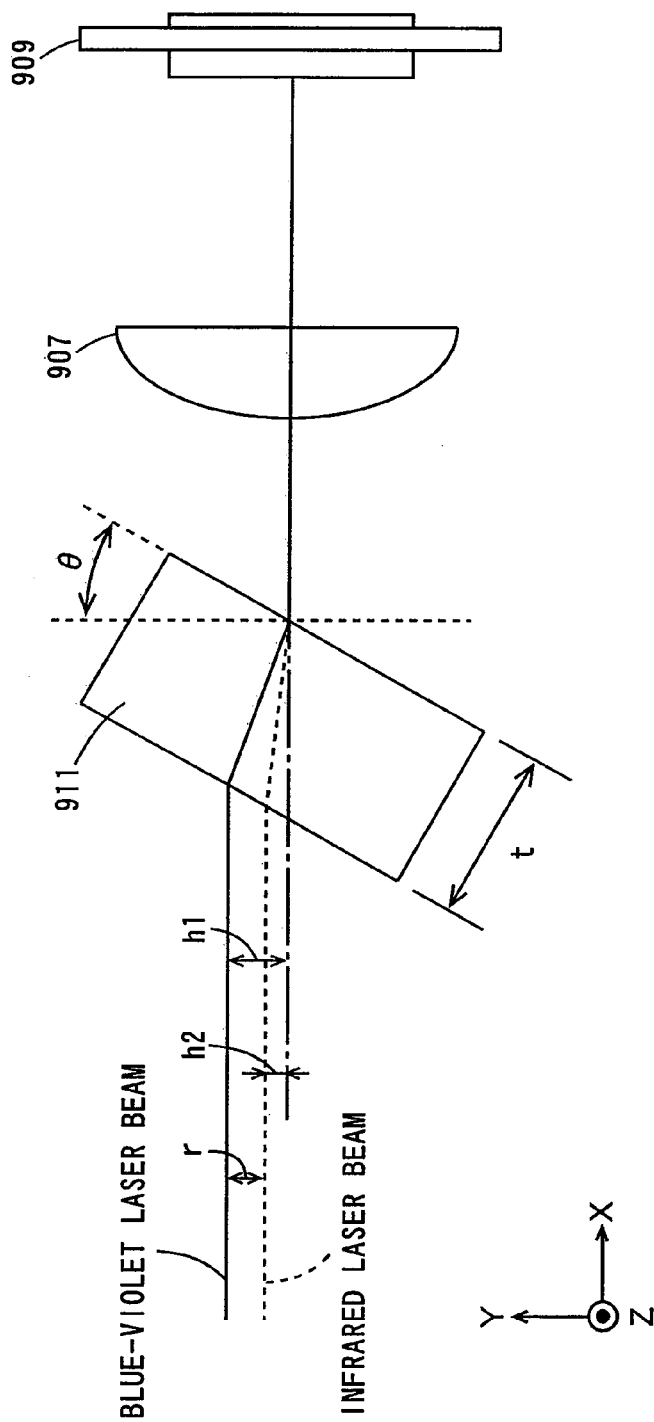
FIG. 18 is a diagram for explaining the function of connecting the optical axis of a parallel plate in the optical pickup apparatus shown in FIG. 17.

FIG. 18 is a diagram for explaining the function of connecting the optical axis of the parallel plate 911 in the optical pickup apparatus 900C shown in FIG. 17.

As shown in FIG. 18, letting t be the thickness of the parallel plate 911, letting θ be an angle formed between a surface perpendicular to the optical axis and a surface in a direction opposite to the thickness direction of the parallel plate 911 (hereinafter referred to as an inclination angle), and letting n be the refractive index of the parallel plate 911, a movement amount (a shift amount) h of the optical axis by the parallel plate 911 in a case where the optical axis after correction (hereinafter referred to as a reference optical axis) is used as a basis is expressed by the following equation (1):

$$h = t/\text{Cos}(\text{Arcsin}(\text{Sin}(\theta)/n)) \cdot \text{Sin}(\theta) \qquad (1)$$

Here, when shift amounts h1 and h2 of the blue-violet laser beam and the infrared laser beam from the reference optical axis are calculated on the basis of the foregoing equation (1) in a case where a refractive index n obtained on the basis of a glass material SF7 having an Abbe's number vd of 34.6 and having a reference refractive index nd of 1.64 as a material forming the parallel plate 911, for example, and the thickness t and the inclination angle θ of the parallel plate 911 are respectively taken as 1 mm and 45°, as shown in Table 1, results as shown in Table 2 are obtained:

TABLE 1

| Refractive index | | Thickness t | Inclination angle θ |
|---|---|---|---|
| nd | vd | [mm] | [°] |
| 1.64 | 34.6 | 1 | 45 |

TABLE 2

| | Blue-violet laser beam | Infrared laser beam |
|---|---|---|
| Refractive index n | 1.673 | 1.628 |
| Shift amount [mm] | h1 | h2 |
| | 0.780192 | 0.784994 |

From the foregoing, an amount to be corrected (hereinafter referred to as a correction amount) r represented by a difference between the shift amount h1 of the blue-violet laser beam and the shift amount h2 of the infrared laser beam is approximately 5 μm. Consequently, the optical axis of the infrared laser beam can be aligned with the optical axis of the blue-violet laser beam by correcting approximately 5 μm, as described above, serving as the correction amount by the parallel plate 911.

It is preferable that the inclination angle θ of the parallel plate 911 is not more than 60°. The reason for this will be described below.

Figure 19:
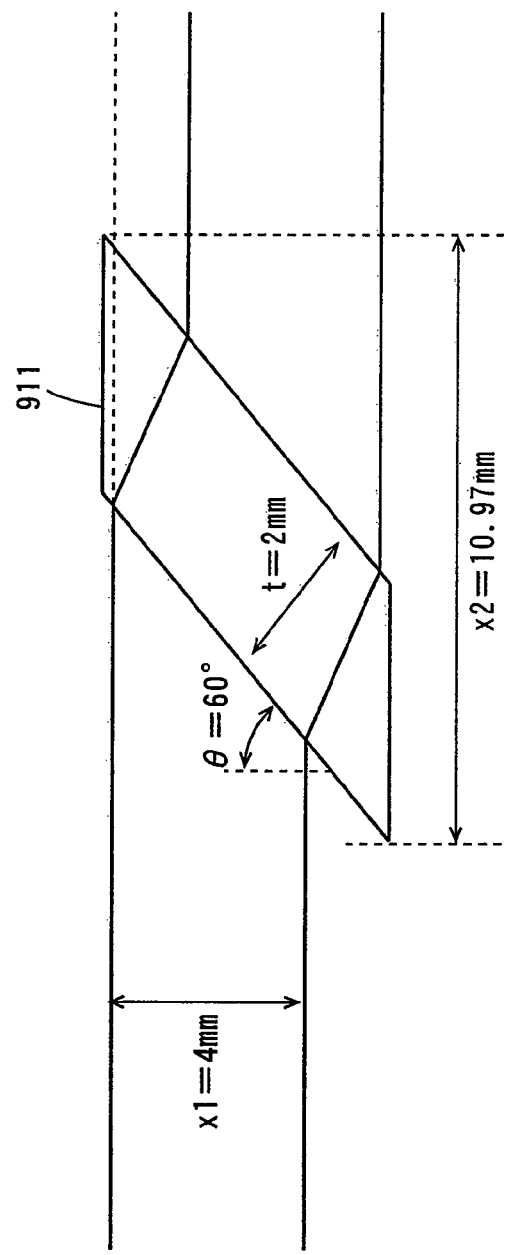
FIG. 19 is a diagram for explaining a preferred inclination angle θ of a parallel plate.

FIG. 19 is an explanatory view for explaining a preferred inclination angle θ of the parallel plate 911.

The thickness t of the parallel plate 911 is actually not more than approximately 2 mm from the design relationship of the optical system. As shown in FIG. 19, the effective diameter x1 of the laser beam is generally not more than approximately 4 mm.

In FIG. 19, in a case where the inclination angle θ of the parallel plate 911 is 60°, the size x2 of a space occupied by the parallel plate 911 in the direction of the optical axis of the laser beam is 10.97 mm. The general focal distance of the collimator lens 903 is 10 mm to 20 mm.

When the inclination angle θ of the parallel plate 911 is set to more than 60°, therefore, it may, in some cases, be difficult to provide another optical device or optical component between the collimator lens 903 and the photodetector 909. Consequently, it is preferable that the inclination angle θ of the parallel plate 911 is not more than 60°, and it is preferable that the thickness t of the parallel plate 911 is not more than approximately 2 mm. The correction amount in this case is approximately 21.1 μm, and is approximately 10 μm in a case where the inclination angle θ of the parallel plate 911 is 45° and the thickness t of the parallel plate 911 is 2 mm.

(i-4) Fourth Example of Optical Pickup Apparatus and Effect Produced Thereby

Figure 20:
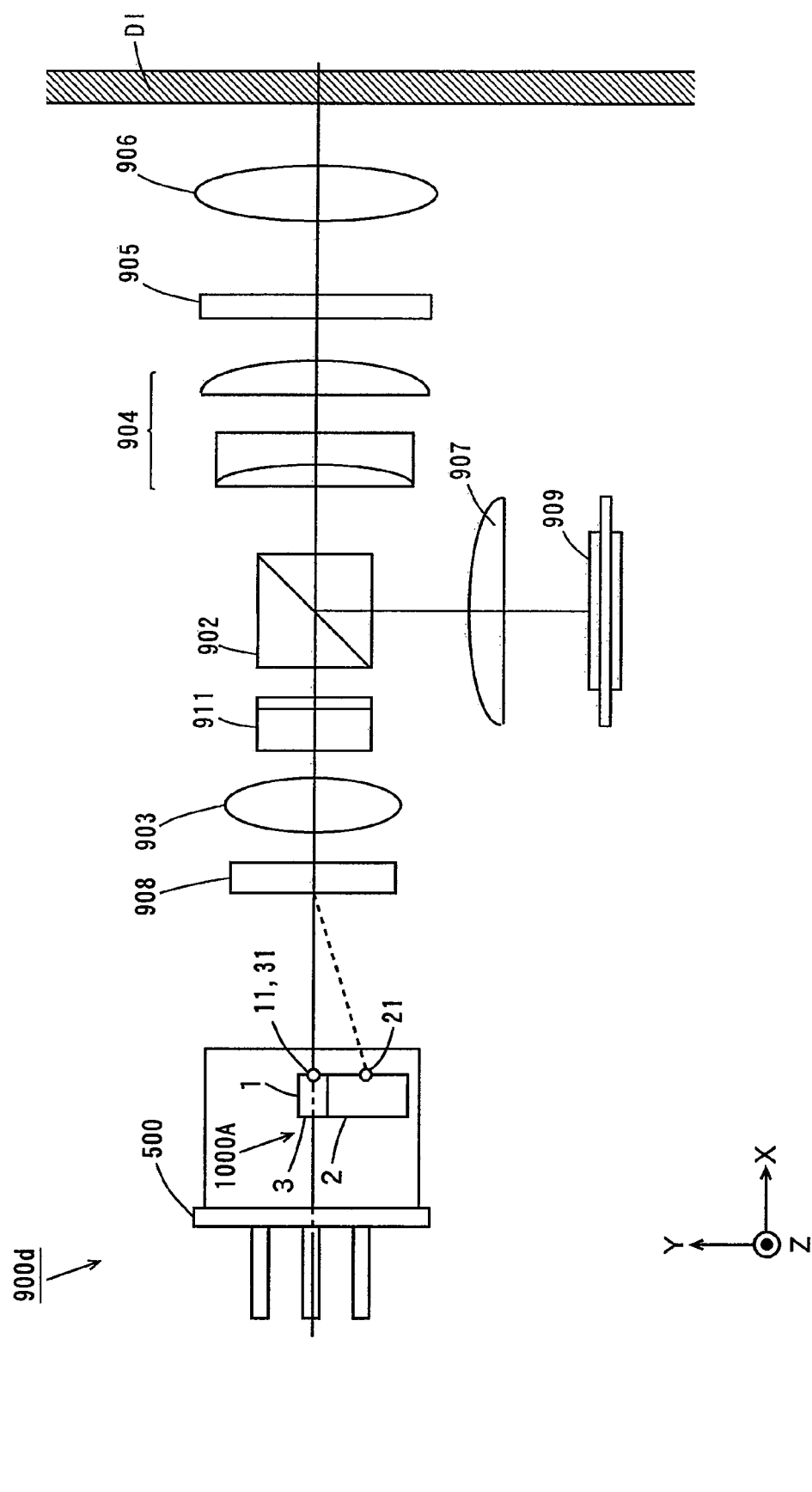
FIG. 20 is a diagram showing still another example of the configuration of an optical pickup apparatus.

FIG. 20 is a diagram showing still another example of the configuration of an optical pickup apparatus according to the present embodiment.

As shown in FIG. 20, the configuration of an optical pickup apparatus 900d in a fourth example is the same as the configuration of the optical pickup apparatus 900b in the second example except for the following points.

That is, in the optical pickup apparatus 900d, a collimator lens 903 is provided between an optical axis correction element 908 and a PBS 902 instead of being provided between the PBS 902 and a beam expander 904.

A parallel plate 911 is provided between the PBS 902 and the collimator lens 903 provided between the optical axis correction element 908 and the PBS 902.

In this example, the optical axis of a red laser beam is aligned with the optical axis of a blue-violet laser beam by the optical axis correction element 908, and the optical axis of an infrared laser beam is aligned with the optical axis of the blue-violet laser beam by the parallel plate 911. Thus, the optical pickup apparatus 900d differs from the optical pickup apparatus 900b in the second example, described above, in that the infrared laser beam aligned by correction is incident on an objective lens 906. Thus, the optical characteristics of the infrared laser beam on an optical disk DI can be improved, as compared with those in the optical pickup apparatus 900b.

Furthermore, in this example, the infrared laser beam aligned by correction is incident on a photodetector 909, so that the signal characteristics of the infrared laser beam are improved.

Furthermore, in this example, the collimator lens 903 is provided between the PBS 902 and the beam expander 904, so that it is possible to prevent aberration (astigmatism) in a case where a diffused light beam or a converged light beam is incident on the parallel plate 911.

(j) Another Example of Configuration of Optical Pickup Apparatus

An optical axis correction element 908 and a parallel plate 911 may be provided in an optical system from a PBS 902 to an objective lens 906.

In the optical pickup apparatuses 900a to 900d, a focusing error signal is generated using an astigmatism method. Further, a tracking error signal is generated using differential phase detection (DPD), for example.

(2) Second Embodiment

A semiconductor laser apparatus according to a second embodiment has the same configuration as the semiconductor laser apparatus 1000A according to the first embodiment except for the following points.

Figure 21:
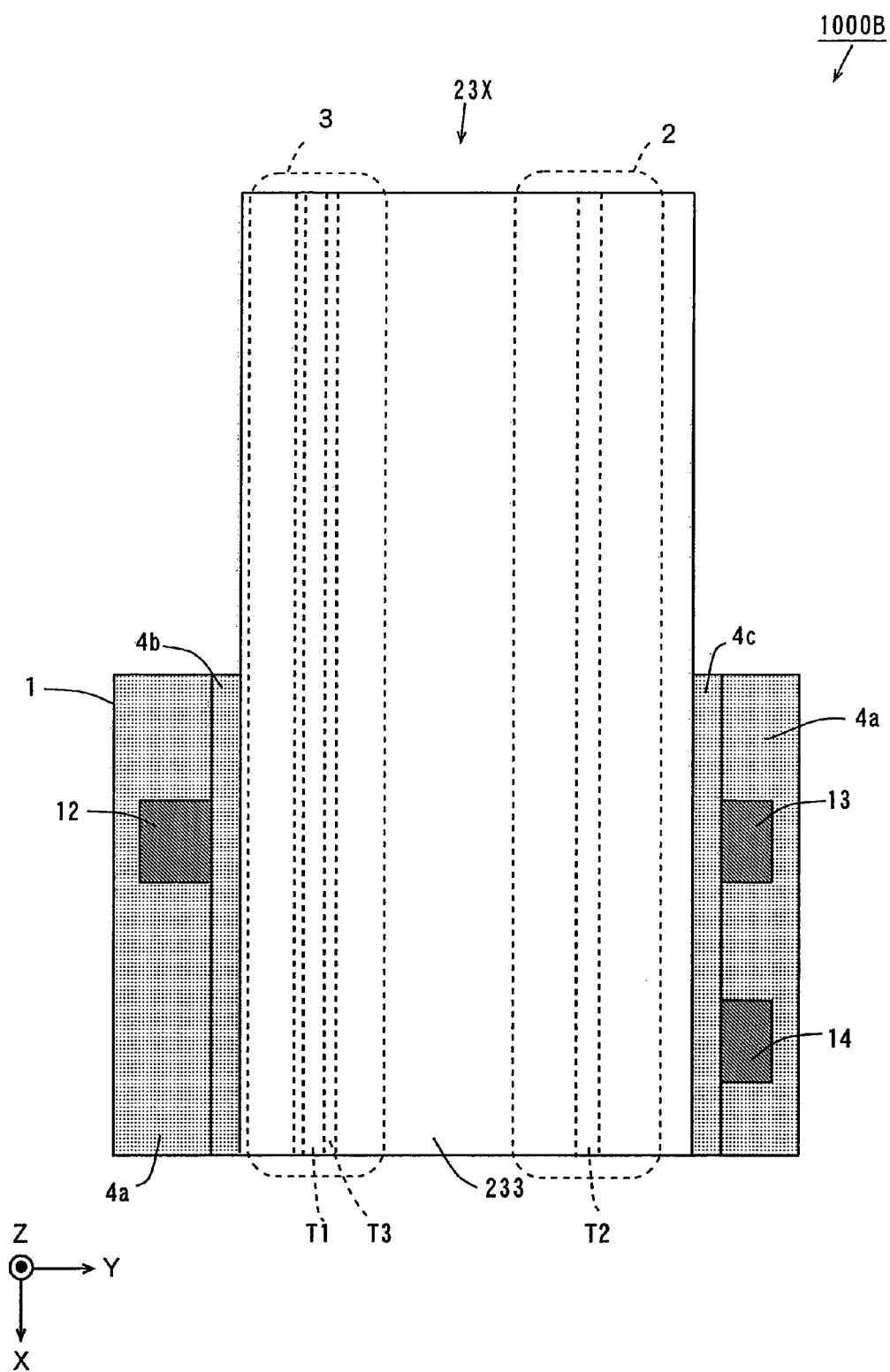
FIG. 21 is a schematic top view for explaining the configuration of a semiconductor laser apparatus according to a second embodiment.

FIG. 21 is a schematic top view for explaining the configuration of a semiconductor laser apparatus 1000B according to the second embodiment.

As shown in FIG. 21, the semiconductor laser apparatus 1000B according to the present embodiment comprises a blue-violet semiconductor laser device 1 and a monolithic red/infrared semiconductor laser device 23X.

The monolithic red/infrared semiconductor laser device 23X comprises a red semiconductor laser device 2 and an infrared semiconductor laser device 3, and is joined to the blue-violet semiconductor laser device 1.

The length in the X-direction of the monolithic red/infrared semiconductor laser device 23X is larger than the length in the X-direction of the blue-violet semiconductor laser device 1.

In the present embodiment, the cavity length of the blue-violet semiconductor laser device 1 extending in the X-direction is approximately 600 μm, and the cavity length of the red semiconductor laser device 2 and the infrared semiconductor laser device 3 extending in the X-direction is 1200 μm, for example.

Here, in the present embodiment, respective laser beam emission facets of the blue-violet semiconductor laser device 1, the red semiconductor laser device 2, and the infrared semiconductor laser device 3 almost coincide with one another, as shown in FIG. 21. In this case, a portion that is not joined to the blue-violet semiconductor laser device 1 occurs on the opposite side of a laser beam emission facet of the monolithic red/infrared semiconductor laser device 23X. Thus, distortion at a facet on the opposite side of the laser beam emission facets of the red semiconductor laser device 2 and the infrared semiconductor laser device 3 is reduced. Consequently, degradation of the red semiconductor laser device 2 and the infrared semiconductor laser device 3 are restrained.

Thus, the respective cavity lengths of the semiconductor laser devices are individually adjusted, so that the reliability of each of the semiconductor laser devices can be improved.

(3) Third Embodiment (a) Configuration and Effect of Semiconductor Laser Apparatus A semiconductor laser apparatus 1000C according to a third embodiment has the same configuration as the semiconductor laser apparatus 1000A according to the first embodiment except for the following points.

Figure 22:
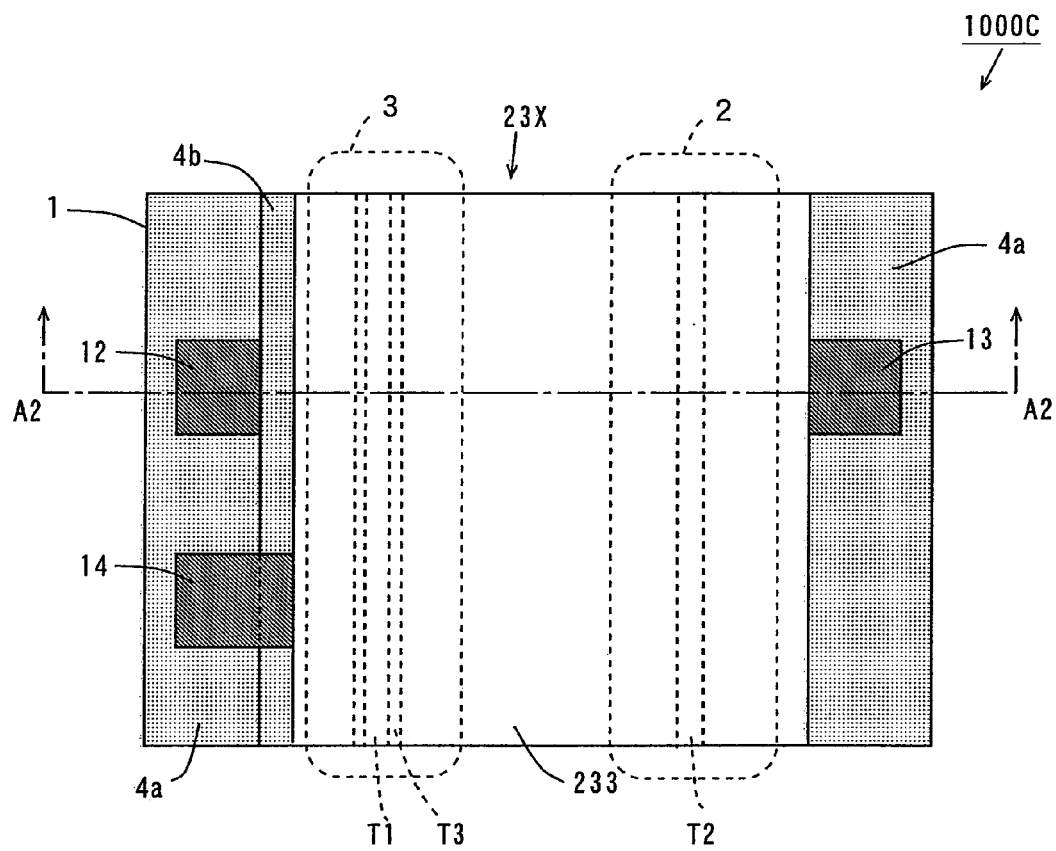
FIG. 22 is a top view showing an example of a semiconductor laser apparatus according to a third embodiment.
Figure 23:
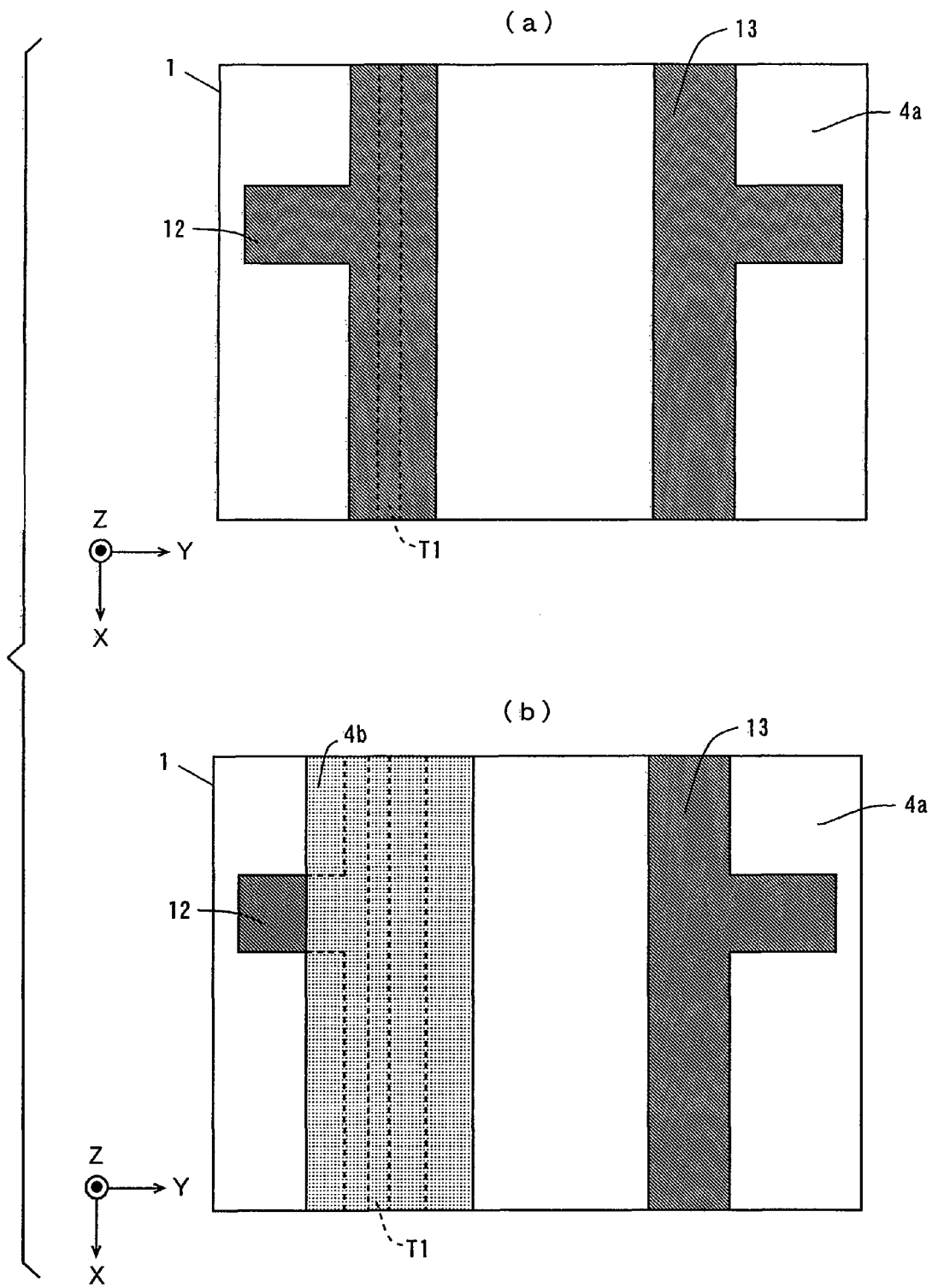
FIG. 23 is a schematic view of a junction plane of a blue-violet semiconductor laser device and a monolithic red/infrared semiconductor laser device in the semiconductor laser apparatus shown in FIG. 22.
Figure 24:
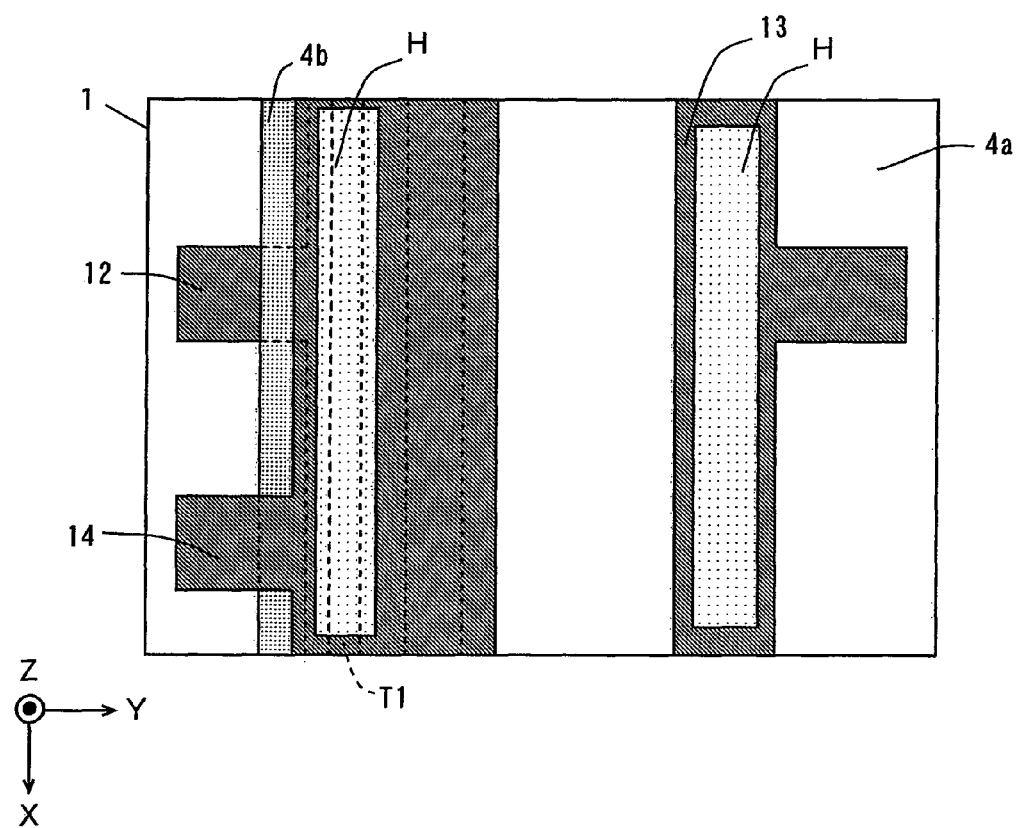
FIG. 24 is a schematic view of a junction plane of a blue-violet semiconductor laser device and a monolithic red/infrared semiconductor laser device in the semiconductor laser apparatus shown in FIG. 22.

FIG. 22 is a top view showing an example of the semiconductor laser apparatus according to the third embodiment. FIGS. 23 and 24 are schematic views of a junction plane of a blue-violet semiconductor laser device 1 and a monolithic red/infrared semiconductor laser device 23X in the semiconductor laser apparatus 1000C shown in FIG. 22. The semiconductor laser apparatus 1000C according to the present embodiment has a blue-violet semiconductor laser device 1 and a monolithic red/infrared semiconductor laser device 23X similar to those shown in and 2. A cross-sectional view taken along a line A2-A2 shown in FIG. 22 is identical to the cross-sectional view taken along the line A1-A1 shown in FIG. 1 (see FIG. 2).

In the semiconductor laser apparatus 1000C according to the present embodiment, a p-side pad electrode 12 and a p-side pad electrode 13 are formed on an insulating film 4a in the blue-violet semiconductor laser device 1, as shown in FIG. 23 (a).

The p-side pad electrode 12 extends in the X-direction along a projection T1 in the blue-violet semiconductor laser device 1, and its part extends in the Y-direction.

The p-side pad electrode 13 extends in the X-direction at a position spaced apart from the p-side pad electrode 12, and its part extends in the opposite direction to the p-side pad electrode 12. A wire for driving a red semiconductor laser device 2 is bonded to one end of the p-side pad electrode 13 extending in the Y-direction. The p-side pad electrode 13 extends by approximately 100 μm in width and approximately 100 μm in length in the Y-direction.

The p-side pad electrodes 12 and 13 are formed so as to be spaced apart from each other on the insulating film 4a. Thus, the p-side pad electrodes 12 and 13 are electrically isolated from each other.

As shown in FIG. 23 (b), an insulating film 4b having a predetermined width is formed on the insulating film 4a and the p-side pad electrode 12. The insulating film 4b is formed such that one end of the p-side pad electrode 12 extending in the Y-direction is exposed. A wire for driving the blue-violet semiconductor laser device 1 is bonded to the exposed one end of the p-side pad electrode 12. A region having a width of approximately 100 μm and having a length of approximately 100 μm at the one end of the p-side pad electrode 12 extending in the Y-direction is exposed.

As shown in FIG. 24 (c), a p-side pad electrode 14 is formed at a position spaced apart from the p-side pad electrode 13 on the insulating film 4a and the insulating film 4b. The p-side pad electrode 14 extends in the X-direction on the insulating film 4a and the insulating film 4b, and its part extends in the Y-direction, similarly to the p-side pad electrode 12. Here, a portion extending in the Y-direction of the p-side pad electrode 12 and a portion extending in the Y-direction of the p-side pad electrode 14 are spaced apart from each other, so that the p-side pad electrodes 12, 13, and 14 are electrically isolated from one another. The p-side pad electrode 14 extends by approximately 100 μm in width and approximately 100 μm in length in the Y-direction.

A wire for driving an infrared semiconductor laser device 3 is bonded to one end of the p-side pad electrode 14 extending in the Y-direction.

A solder film H composed of Au—Sn is formed on each of the p-side pad electrode 13 and the p-side pad electrode 14.

The monolithic red/infrared semiconductor laser device 23X is joined to the blue-violet semiconductor laser device 1 (see FIG. 2) such that a p-side pad electrode 22 in the red semiconductor laser device 2 is joined to the p-side pad electrode 13 with the solder film H sandwiched therebetween and a p-side pad electrode 32 in the infrared semiconductor laser device 3 is joined to the p-side pad electrode 14 with the solder film H sandwiched therebetween.

Thus, the p-side pad electrode 22 in the red semiconductor laser device 2 is electrically connected to the p-side pad electrode 13, and the p-side pad electrode 32 in the infrared semiconductor laser device 3 is electrically connected to the p-side pad electrode 14.

As described in the foregoing, in the semiconductor laser apparatus 1000C according to the present embodiment, respective one ends of the p-side pad electrodes 12 and 14 are exposed, projecting from a side surface of the infrared semiconductor laser device 3 in the Y-direction. Thus, the exposed portions of the p-side pad electrodes 12 and 14 extending in the Y-direction are arranged on a substantially straight line in the X-direction, so that an arrangement space of the red semiconductor laser device 2 and the infrared semiconductor laser device 3 on the blue-violet semiconductor laser device 1 in the Y-direction can be increased. Consequently, the respective widths of the red semiconductor laser device 2 and the infrared semiconductor laser device 3 in the Y-direction can be increased.

The p-side pad electrodes 12 and 13 can be simultaneously formed, so that the manufacturing processes can be simplified.

The third embodiment differs from the first embodiment in that the p-side pad electrode 14 is not formed on the p-side pad electrode 13. Therefore, the necessity of forming the solder film H on the p-side pad electrode 13 is eliminated, so that the manufacturing processes can be simplified.

Figure 25:
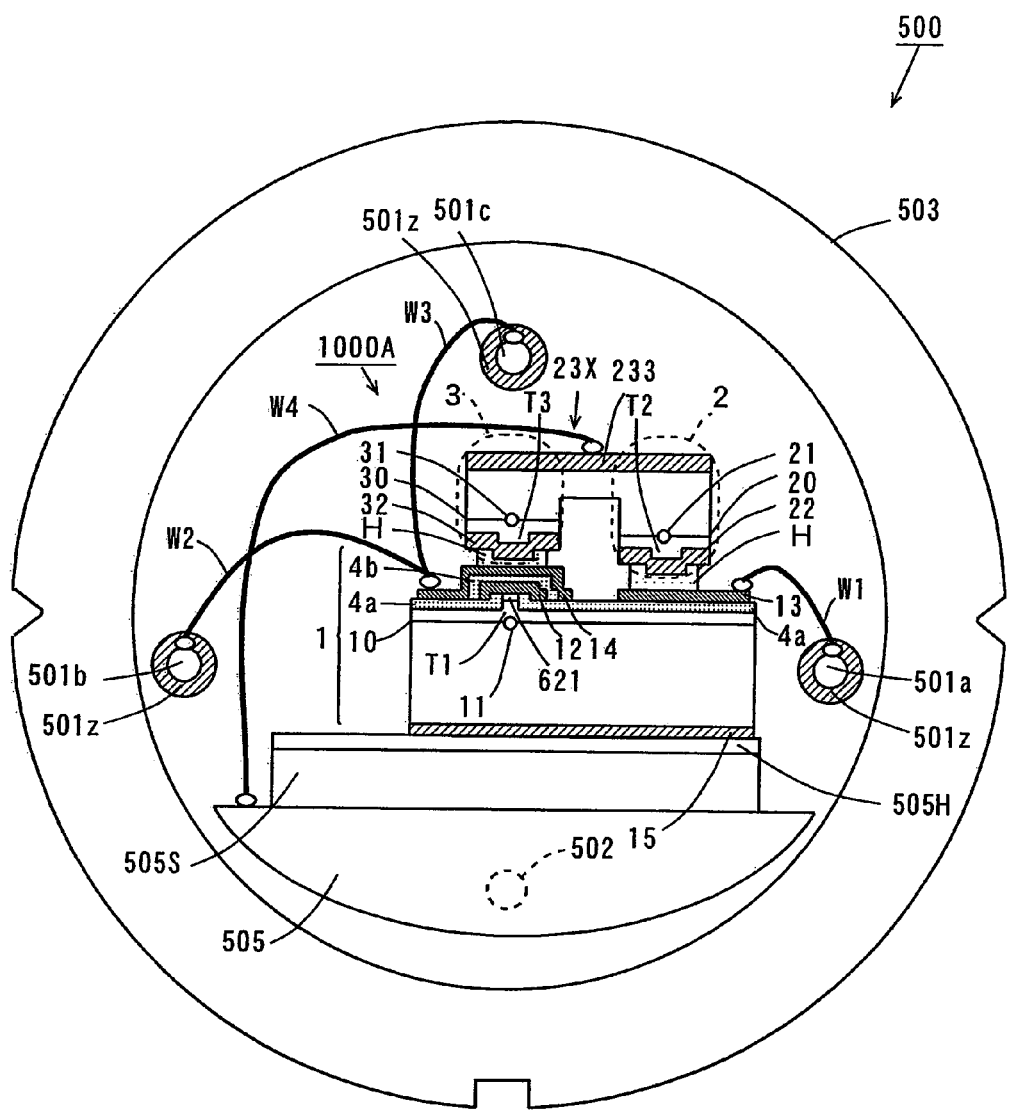
FIG. 25 is a schematic front view showing a state where the semiconductor laser apparatus shown in FIG. 22 is mounted within the substantially round-shaped can package for laser devices shown in FIG. 5 to remove the cover.
Figure 26:
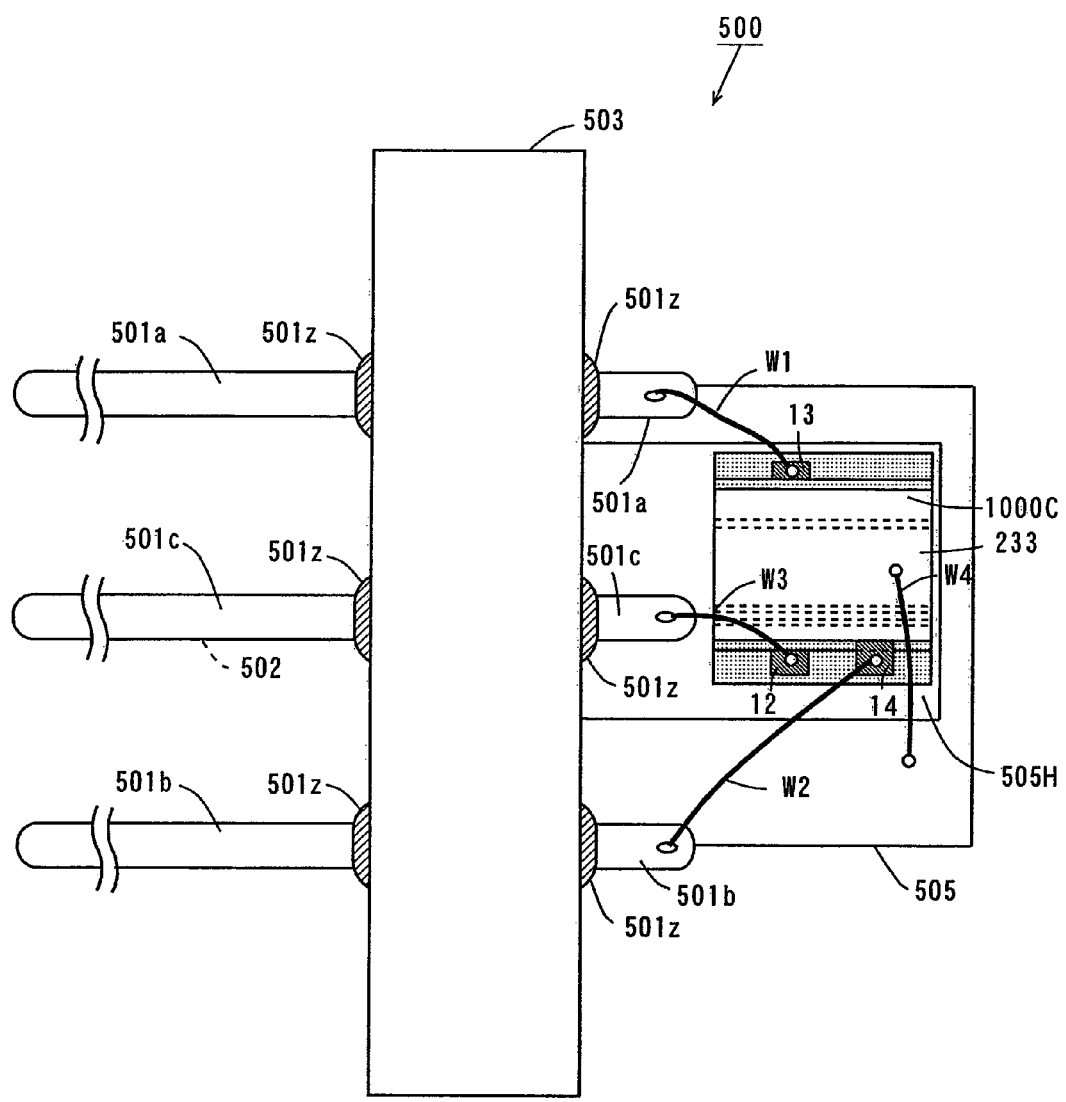
FIG. 26 is a schematic top view showing a state where the semiconductor laser apparatus shown in FIG. 22 is mounted within the substantially round-shaped can package for laser devices shown in FIG. 5 to remove the cover.

(b) State where Semiconductor Laser Apparatus is Mounted on Package for Laser Devices FIG. 25 is a schematic front view showing a state where the semiconductor laser apparatus 1000C shown in FIG. 22 is mounted within the substantially round-shaped can package for laser devices 500 shown in FIG. 5 to remove the cover 504, and FIG. 26 is a schematic top view showing a state where the semiconductor laser apparatus 1000C shown in FIG. 22 is mounted within the substantially round-shaped can package for laser devices 500 shown in FIG. 5 to remove the cover 504. In FIGS. 25 and 26, an X-direction, a Y-direction, and a Z-direction are also defined, as in FIG. 1.

As shown in FIGS. 25 and 26, a power feed pin 501a is connected to one end of the p-side pad electrode 13 in the semiconductor laser apparatus 1000C through a wire W1. A power feed pin 501b is connected to one end of the p-side pad electrode 14 in the semiconductor laser apparatus 1000C through a wire W2. A power feed pin 501c is connected to one end of the p-side pad electrode 12 in the semiconductor laser apparatus 1000C through a wire W3.

On the other hand, an exposed upper surface of a supporting member 505 is electrically connected to a common n-electrode 233 in the semiconductor laser apparatus 1000C through a wire W4.

Here, the supporting member 505 is electrically connected through a submount 505S and an adhesion layer 505H. Thus, a power feed pin 502 is electrically connected to an n-electrode 15 in the blue-violet semiconductor laser device 1 and the n-electrode 233 that is common between the red semiconductor laser device 2 and the infrared semiconductor laser device 3. That is, common cathode wire connection of the blue-violet semiconductor laser device 1, the red semiconductor laser device 2, and the infrared semiconductor laser device 3 is implemented.

The blue-violet semiconductor laser device 1 can be driven by applying a voltage between the power feed pin 501c and the power feed pin 502. The red semiconductor laser device 2 can be driven by applying a voltage between the power feed pin 501a and the power feed pin 502. The infrared semiconductor laser device 3 can be driven by applying a voltage between the power feed pin 501b and the power feed pin 502. The blue-violet semiconductor laser device 1, the red semiconductor laser device 2, and the infrared semiconductor laser device 3 can be thus independently driven.

In the semiconductor laser apparatus 1000C according to the present embodiment, the p-side pad electrodes 12, 13, and 14 are electrically isolated from one another, as described above. Thus, arbitrary voltages can be respectively applied to the p-side pad electrodes 12, 13, and 14 in the blue-violet semiconductor laser device 1, the red semiconductor laser device 2, and the infrared semiconductor laser device 3. Consequently, a system for driving the blue-violet semiconductor laser device 1, the red semiconductor laser device 2, and the infrared semiconductor laser device 3 can be arbitrary selected.

(c) Effect in State where Semiconductor Laser Apparatus is Mounted on Package for Laser Devices In the present embodiment, the semiconductor laser apparatus 1000C is also made to adhere to the submount 505S such that a blue-violet emission point 11 in the blue-violet semiconductor laser device 1 is positioned at the center of the extraction window 504a in the cover 504 (see FIG. 5). Further, the blue-violet emission point 11 and an infrared emission point 31 are provided at positions in close proximity to each other. In the present embodiment, therefore, the same effect as that in the first embodiment can be obtained.

As shown in FIGS. 25 and 26, the exposed portion of the p-side pad electrode 12 in the blue-violet semiconductor laser device 1 is provided so as to be positioned farther apart from a laser beam emission facet of the semiconductor laser apparatus 1000C than the exposed portion of the p-side pad electrode 14 in the infrared semiconductor laser device 3. Therefore, the p-side pad electrode 12 can be easily connected to the power feed pin 501c opposed to a surface, on which a semiconductor laser apparatus is mounted, of the supporting member 505, and the length of the wire W3 can be shortened.

Although in this example, the exposed portion of the p-side pad electrode 14 in the infrared semiconductor laser device 3 is arranged on the side of the laser beam emission facet of the semiconductor laser apparatus 1000C in the X-direction, the p-side pad electrode 12 in the blue-violet semiconductor laser device 1 may be arranged on the side of the laser beam emission facet of the semiconductor laser apparatus 1000C. In this case, the p-side pad electrode 12 in the blue-violet semiconductor laser device 1 and the power feed pin 501b are connected to each other through a wire. The p-side pad electrode 14 in the infrared semiconductor laser device 3 and the power feed pin 501c are connected to each other through a wire.

(4) Fourth Embodiment (a) Configuration of Semiconductor Laser Apparatus

Figure 27:
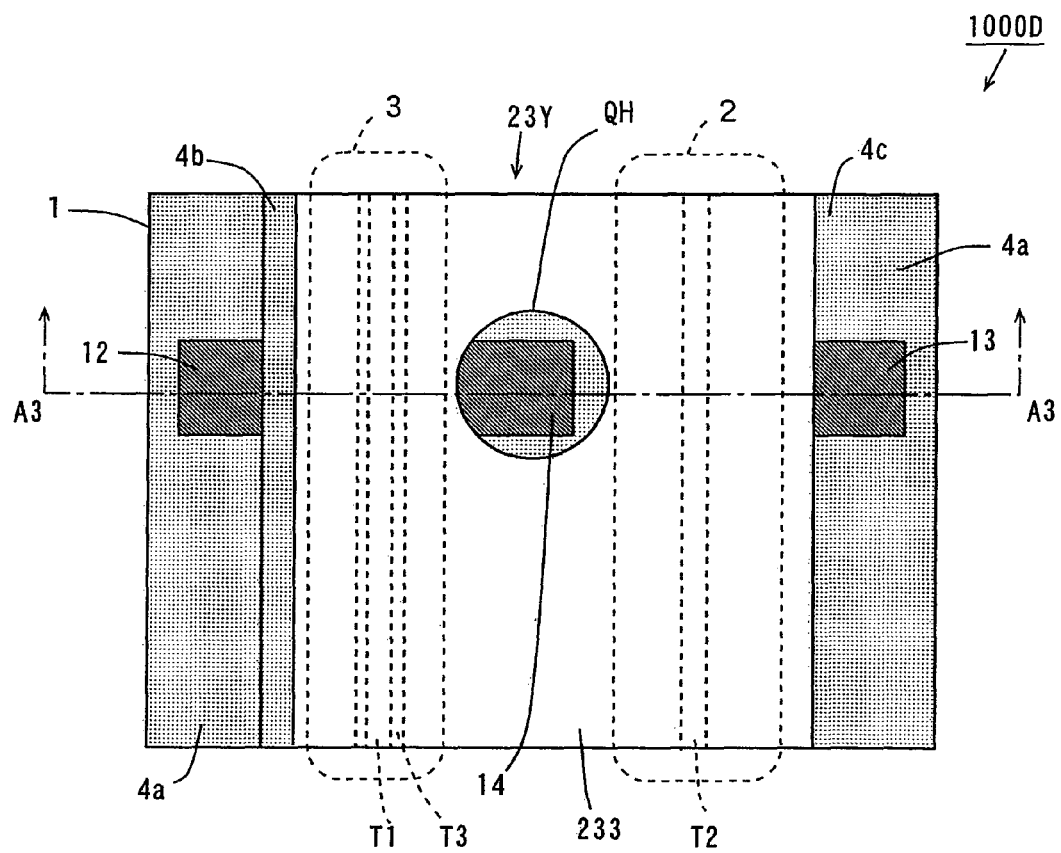
FIG. 27 is a top view showing an example of a semiconductor laser apparatus according to a fourth embodiment.
Figure 28:
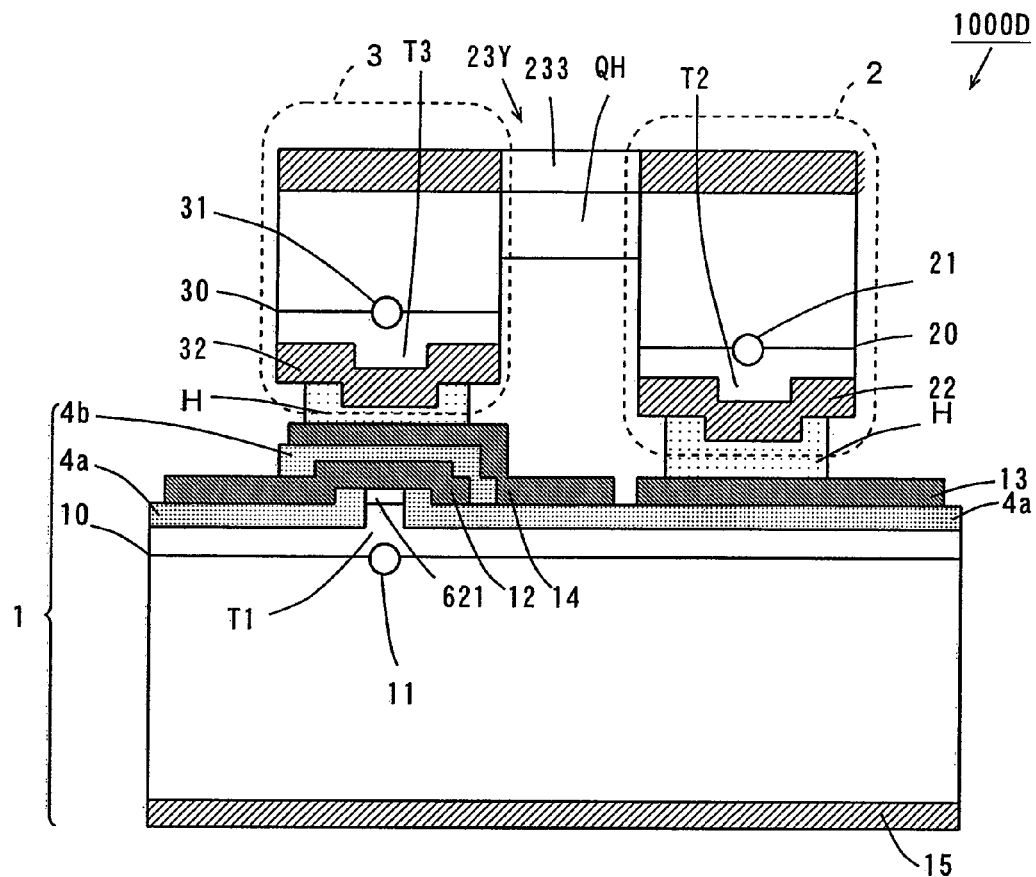
FIG. 28 is a cross-sectional view taken along a line A3-A3 shown in FIG. 27.
Figure 29:
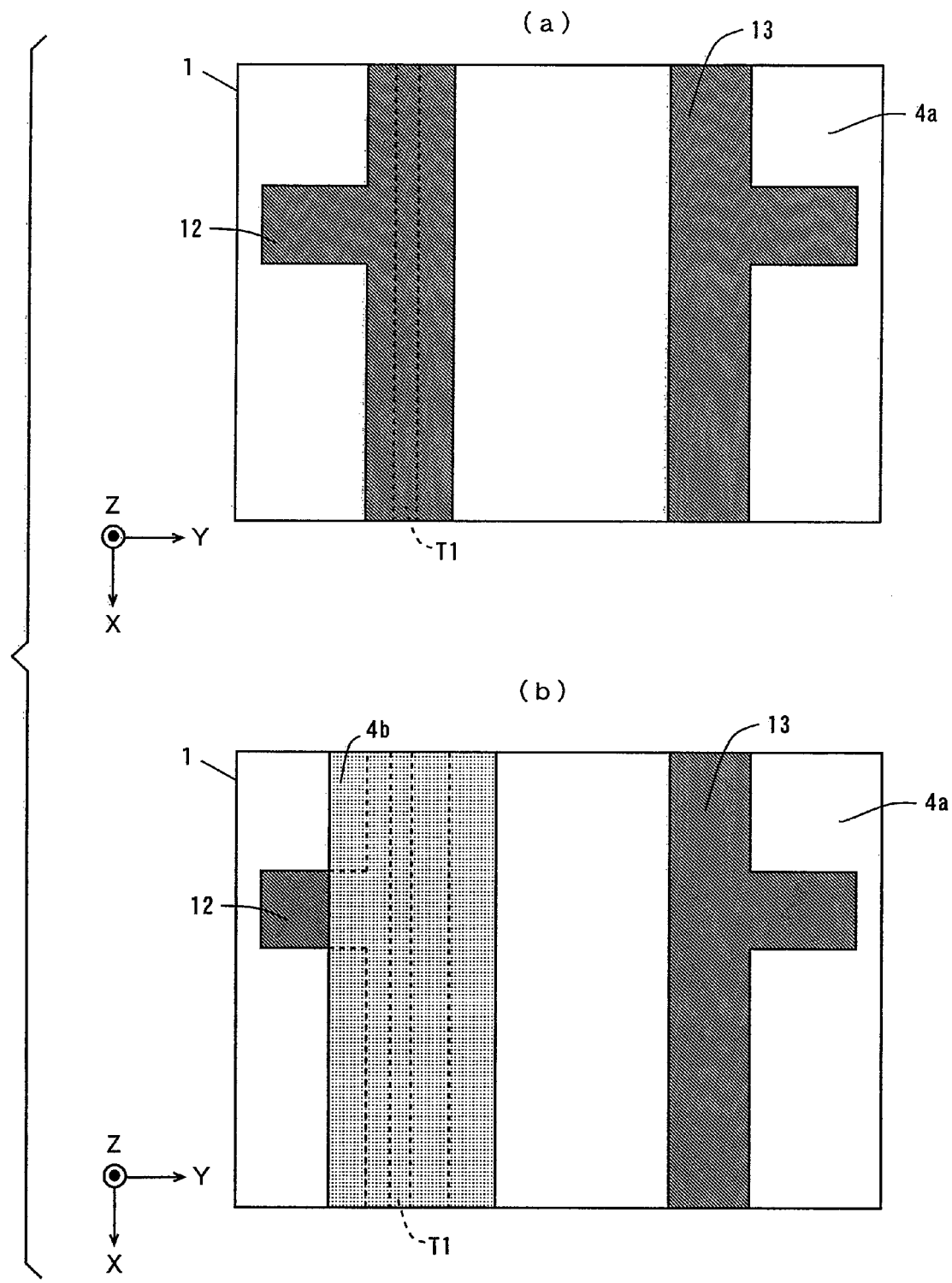
FIG. 29 is a schematic view of a junction plane of a blue-violet semiconductor laser device, a red semiconductor laser device, and an infrared semiconductor laser device in a semiconductor laser apparatus.
Figure 30:
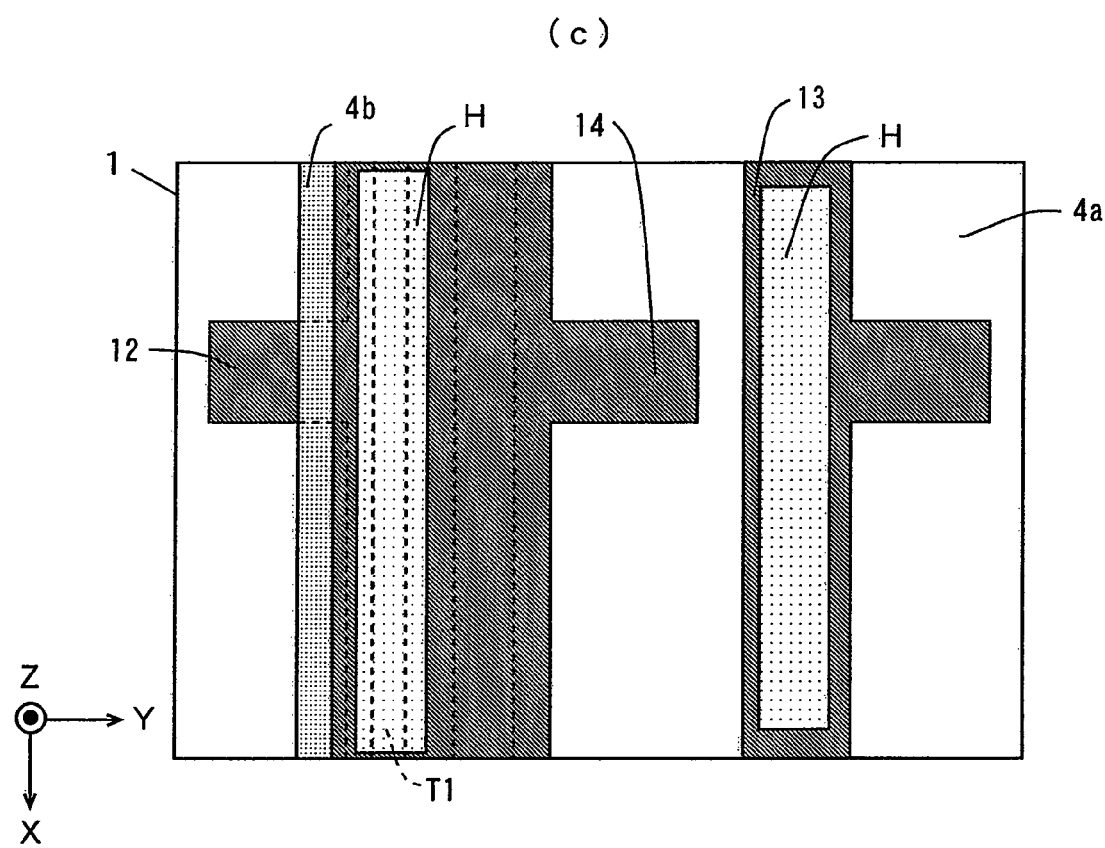
FIG. 30 is a schematic view of a junction plane of a blue-violet semiconductor laser device, a red semiconductor laser device, and an infrared semiconductor laser device in a semiconductor laser apparatus.

FIGS. 27 and 28 are schematic views for explaining the configuration of a semiconductor laser apparatus according to a fourth embodiment. FIG. 27 is a top view showing an example of the semiconductor laser apparatus according to the fourth embodiment, and FIG. 28 is a cross-sectional view taken along a line A3-A3 shown in FIG. 27. FIGS. 29 and 30 are schematic views of respective junction planes among a blue-violet semiconductor laser device 1, a red semiconductor laser device 2, and an infrared semiconductor laser device 3 in the semiconductor laser apparatus shown in FIGS. 27 and 28.

In FIGS. 27 to 30, an X-direction, a Y-direction, and a Z-direction are also defined, as in FIG. 1.

As shown in FIGS. 27 and 28, in a semiconductor laser apparatus 1000D according to the present embodiment, a monolithic red/infrared semiconductor laser device 23Y having the red semiconductor laser device 2 and the infrared semiconductor laser device 3 integrally formed therein is jointed to the blue-violet semiconductor laser device 1.

Here, the monolithic red/infrared semiconductor laser device 23Y shown in FIGS. 27 and 28 has a different configuration from the monolithic red/infrared semiconductor laser device 23X shown in FIGS. 1 and 2. In the monolithic red/infrared semiconductor laser device 23Y shown in FIGS. 27 and 28, a hole QH is formed between the red semiconductor laser device 2 and the infrared semiconductor laser device 3. One end of a p-side pad electrode 14, described later, is exposed to the exterior through the hole QH.

In the present embodiment, the infrared semiconductor laser device 3 is joined to the blue-violet semiconductor laser device 1 such that a projection T1 in the blue-violet semiconductor laser device 1 and a projection T3 in the infrared semiconductor laser device 3 are opposed to each other on a substantially straight line in the Z-direction, as in the semiconductor laser apparatus 1000A shown in FIGS. 1 and 2. That is, a blue-violet emission point 11 and an infrared emission point 31 are respectively provided at positions in close proximity to each other.

A junction of the blue-violet semiconductor laser device 1 and the monolithic red/infrared semiconductor laser device 23Y will be described.

As shown in FIG. 29 (a), a p-side pad electrode 12 extends in the X-direction along the projection T1 in the blue-violet semiconductor laser device 1, and its part extends in the Y-direction.

A p-side pad electrode 13 extends in the X-direction at a position spaced apart from the p-side pad electrode 12, and its part extends in the opposite direction to the p-side pad electrode 12. A wire for driving the red semiconductor laser device 2 is bonded to one end of the p-side pad electrode 13 extending in the Y-direction. The p-side pad electrode 12 extends by approximately 100 µm in width and approximately 100 µm in length in the Y-direction.

Since the p-side pad electrodes 12 and 13 are formed so as to be spaced apart from each other on an insulating film 4a, the p-side pad electrodes 12 and 13 are electrically isolated from each other.

As shown in FIG. 29 (b), an insulating film 4b having a predetermined width is formed on the insulating film 4a and the p-side pad electrode 12. The insulating film 4b is formed such that one end of the p-side pad electrode 12 extending in the Y-direction is exposed. A wire for driving the blue-violet semiconductor laser device 1 is bonded to the exposed one end of the p-side pad electrode 12. A region having a width of approximately 100 µm and having a length of approximately 100 µm at the one end of the p-side pad electrode 12 extending in the Y-direction is exposed.

As shown in FIG. 30 (c), the p-side pad electrode 14 is formed at a position spaced apart from the p-side pad electrode 13 on the insulating film 4a and the insulating film 4b. The p-side pad electrode 14 extends in the X-direction on the insulating film 4a and the insulating film 4b, and its part extends in the opposite direction on a substantially straight line to a portion extending in the Y-direction of the p-side pad electrode 12. The p-side pad electrode 12 extends by approximately 100 µm in width and approximately 100 µm in length in the Y-direction. A portion extending in the Y-direction of the p-side pad electrode 14 is spaced apart from the p-side pad electrode 13. Consequently, the p-side pad electrodes 12, 13, and 14 are electrically isolated from one another.

A wire for driving the infrared semiconductor laser device 3 is bonded to one end of the p-side pad electrode 14 extending in the Y-direction through the hole QH.

A solder film H composed of Au—Sn is formed on each of the p-side pad electrode 13 and the p-side pad electrode 14.

The monolithic red/infrared semiconductor laser device 23Y is joined to the blue-violet semiconductor laser device 1 such that a p-side pad electrode 22 in the red semiconductor laser device 2 is joined to the p-side pad electrode 13 with the solder film H sandwiched therebetween and a p-side pad electrode 32 in the infrared semiconductor laser device 3 is joined to the p-side pad electrode 14 with the solder film H sandwiched therebetween.

Thus, the p-side pad electrode 22 in the red semiconductor laser device 2 is electrically connected to the p-side pad electrode 13, and the p-side pad electrode 32 in the infrared semiconductor laser device 3 is electrically connected to the p-side pad electrode 14.

As described in the foregoing, in the semiconductor laser apparatus 1000D according to the present embodiment, the p-side pad electrodes 12 and 13 can be simultaneously formed, so that the manufacturing processes can be simplified.

The solder film H need not be formed on the p-side pad electrodes 13, so that the manufacturing processes can be simplified.

In the present embodiment, the distance between a red emission point 21 and an infrared emission point 31 in the Y-direction is adjusted to approximately 200 µm, for example.

The width of the blue-violet semiconductor laser device 1 in the Y-direction is approximately 800 µm, for example. The width of the monolithic red/infrared semiconductor laser device 23Y in the Y-direction is approximately 400 µm, for example.

It is preferable that the respective diameters of the blue-violet emission point 11 and the infrared emission point 31 are not more than 20 µm.

Figure 31:
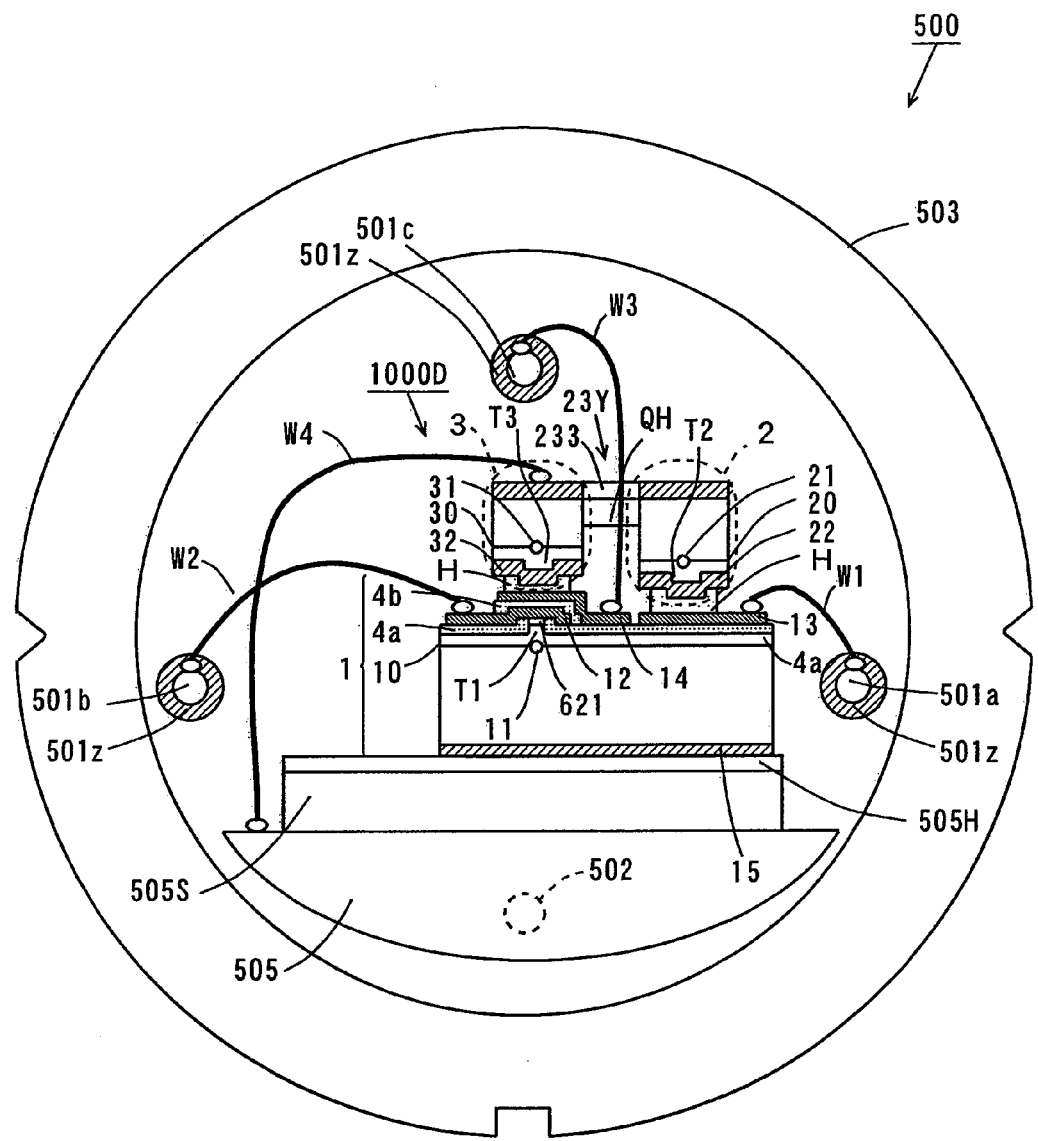
FIG. 31 is a schematic front view showing a state where the semiconductor laser apparatus shown in FIGS. 27 and 28 is mounted within the substantially round-shaped can package for laser devices shown in FIG. 5 to remove the cover.

(b) State where Semiconductor Laser Apparatus is Mounted on Package for Laser Devices FIG. 31 is a schematic front view showing a state where the semiconductor laser apparatus 1000D shown in FIGS. 27 and 28 is mounted within the substantially round-shaped can package for laser devices 500 shown in FIG. 5 to remove the cover 504. In FIG. 31, the semiconductor laser apparatus 1000D provided in the substantially round-shaped can package for laser devices 500 is indicated by a cross section taken along a line A3-A3 shown in FIG. 27. In FIG. 31, an X-direction, a Y-direction, and a Z-direction are also defined, as in FIG. 1.

As shown in FIG. 31, a power feed pin 501a is connected to one end of the p-side pad electrode 13 in the semiconductor laser apparatus 1000D through a wire W1. A power feed pin 501b is connected to one end of the p-side pad electrode 12 in the semiconductor laser apparatus 1000D through a wire W2. A power feed pin 501c is connected to one end of the p-side pad electrode 14 in the semiconductor laser apparatus 1000D through a wire W3.

On the other hand, an exposed upper surface of a supporting member 505 and a common n-electrode 233 in the semiconductor laser apparatus 1000D are electrically connected to each other through a wire W4.

Here, the supporting member 505 is electrically connected through a submount 505S and an adhesion layer 505H. Thus, a power feed pin 502 is electrically connected to an n-electrode 15 in the blue-violet semiconductor laser device 1 and an n-electrode 233 that is common between the red semiconductor laser device 2 and the infrared semiconductor laser device 3. That is, common cathode wire connection of the blue-violet semiconductor laser device 1, the red semiconductor laser device 2, and the infrared semiconductor laser device 3 is implemented.

The blue-violet semiconductor laser device 1 can be driven by applying a voltage between the power feed pin 501b and the power feed pin 502. The red semiconductor laser device 2 can be driven by applying a voltage between the power feed pin 501a and the power feed pin 502. The infrared semiconductor laser device 3 can be driven by applying a voltage between the power feed pin 501c and the power feed pin 502. The blue-violet semiconductor laser device 1, the red semiconductor laser device 2, and the infrared semiconductor laser device 3 can be thus independently driven.

In the semiconductor laser apparatus 1000D according to the present embodiment, the p-side pad electrodes 12, 13, and 14 are electrically isolated from one another, as described above. Thus, arbitrary voltages can be respectively applied to the p-side pad electrodes 12, 13, and 14 in the blue-violet semiconductor laser device 1, the red semiconductor laser device 2, and the infrared semiconductor laser device 3. Consequently, a system for driving the blue-violet semiconductor laser device 1, the red semiconductor laser device 2, and the infrared semiconductor laser device 3 can be arbitrary selected.

(c) Effect in State where Semiconductor Laser Apparatus is Mounted on Package for Laser Devices In the present embodiment, the semiconductor laser apparatus 1000D is also made to adhere to the submount 505S such that the blue-violet emission point 11 in the blue-violet semiconductor laser device 1 is positioned at the center of the extraction window 504a in the cover 504 (see FIG. 5). Further, the blue-violet emission point 11 and an infrared emission point 31 are provided at positions in close proximity to each other. In the present embodiment, therefore, the same effect as that in the first embodiment can be also obtained.

The p-side pad electrode 14 in the infrared semiconductor laser device 3 is exposed to the exterior through a hole QH. Thus, it is possible to bond a wire to the p-side pad electrodes 14 through the hole QH. As a result, the degree of freedom of wiring is improved.

The p-side pad electrodes 12, 13, and 14 can be provided on the opposite side of a light emission surface. Thus, the length of the wire can be shortened in respectively connecting the p-side pad electrode 12, 13, and 14 to the power feed pins 501b, 501a, and 501c. Consequently, the response characteristics of the blue-violet semiconductor laser device 1, the red semiconductor laser device 2, and the infrared semiconductor laser device 3 can be improved.

(5) Fifth Embodiment (a) Configuration of Semiconductor Laser Apparatus

Figure 32:
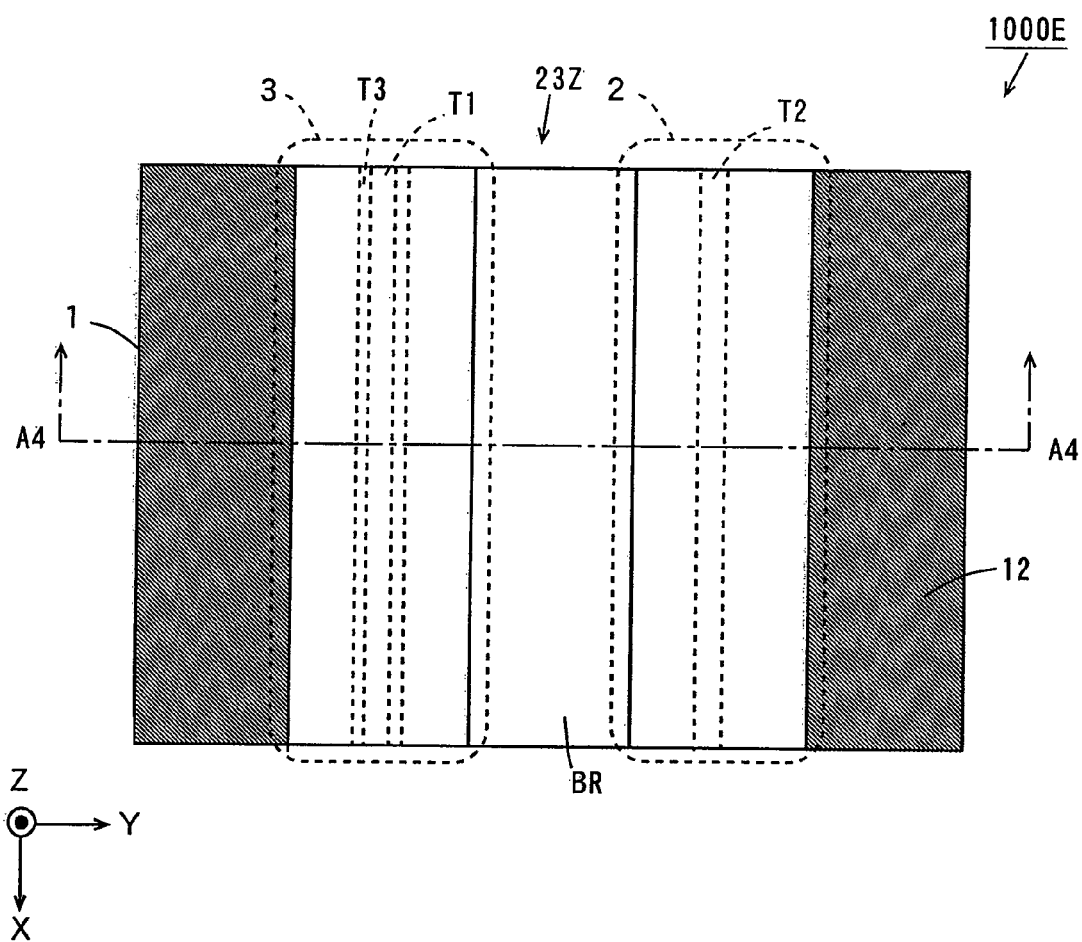
FIG. 32 is a top view showing an example of a semiconductor laser apparatus according to a fifth embodiment.
Figure 33:
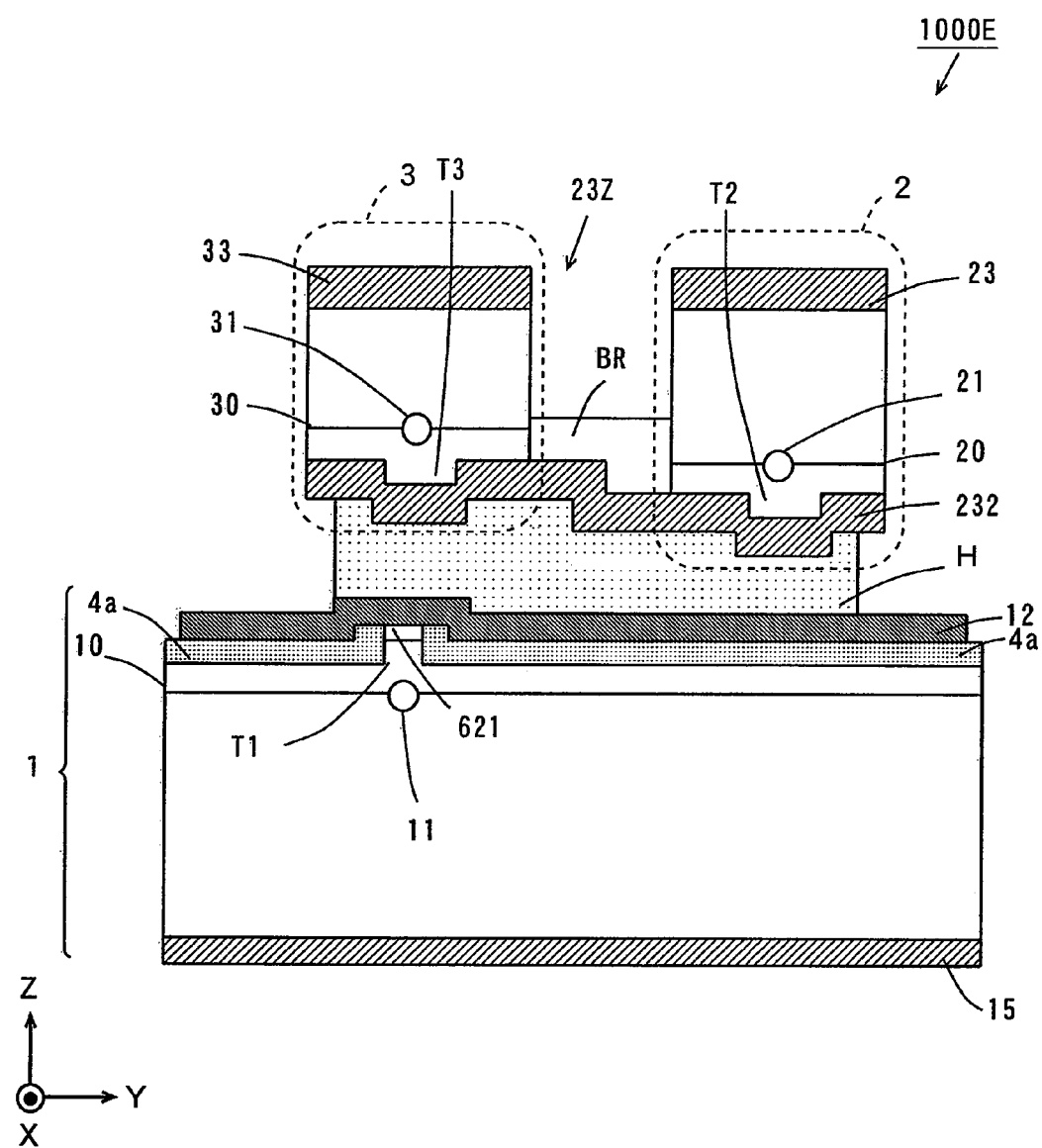
FIG. 33 is a cross-sectional view taken along a line A4-A4 shown in FIG. 32.

FIGS. 32 and 33 are schematic views for explaining the configuration of a semiconductor laser apparatus 1000E according to a fifth embodiment. FIG. 32 is a top view showing an example of the semiconductor laser apparatus according to the fifth embodiment, and FIG. 33 is a cross-sectional view taken along a line A4-A4 shown in FIG. 32. In FIGS. 32 and 33, an X-direction, a Y-direction, and a Z-direction are also defined, as in FIG. 1.

Also in the present embodiment, an infrared semiconductor laser device 3 is joined to a blue-violet semiconductor laser device 1 such that a projection T1 in the blue-violet semiconductor laser device 1 and a projection T3 in the infrared semiconductor laser device 3 are opposed to each other on a substantially straight line in the Z-direction, as in the semiconductor laser apparatus 1000A shown in FIGS. 1 and 2. That is, a blue-violet emission point 11 and an infrared emission point 31 are provided at positions in close proximity to each other.

As shown in FIGS. 32 and 33, the blue-violet semiconductor laser device 1 in the semiconductor laser apparatus 1000E according to the present embodiment, a p-side pad electrode 12 is formed so as to cover the whole of respective upper surfaces of a p-type ohmic electrode 621 and an insulating film 4a. A solder film H is formed in a predetermined region on the p-side pad electrode 12. Further, a monolithic red/infrared semiconductor laser device 23Z having the red semiconductor laser device 2 and the infrared semiconductor laser device 3 integrally formed therein is jointed on the solder film H.

Here, the monolithic red/infrared semiconductor laser device 23Z shown in FIGS. 32 and 33 has a different configuration from the monolithic red/infrared semiconductor laser device 23X shown in FIGS. 1 and 2. In the monolithic red/infrared semiconductor laser device 23Z according to the present embodiment, a semiconductor layer 2t in the red semiconductor laser device 2 (see FIG. 13) and a semiconductor layer 3t in the infrared semiconductor laser device 3 (see FIG. 14) are connected to each other by a connecting portion BR.

The connecting portion BR may include a part of the semiconductor layer 2t in the red semiconductor laser device 2 or the semiconductor layer 3t in the infrared semiconductor laser device 3. For example, the connecting portion BR may be a current blocking layer for limiting the flow of a current in the red semiconductor laser device 2 and the infrared semiconductor laser device 3 or may be a p-type contact layer.

Thus, the semiconductor layer 2t in the red semiconductor laser device 2, the semiconductor layer 3t in the infrared semiconductor laser device 3, and the connecting portion BR respectively have continuous planes. In the monolithic red/infrared semiconductor laser device 23Z, a common p-side pad electrode 232 is formed on the continuous planes.

The common p-side pad electrode 232 in the monolithic red/infrared semiconductor laser device 23Z is joined to the solder film H on the blue-violet semiconductor laser device 1. Here, the blue-violet semiconductor laser device 1 and the monolithic red/infrared semiconductor laser device 23Z are joined to each other such that the projection T1 in the blue-violet semiconductor laser device 1 and the projection T3 in the infrared semiconductor laser device 3 are opposed to each other on a substantially straight line in the Z-direction, as in the semiconductor laser apparatus 1000A shown in FIGS. 1 and 2.

In the red semiconductor laser device 2 in the monolithic red/infrared semiconductor laser device 23Z, an n-electrode 23 is formed on a surface on the opposite side of the common p-side pad electrode 232. In the infrared semiconductor laser device 3, an n-electrode 33 is formed on a surface on the opposite side of the common p-side pad electrode 232.

In the present embodiment, the distance between a red emission point 21 and the infrared emission point 31 in the Y-direction is adjusted to approximately 40 μm, for example.

The width of the blue-violet semiconductor laser device 1 in the Y-direction is approximately 400 μm, for example. The width of the monolithic red/infrared semiconductor laser device 23Y in the Y-direction is approximately 200 μm, for example.

Figure 34:
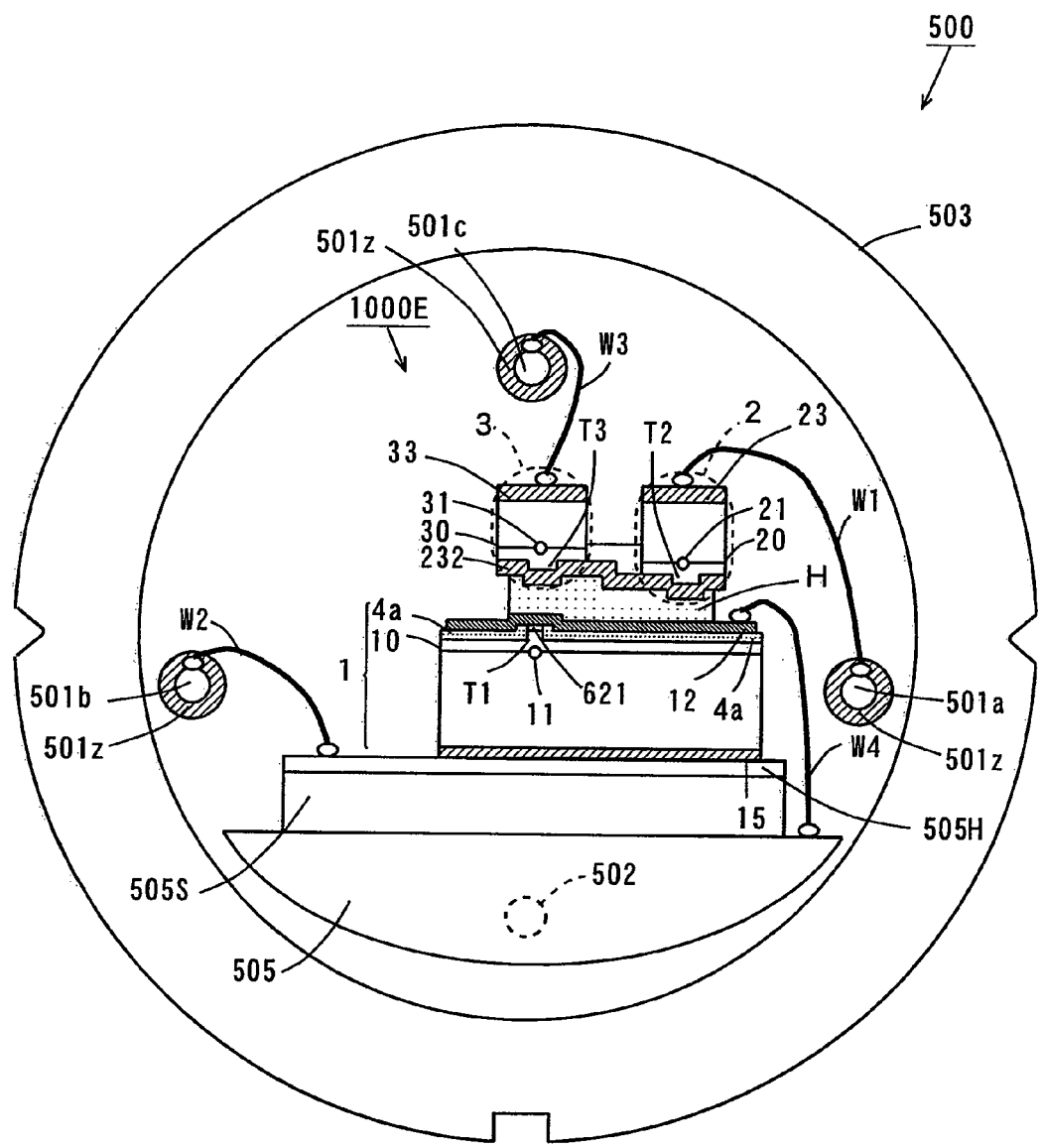
FIG. 34 is a schematic front view showing a state where the semiconductor laser apparatus shown in FIGS. 32 and 33 is mounted within the substantially round-shaped can package for laser devices shown in FIG. 5 to remove the cover.
Figure 34:
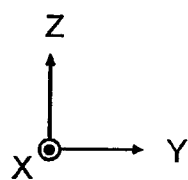

(b) State where Semiconductor Laser Apparatus is Mounted on Package for Laser Devices FIG. 34 is a schematic front view showing a state where the semiconductor laser apparatus 1000E shown in FIGS. 32 and 33 is mounted within the substantially round-shaped can package for laser devices 500 shown in FIG. 5 to remove the cover 504. In FIG. 34, the semiconductor laser apparatus 1000E provided in the substantially round-shaped can package for laser devices 500 is indicated by a cross section taken along a line A4-A4 shown in FIG. 32. In FIG. 34, an X-direction, a Y-direction, and a Z-direction are also defined, as in FIGS. 1 and 2.

In the present embodiment, a submount 505S having insulating properties is formed on a supporting member 505 in the substantially round-shaped can package for laser devices 500.

As shown in FIG. 34, the semiconductor laser apparatus 1000E is made to adhere on the submount 505S having insulating properties with an adhesion layer 505H sandwiched therebetween.

A power feed pin 501a is connected to an n-electrode 23 in the semiconductor laser apparatus 1000E (the n-electrode 23 in the red semiconductor laser device 2) through a wire W1. A power feed pin 501b is connected to the adhesion layer 505H exposed on the submount 505S through a wire W2. A power feed pin 501c is connected to an n-electrode 33 in the semiconductor laser apparatus 1000E (the n-electrode 33 in the infrared semiconductor laser device 3) through a wire W3.

On the other hand, the p-side pad electrode 12 exposed on the blue-violet semiconductor laser device 1 and the supporting member 505 are electrically connected to each other through a wire W4.

Here, the p-side pad electrode 12 on the blue-violet semiconductor laser device 1 is electrically connected to the common p-side pad electrode 232 in the monolithic red/infrared semiconductor laser device 23Z. Thus, common anode wire connection of the blue-violet semiconductor laser device 1, the red semiconductor laser device 2, and the infrared semiconductor laser device 3 is implemented.

The red semiconductor laser device 2 can be driven by applying a voltage between the power feed pin 501a and a power feed pin 502. The blue-violet semiconductor laser device 1 can be driven by applying a voltage between the power feed pin 501b and the power feed pin 502. The infrared semiconductor laser device 3 can be driven by applying a voltage between the power feed pin 501c and the power feed pin 502. The blue-violet semiconductor laser device 1, the red semiconductor laser device 2, and the infrared semiconductor laser device 3 can be thus independently driven.

(c) Effect in State where Semiconductor Laser Apparatus is Mounted on Package for Laser Devices In the present embodiment, the semiconductor laser apparatus 1000E is also made to adhere to the submount 505S such that the blue-violet emission point 11 in the blue-violet semiconductor laser device 1 is positioned at the center of the extraction window 504a in the cover 504 (see FIG. 5). Further, the blue-violet emission point 11 and the infrared emission point 31 are provided at positions in close proximity to each other. In the present embodiment, therefore, the same effect as that in the first embodiment can be also obtained.

In the present embodiment, when the semiconductor laser apparatus 1000E is mounted on the substantially round-shaped can package for laser devices 500, the power feed pins 501a to 501c are respectively connected to the n-electrodes 23 and 33 exposed on the top of the semiconductor laser apparatus 1000E and the exposed adhesion layer 505H by the wires W1, W3, and W2. This makes it easy to connect the wires W1 to W3 with respect to the semiconductor laser apparatus 1000E.

In the present embodiment, chips of the blue-violet semiconductor laser device 1 and chips of the monolithic red/infrared semiconductor laser device 23Z may be previously individually formed, and the chips may be affixed to one another to manufacture the semiconductor laser apparatus 1000E.

(6) Correspondence to Claims

In the following paragraphs, non-limiting examples of correspondences between various elements recited in the claims below and those described above with respect to various preferred embodiments of the present invention are explained. In the embodiments described above, the X-direction corresponds to a first direction, the laser beam having a wavelength of 405 nm and the blue-violet laser beam correspond to a light beam having a first wavelength, the blue-violet emission point 11 corresponds to a first emission point, the blue-violet semiconductor laser device 1 corresponds to a first semiconductor laser device, the laser beam having a wavelength of approximately 650 nm and the red laser beam correspond to a light beam having a second wavelength, the red emission point 21 corresponds to a second emission point, the red semiconductor laser device 2 corresponds to a second semiconductor laser device, the laser beam having a wavelength of approximately 780 nm and the infrared laser beam correspond to a light beam having a third wavelength, the infrared emission point 31 corresponds to a third emission point, the infrared semiconductor laser device 3 corresponds to a third semiconductor laser device, and the Y-Z plane corresponds to a first surface perpendicular to the first direction.

Furthermore, the semiconductor layer 1t corresponds to a first semiconductor layer, the p-side pad electrode 12 corresponds to a first electrode, the semiconductor layer 2t corresponds to a second semiconductor layer, the p-side pad electrode 22 corresponds to a second electrode, the semiconductor layer 3t corresponds to a third semiconductor layer, the p-side pad electrode 32 corresponds to a third electrode, the n-GaN substrate 1s corresponds to a first substrate, the n-GaAs substrate 50 and the n-GaAs substrate 5X correspond to a second or third substrate, the projection T1 corresponds to a first projection, the projection T2 corresponds to a second projection, the projection T3 corresponds to a third projection, the Y-direction corresponds to a second direction, and the substantially round-shaped can package for laser devices 500 corresponds to a package.

Furthermore, the optical disk DI corresponds to an optical recording medium, the PBS 902, the collimator lens 903, the beam expander 904, the λ/4 plate 905, the objective lens 906, the cylindrical lens 907, and the optical axis correction element 908 correspond to an optical system, and the optical axis correction element 908 corresponds to a diffraction grating.

(7) Another Embodiment

Although in the first to fifth embodiments described above, the example in which the semiconductor laser apparatus is mounted on the substantially round-shaped can package for laser devices was illustrated, the present invention is not limited to the same. For example, the present invention is also applicable to a case where the semiconductor laser apparatus is mounted on another package such as a frame-type package for laser devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A semiconductor laser apparatus comprising:
   a first semiconductor laser device, a second semiconductor laser device, and a third semiconductor laser device,
   said first semiconductor laser device comprising a first semiconductor layer having a first emission point emitting a light beam having a first wavelength in a direction substantially parallel to a first direction on a first substrate,
   said second semiconductor laser device comprising a second semiconductor layer having a second emission point emitting a light beam having a second wavelength different from N times (N is a natural number) said first wavelength in the direction substantially parallel to the first direction,
   said third semiconductor laser device comprising a third semiconductor layer having a third emission point emitting a light beam having a third wavelength substantially equal to N times (N is a natural number) said first wavelength in the direction substantially parallel to the first direction,
   said second semiconductor laser device and said third semiconductor laser device being stacked on said first semiconductor laser device such that said second semi- conductor layer and said third semiconductor layer are opposed to said first semiconductor layer, and the distance between said first emission point and said third emission point being shorter than the distance between said first emission point and said second emission point on a first plane perpendicular to said first direction, wherein said first semiconductor laser device further comprises a first electrode formed on said first semiconductor layer, said second semiconductor laser device further comprises a second electrode formed on said second semiconductor layer, said third semiconductor laser device further comprises a third electrode formed on said third semiconductor layer, said first electrode, said second electrode, and said third electrode are insulated from one another, said second semiconductor laser device further comprises a second substrate, said second semiconductor layer being formed on said second substrate, said third semiconductor laser device further comprises a third substrate, said third semiconductor layer being formed on said third substrate, at least one of said second substrate and said third substrate being composed of a material different from said first substrate, said second and third substrates are a common substrate, said second semiconductor layer is formed in a first region of said common substrate, and said third semiconductor layer is formed in a second region of said common substrate, and a thickness from said common substrate to a surface of said second semiconductor layer is larger than a thickness from said common substrate to a surface of said third semiconductor layer in a direction substantially perpendicular to one surface of said first substrate.

2. A semiconductor laser apparatus comprising:

a first semiconductor laser device, a second semiconductor laser device, and a third semiconductor laser device, said first semiconductor laser device comprising a first semiconductor layer having a first emission point emitting a light beam having a first wavelength in a direction substantially parallel to a first direction on a first substrate, said second semiconductor laser device comprising a second semiconductor layer having a second emission point emitting a light beam having a second wavelength different from N times (N is a natural number) said first wavelength in the direction substantially parallel to the first direction, said third semiconductor laser device comprising a third semiconductor layer having a third emission point emitting a light beam having a third wavelength substantially equal to N times (N is a natural number) said first wavelength in the direction substantially parallel to the first direction, said second semiconductor laser device and said third semiconductor laser device being stacked on said first semiconductor laser device such that said second semiconductor layer and said third semiconductor layer are opposed to said first semiconductor layer, and the distance between said first emission point and said third emission point being shorter than the distance between said first emission point and said second emission point on a first plane perpendicular to said first direction, wherein said first semiconductor laser device further comprises a first electrode formed on said first semiconductor layer, said second semiconductor laser device further comprises a second electrode formed on said second semiconductor layer, said third semiconductor laser device further comprises a third electrode formed on said third semiconductor layer, said first electrode, said second electrode, and said third electrode are insulated from one another, said second semiconductor laser device further comprises a second substrate, said second semiconductor layer being formed on said second substrate, said third semiconductor laser device further comprises a third substrate, said third semiconductor layer being formed on said third substrate, at least one of said second substrate and said third substrate being composed of a material different from said first substrate, said second and third substrates are a common substrate, said second semiconductor layer is formed in a first region of said common substrate, and said third semiconductor layer is formed in a second region of said common substrate, and the surface of said second semiconductor layer projects toward said first substrate farther than the surface of said third semiconductor layer in the direction substantially perpendicular to one surface of said first substrate.

3. The semiconductor laser apparatus according to claim 1, wherein said first semiconductor layer comprises a first projection extending in the direction substantially parallel to said first direction on the third semiconductor laser device side.

4. The semiconductor laser apparatus according to claim 2, wherein said first semiconductor layer comprises a first projection extending in the direction substantially parallel to said first direction on the third semiconductor laser device side.

* * * * *